United States Patent [19]
Suetake et al.

[11] Patent Number: 5,822,557
[45] Date of Patent: Oct. 13, 1998

[54] PIPELINED DATA PROCESSING DEVICE HAVING IMPROVED HARDWARE CONTROL OVER AN ARITHMETIC OPERATIONS UNIT

[75] Inventors: Seiji Suetake; Koichi Hatta; Hideyuki Iino; Tatsuya Nagasawa, all of Kawasaki, Japan

[73] Assignee: Fujitsu Limited, Kawasaki, Japan

[21] Appl. No.: 586,483

[22] Filed: Jan. 16, 1996

Related U.S. Application Data

[63] Continuation of Ser. No. 997,219, Dec. 28, 1992, abandoned.

[30] Foreign Application Priority Data

Dec. 27, 1991 [JP] Japan .................................. 3-345703
Jan. 31, 1992 [JP] Japan .................................. 4-016923
Jan. 31, 1992 [JP] Japan .................................. 4-016926

[51] Int. Cl.$^6$ .............................. G06F 9/302; G06F 9/38
[52] U.S. Cl. ..................... 395/388; 395/569; 395/800.07
[58] Field of Search ........................... 395/800, 497.04, 395/550, 375, 775, 734, 200.11, 200.16, 127.01, 736, 871, 870, 869, 388, 582, 596, 567, 742, 495, 800.07, 569, 800.03, 391; 364/726, DIG. 1, DIG. 2, 925.6; 327/297, 77

[56] References Cited

U.S. PATENT DOCUMENTS

| | | | |
|---|---|---|---|
| 4,408,918 | 10/1983 | Smith | 400/697.1 |
| 4,720,811 | 1/1988 | Yamaguchi | 395/550 |
| 4,752,873 | 6/1988 | Shonai et al. | 395/800 |
| 4,785,393 | 11/1988 | Chu et al. | 395/375 |
| 4,868,414 | 9/1989 | Kanazawa | 307/244 |
| 4,918,600 | 4/1990 | Harper, III et al. | 395/425 |
| 4,926,370 | 5/1990 | Brown et al. | 364/748 |
| 5,119,324 | 6/1992 | Ahsan | 364/736 |

*Primary Examiner*—Daniel H. Pan
*Attorney, Agent, or Firm*—Staas & Halsey

[57] ABSTRACT

An arithmetic operation unit for operating according to pipeline control and an instruction decoder for controlling the arithmetic operation unit by decoding an instruction, including a state retaining unit for retaining a state of the operation of the arithmetic operation unit, wherein the instruction decoder controls the execution of the arithmetic operation unit according to the information stored by the state retaining unit. A state is set when the decoder issues a signal for starting the arithmetic operation unit and the state is cleared when the decoder issues a signal for stopping the operation of the arithmetic operation unit. The arithmetic operation unit further comprises a unit for obtaining a maximum and a minimum value with a simple construction. A multiplier of the arithmetic operation unit comprises a unit for performing an addition of an exponential part of a multiplier and that of a multiplicand with a simple construction. The arithmetic operation unit further comprises a data packing and unpacking unit for packing and unpacking vector data. The data processing device is divided into several units and scan paths are divided into several paths corresponding to respective units.

20 Claims, 50 Drawing Sheets

| A(I) | | B(I) | M(I) | | C(I) |
|---|---|---|---|---|---|
| A(1) | × | B(1) | 0 | → | C(1) |
| A(2) | × | B(2) | 0 | → | C(2) |
| A(3) | × | B(3) | 1 | → | × |
| A(4) | × | B(4) | 0 | → | C(4) |
| A(5) | × | B(5) | 1 | → | × |
| A(6) | × | B(6) | 1 | → | × |
| A(7) | × | B(7) | 0 | → | C(7) |

X : RESULT IS NOT WRITTEN, BUT PREVIOUS VALUE IS RETAINED

Fig. 1

INPUT    MASK

| 3 | 0 |
| 2 | 1 |
| 5 | 0 |
| 8 | 1 |

⟹ { MAXIMUM: 5 (AS 8 IS MASKED)
    MINIMUM: 3 (AS 2 IS MASKED)

| CYCLE<br>PIPELINE | READ | | | | WRITE | | | |
|---|---|---|---|---|---|---|---|---|
| 0 | 0 | 1 | 2 | 3 | 0 | 1 | 2 | 3 |
| 1 | 0 | 1 | 2 | 3 | 3 | 0 | 1 | 2 |
| 2 | 2 | 3 | 0 | 1 | 2 | 3 | 0 | 1 |
| 3 | 3 | 0 | 1 | 2 | 1 | 2 | 3 | 0 |

Fig. 20C

| ELEMENT NUMBER | DATA |
|---|---|
| 0 | 23 |
| 1 | 57 |
| 2 | 13 |
| 3 | 1 |
| 4 | -7 |
| 5 | 46 |
| 6 | 3 |
| 7 | 21 |

Fig. 20D

REGISTER ADDRESS

| REGISTER | | | BANK | 0 | 1 | 2 | 3 |
|---|---|---|---|---|---|---|---|
| 8 | 4 | 0 | | | | | |
| | -7 | 23 | | | | | |
| | 46 | 57 | | | | | |
| | 3 | 13 | | | | | |
| | 21 | 4 | | | | | |

PIPELINED DATA PROCESSING DEVICE HAVING IMPROVED HARDWARE CONTROL OVER AN ARITHMETIC OPERATIONS UNIT

This application is a continuation of application Ser. No. 07/997,219, filed Dec. 28, 1992, now abandoned.

BACKGROUND OF THE INVENTION

1. Field of the Invention

The present invention relates to a data processing system for performing arithmetic operations according to pipeline control, and more specifically to a data processing device capable of efficiently controlling and managing the operation of arithmetic operation pipelines.

2. Description of the Related Art

Recently, data processing devices have been designed with various technologies to speed up arithmetic operations. One of the technologies uses an operation pipeline for performing an arithmetic operation according to pipeline control. The arithmetic pipeline further speeds up arithmetic operations with a plurality of arithmetic operation units capable of operating through the arithmetic operation pipeline, and by operating these arithmetic operation units in parallel.

Calculations performed in the fields of science often involve a large amount of arithmetic operations in a fixed loop, such as repetitive operations as follows.

```
DO 10 I = 0,100
    C(I) = A(I)*B(I)
    F(I) = D(I)+E(I)
10 CONTINUE
```

A process in which an arithmetic operation is repeatedly performed for a fixed number of times is called a vector arithmetic operation.

A vector arithmetic operation is a process in which a plurality of arithmetic operations are performed by one instruction in contrast with a scalar arithmetic operation in which one arithmetic operation is performed by one instruction. For example, in the FORTRAN programming language, the equation A=B+C is processed by performing one arithmetic operation as a scalar arithmetic operation, while the vector arithmetic operation repeats the calculation of A(I)=B(I)+C(I), for example, one hundred times.

If an operation is performed by a vector register for controlling a vector arithmetic operation function, one arithmetic operation instruction can perform all data comprising 1–100 vector elements, thus omitting excess processes such as a loop controlling process.

Applications for effectively utilizing such vector arithmetic operations center on the calculation processes in the fields of scientific technology, and use a vector arithmetic operation function in a computer system to greatly improve the data processing capabilities.

Arithmetic operation units such as vector processors, for example, where a great number of scientific calculations are carried out, are required to perform vector processes at a high speed.

With conventional data processing devices comprising arithmetic operation units operated through the arithmetic operation pipeline, an arithmetic pipeline operation is performed by activating arithmetic operation units, providing data for the arithmetic operation units through a vector register when a vector arithmetic operation instruction is executed, and terminating the instruction after storing the result in the vector register.

With these data processing units, a vector arithmetic operation waits for the length of its vector to determine whether or not a vector arithmetic operation instruction is completed before starting the next arithmetic operation instruction. The vector lengths are determined by the number of repetitions of the arithmetic operation performed by a single vector operation instruction.

Therefore, the instruction start timing depends on the order of instructions, and should be adjusted by software by executing excess instructions, etc. when the start timing must be controlled. That is, it takes a wasteful process time by the number of steps for wasteful instructions.

If the vector length changes, then an arithmetic operation must be performed based on the vector length and the number of instruction steps should be modified. If a plurality of arithmetic operation units are provided, then the determination of the completion of a previous instruction becomes more difficult, and software can be developed more inefficiently. As a result, arithmetic operation pipelines cannot be efficiently controlled or managed.

A masked arithmetic operation performed by the arithmetic operation device in a pipeline mode is explained below.

In the masked arithmetic operation, masking data are prepared for each element of vector data so as to prevent masked data from being processed by arithmetic operations.

That is, assuming that $A(I)$ indicates a value to be processed, $B(I)$ indicates a value to process, and $M(I)$ indicates masking data in an arithmetic operation, then the value $M(I)$ is referred to when the product of the multiplication $A(I) \times B(I)$ is stored in $C(I)$ as shown in FIG. 1. If $M(I)=1$, the result is stored in $C(I)$. This is a masked arithmetic operation.

Normally, when arithmetic operations such as multiplications, additions, etc. are performed, processing data, data to be processed, and masking data are transferred for each process cycle from the vector register and the mask register to an arithmetic operation unit comprising the multiplier and the adder. The results provided by arithmetic operation units are transferred for each process cycle to the vector register. This is referred to as a pipeline process.

Since data handled in a vector process are related to one another by being identified by an index, that is, the value I in the above-mentioned equation, the maximum or the minimum value can be calculated.

In such processes, data for each process cycle are transferred to an arithmetic operation unit for comparing the data as in the above-described vector process. The arithmetic operation unit simultaneously receives two pieces of data to compare them.

FIG. 2 shows the concept of a masked arithmetic operation in calculating the maximum or minimum value. However, if all data are masked, then the possible minimum value is outputted when the maximum value is to be obtained, while the possible maximum value is outputted when the minimum value is to be obtained. This is because certain data should be outputted even if all data are masked and the possible minimum data, for example, does not have an affect on the maximum data to be obtained.

FIG. 3 is a block diagram showing the arithmetic operation circuit for obtaining the maximum or minimum value of vector data.

The arithmetic operation circuit comprises input latches 11, 12, and 13, a fixed value generating unit 14, a comparing unit 15, a first selector 16, a second selector 17, a temporary latch 18, and an output latch 19.

In FIG. 3, D' is an output signal of the input latch 11, M' is an output signal of the input latch 12, C2' is an output signal of the input latch 13, K is an output signal of the fixed value generating unit 14, S is an output signal of the comparing unit 15, Q is an output signal of the first selector 16, R is an output signal of the second selector 17, T is an output signal of the temporary latch 18, and O is an output signal of the output latch 19.

The input latch 11 is a latch circuit for temporarily storing the vector data D to be processed in an arithmetic operation, and data of one element is transferred as vector data D from the vector register per cycle.

The input latch 12 is a latch circuit for temporarily storing the masking information M for the vector data D. The masking information M is transferred from the mask register in synchronization with the vector data D. The mask is valid when the value is "1".

The input latch 13 is a latch circuit for temporarily storing a signal C2 indicating that the transferred vector data D is the first element. The signal C2 indicating "1" is transferred from the instruction control unit in synchronization with the first element.

If the inputted vector data D are masked, the fixed value generating unit 14 generates the maximum or minimum value of the data used by the arithmetic operation circuit according to the signal C1 indicating which of the maximum value or the minimum value is to be detected.

FIG. 4A is a block diagram showing the configuration of the fixed value generating unit 14. Assuming that the data used by the present arithmetic operation refer to an integer in the representation of a complement of 2 of 4 bits.

That is, as shown in FIG. 4B, the fixed value generating unit 14 includes a selector which selects "1000" (minimum value) as the maximum value to be detected when C1="0", while the selector selects "0111" (maximum value) as the minimum value to be detected when C1="1", and the result is outputted as a signal K.

As shown in FIG. 5A, the comparing unit 15 compares input values A and B, and outputs a result. The operation is explained by referring to FIG. 5B.

If the input C2'="1", that is, if the input data is the first element, then the output signal S is S="O" regardless of the value of the input signal C1.

In case of the first element, a previous element does not exist and thus the comparing unit 15 does not compare the current input data with the previous input data, thereby producing the output S=0 to select the current input data. Thus, the first selector 16 outputs the current input data.

If the input data is the second or following elements, and if the maximum value is to be detected (C1="O"), then S="O" when A-B$\geq$0 and S="1" when A-B<0. If the minimum value is to be detected (C1="1"), then S="1" when A-B$\geq$0 and S="O" when A-B<0.

As shown in FIG. 6A, the first selector 16 selects one of the output signal D' of the input latch 11, the output signal 0 of the output latch 19, and the output signal K of the fixed value generating unit 14 according to the output signal S of the comparing unit 15, the output signal M' of the input latch 12 (a mask signal for the current data), and the output signal T of the temporary latch 18 (a mask signal for the previous data).

That is, as shown in FIG. 6B, the already selected maximum value or the minimum value is used when only the current input is masked, while the current input is used when the previous data are masked. A fixed value is used if both the current and the previous data are selected, and the signal D' or the signal 0 is used according to the output signal S of the comparing unit 15 when no data are masked.

As shown in FIG. 7A, the second selector 17 selects either the signal M' or the signal T according to the output signal S of the comparing unit 15. As shown in FIG. 7B, R=M' is selected if S="O", and R=T is selected if S="1".

The temporary latch 1B temporarily stores the output signal R from the second selector 17 as the mask signal for the previous data.

The output latch 19 temporarily stores the output signal Q from the first selector 16 as the previous data, and the signal 0, that is, an output signal, is fed back to the comparing unit 15 and the first selector 16.

However, with the conventional arithmetic operation units, the masking information for previously inputted data are also latched. Thus, there has been a problem that two latch circuits are required to store the masking information.

Additionally, since the first selector 16 and the second selector 17 are operated separately according to two kinds of masking information, the configurations of the selectors necessarily become complicated.

A multiplying device is also provided for an arithmetic operation device performed in a pipeline mode. Explained below is an IEEE-based multiplying device capable of performing a single-precision multiplication with a floating decimal point and a multiplication of double-precision data with a floating decimal point.

FIG. 8A shows an example of a single-precision data format with a floating decimal point.

FIG. 8B shows an example of a double-precision data format with a floating decimal point.

FIG. 9 is a block diagram showing the configuration of the exponential data arithmetic operation circuit of the related art technology.

First, the IEEE-based format of single- and double-precision data with a floating decimal point is described by referring to FIGS. 8A and 8B. In FIGS. 8A and 8B, each of $S_1$, $S_{1'}$, $S_2$, $S_{2'}$, $S_3$, and $S_{3'}$ comprises 1 bit, and indicates a positive sign represented by "0" and a negative sign represented by "1". Each of $e_1$, $e_{1'}$, $e_2$, $e_{2'}$, $e_3$, and $e_{3'}$ indicates exponential part data, and comprises 8 bits in single-precision ($e_1$, $e_{1'}$, $e_2$, and $e_{2'}$) and 11 bits in double-precision ($e_3$ and $e_{3'}$). Each of $f_1$, $f_{1'}$, $f_2$, $f_{2'}$, $f_3$, and $f_{3'}$ indicates mantissa part data, and comprises 23 bits in single-precision ($f_1$, $f_{1'}$, $f_2$, and $f_{2'}$) and 52 bits in double-precision ($f_3$ and $f_{3'}$). In FIG. 8A, bits 0–31 indicate the lower order bit single-precision-with-a-floating-point data format, and bits 32–63 indicate the higher order bits of the data format. FIG. 8B shows a set of the double-precision-with-a-floating-point data format.

Next, these data are represented in the following equations in accordance with the IEEE based format.

$$(-1)^s \times 2^{e-127} \times (1.f) \ldots$$

single-precision data with a floating decimal point $$(-1)^s \times 2^{e-1023} \times (1.f) \ldots$$

double-precision data with a floating decimal point

The single precision data comprises the exponential part of 8 bits and the exponential part data is expressed by using the value 127 as its bias value. The double precision data comprises an exponential part of 10 bits and the exponential part data is expressed by using the value 1023 as the bias value.

The exponential part data of the multipliers and multiplicands in the above equations are applied to a data selector 31 and a data selector 32 shown in FIG. 9. Since only the arithmetic operations of exponential part data are explained here, the data selectors 31 and 32 select and output eight high order digits of exponential part data $e_1$ and $e_{1'}$ in the single-precision arithmetic operation with a floating decimal point. An adder (ADD) 33 adds these outputs ($e_1+e_{1'}$), and gives the result to a subtracter (SUB) 35.

On the other hand, since data are applied to the data selectors 31 and 32, "127" (a bias value) is subtracted from the sum obtained by the ADD 33. Therefore, a bias value selector 34 selects binary data corresponding to "127", which is predetermined for the single-precision data, and outputs it to the SUB 35. The SUB 35 subtracts "127" from the sum received from the ADD 33 and outputs the result.

In performing an arithmetic operation in double-precision with a floating decimal point, the data selectors 31 and 32 select and output eleven digits of exponential part data $e_3$ and $e_{3'}$. The ADD 33 adds all these outputs ($e_3+e_{3'}$), and applies the result to the SUB 35. On the other hand, the bias value selector 34 selects, outputs, and applies to the SUB 35 the binary data corresponding to a predetermined value "1023" (bias value) for the double-precision data. The SUB 35 subtracts "1023" from the sum received from the ADD 33, and outputs the result. Thus, arithmetic operations for the exponential part data are performed.

However, in the above-described circuit configuration, both the single- and double-precision data with a floating decimal point are processed by a single adder 33 (ADD), adding double-precision data by using 11 bits, and a subtracter 35 (SUB) for performing a subtraction using a bias value. Therefore, the conventional configuration comprising a two-step multi-bit (11 and 13 bits) adder and selector increases the necessary number of gates and prolongs the delay time.

FIG. 10 shows a conventional vector arithmetic operation circuit having the function of performing the above-described conventional vector arithmetic operation. A vector register 41 stores plural pieces of vector data; an arithmetic operation unit 42 performs arithmetic operations such as a comparison arithmetic operation for a pair of vector data pieces written in the vector register and other predetermined operations; and a mask register 43 writes for each piece of data a comparison result after the comparing operation by the arithmetic operation unit 42 and controls whether or not any arithmetic operation result other than the comparison result is to be written to the vector register 41.

A write address control unit 46 controls the write (W) address to the vector register 41; a read address control unit 47 controls a read (R) address when data are read from the vector register 41; and a write enable control unit 48 actually controls a write to the vector register 41 according to the contents written in the mask register 43. Registers R1–R5 delay the timing of data.

FIG. 11A and FIG. 11B respectively show an example of the configuration of the vector register 41 and the mask register 43 shown in FIG. 10. With the vector register shown in FIG. 11A, sixty-four (64) pairs of vector data VR0–VR63 individually have the vector length of 00–99 (corresponding to the parameter I=1–100 shown above). These vector data VR0–VR63 can be designated by higher order addresses 00–3F, the lower order addresses of each vector data can be designated by 00–99, and a piece of data designated by a higher order address and a lower order address comprise 64 bits.

As shown in FIG. 11B, sixteen (16) pairs of masking data MR0–MR15 are designated by higher order addresses 0–F, the lower order address of each masking data is designated corresponding to the vector length of the vector register shown in FIG. 11A, and a piece of data designated by a higher order address and a lower order address comprise one bit.

The operation of the conventional vector arithmetic operation circuit is explained by referring to the flowchart of the vector arithmetic operation shown in FIG. 12, and the timing chart of a vector arithmetic operation shown in FIG. 13.

First, as shown in FIG. 13, when a control signal PSTX from the control system (not shown) indicates the active state (the L level), each block shown in FIG. 10 simultaneously latches a control signal μCMD and individually operates according to the information through the control signal μCMD.

Then, the vector register 41 receives the control signal μCMD and simultaneously enters the read enabled state under control of the read address control unit 47. At this time, the read address control unit 47 reads from the vector register 41 A(I) and B(I) (I=1–100), that is, the vector data condition-determined in step S1 shown in FIG. 12, as data R.DATA 1 and 2.

The read operation is performed so that two pairs of vector data A(I) and B(I) are designated by higher addresses designated by read addresses R.ADR 1 and R.ADR 2 provided by the read address control unit 47 as shown in FIG. 13. In this example, vector data A(I) and B(I) are selected as vector data VR2 and VR4 respectively by designating higher addresses 02 and 04 as shown in FIG. 11A. Simultaneously, 100 pieces of data are sequentially read as read data R.DATA 1 and 2 as parameter I varies from 00 through 99 as shown in FIG. 11A.

Thus, the vector data read from the vector register 41 are sent to the arithmetic operation unit 42 through register R4. The arithmetic operation unit 42 determines the condition in step S1 shown in FIG. 12, that is, performs a comparing operation. The comparison result is stored as masking data MR0 at a higher order address 0, for example, in the mask register 43 through register R1. With these masking data MR0–MR15, the comparison result (1 or 0) of the above-described vector data A(I) and B(I) are written to each bit 00 through 99 as data MR-W.DATA shown in FIG. 13.

Thus, in step S1 shown in FIG. 12, the control signal RENDX indicates the completion of the reading operations when all data at lower order addresses 00–99 have been processed. Then, the control signal CENDX also indicates the termination of an instruction, and it is notified that the results of the comparing operations have been written from the arithmetic operation unit 42 to the mask register 43.

When the comparing operation is completed in step S1, arithmetic operation should be performed in step S2 or S20. However, since the vector data A(I) and B(I) are read to the arithmetic operation unit 42, the arithmetic operation unit 42 performs subtractions shown in steps S2 and S20. The results of the arithmetic operations are sent as vector data C(I) to the vector register 41 (step S3) through register R5. In the example shown in FIG. 13, vector data C(I) are written to the vector data VR9 in which higher address is 09.

However, vector data are written as vector data C(I) only if vector data A(I)>vector data B(I) (YES) (step S3). When the comparison result is "NO" in step S1, "1", for example, is written as a masking data in the mask register 43. Therefore, the result of the arithmetic operation in step S20 is prevented from being written to the vector register 41 by providing the masking data to the vector register 41 through register R2, the write enable control unit 48, and register R3.

Likewise, the arithmetic operation in step S40 is performed by the arithmetic operation unit 42 corresponding to the operation in step S4. At this time, the arithmetic operation result is written as the vector data D(I) to the vector register 41 only if vector data A(I) is larger than vector data B(I) in step S1 (step 55).

Thus, comparing operations and other predetermined arithmetic operations are performed in steps S1–S5, S20, and S40 as shown in FIG. 12. The steps S20 and S40 should be performed even if the comparison results in a negative result N in step S1. Similar operations are performed in steps S6–S10, S70, and S90.

Thus, in the conventional vector arithmetic operations, even if a comparison result in step S1 indicates, as shown in FIG. 12, that a predetermined arithmetic operation shown in steps S20 and S40 is not required, data are read from the vector register 41 and the arithmetic operation is performed by the arithmetic operation unit 42. However, according to the write enable signal of the vector register 41, no data are written to the vector register 41. Therefore, arithmetic operations are performed even if data are prevented from being written to the vector register 41 by the high-active masking data M-W.DATA as in the case where read data R.DATA ① and ② indicate the lower order addresses 02, 03, 07, etc. as shown in FIG. 13. If these masked arithmetic operations increase in number, the number of wasteful cycles becomes large, too.

The vector arithmetic operation unit including the arithmetic operation unit, vector register and mask register can be formed of an LSI.

To easily conduct an LSI test, a flipflop (hereinafter referred to as an FF) can be a scan type in an LSI, and a circuit can be configured with a plurality of FFs connected serially. With such an LSI, the contents of the FFs being processed can be read to an external unit for an LSI test, or the data can be written directly to the FFs for the LSI test.

In conducting the above described LSI test, a clock signal having clocks as many as the FFs should be provided for the LSI. If a large scale LSI necessarily increases the number of FFs, the number of clocks also increases. As a result, it takes a long time to conduct the LSI test.

FIG. 14A shows an example of a scan type D-FF.

The D-FF comprises a selector 50 and a D-FF main body 51. During the normal operation (not in the test mode), since a test signal T indicates the inactive state, the selector 50 selects a signal D and provides the D terminal of the D-FF main body 51. The D-FF main body 51 receives the signal D at the timing of a clock CK, and outputs it from the terminal Q. During the test operation, since the test signal T indicates the active state, the selector 50 selects a scan-in signal $S_{in}$ and provides it to the D terminal of the D-FF main body 51. The D-FF main body 51 receives the scan-in signal Sin at the timing of the clock CK, and outputs it from the terminal Q. The output from the terminal Q is used as a normal output Q and a scan-out signal $S_{out}$.

Next, FIG. 14B shows the conventional LSI in which the scan type FF shown in FIG. 14A is used.

The LSI comprises a first combination circuit 52, a second combination circuit 53, and n flipflops FF1–FFn positioned between the first and the second combination circuits 52 and 53 and connected serially. An input IN is applied to the circuit 52 and an output OUT is outputted from the circuit 53. Flipflops FF1–FFn are described below.

Each of the flipflops FF1–FFn comprises a selector and a D-FF main body as shown in FIG. 14A. The scan-in terminal $S_{in}$ of FF1 at the bottom is connected to the external scan-in terminal $S_i$. The scan-out terminal $S_{out}$ of FF1 is connected to the scan-in terminal $S_{in}$ of the next FF2, and so on. Thus, the scan-out terminal $S_{out}$ of FF(n−1) is connected to the scan-in terminal $S_{in}$ of FFn at the top. The scan-out terminal $S_{out}$ of FFn is connected to the external scan-out terminal $S_O$. Thus, the path $S_{in} \rightarrow S_{out} \rightarrow S_{in} \rightarrow S_{out} \rightarrow$ is referred to as a scan path $S_{path}$.

A test signal T and a clock CK are applied to the above described FF1–FFn. Output terminals $O_1, O_2, -O_{n-1}$, and $O_n$ of the first combination circuit 52 are connected to the D terminals of FF1–FFn. The Q terminals of FF1–FFn are connected to input terminals $I_1, I_2, -I_{n-1}$, and $I_n$ of the second combination circuit 53.

With the above-described LSI, during the normal operation (not in the test mode), the first combination circuit 52 is operated according to the input IN from an external unit, and the result is outputted from the output terminals $O_1$, $O_2, -O_{n-1}$, and $O_n$. Since the test signal T indicates the inactive state, FF1 and FF2 latches the outputs from the output terminals $O_1, O_2, -O_{n-1}$, and $O_n$ of the circuit 52 at the timing of the clock CK. Then, they are provided to the input terminals $I_1, I_2, -I_{n-1}$, and $I_n$ of the second combination circuit 53. Thus, the second combination circuit 53 is operated. The result is outputted as an output OUT to an external unit.

If the output OUT from the second combination circuit 53 is different from an expected value, it should be determined what is defective, the circuit 52, 53, or both of them. Thus, using scan type FF1–FFn, it is determined what circuit is defective. The procedures for determining a defective unit are described below.

First, determination is made as to whether or not a defect exists in the first combination circuit 52. If the circuit 52 is operated according to a normal input IN from an external unit, one cycle of the clock CK is applied to FF1–FFn. and a test signal T indicates the active state, then the output of the output terminals $O_1$14 $O_n$ of the circuit 52 are set to FF1–FFn respectively. Then, if the clocks CK are applied to FF1–FFn, the contents of FFn–FF1 are sequentially outputted to the external scan-out terminal $S_0$ through the scan path $S_{path}$ each time the clock CK is applied. Thus, it is determined whether or not the first combination circuit 52 is defective by determining the output of the external scan-out terminal $S_0$.

Next, the determination as to whether or not a defect exists in the second combination circuit 53 is explained below. When the test signal T indicates the active state, the clock CK is applied to FF1–FFn. At the same time, a normal input of the input terminals $I_n-I_1$ of the second combination circuits 53 is applied in a cycle unit from the external scan in terminal $S_i$. In response to this, normal inputs of the input terminals $I_n-I_1$ of the circuit 53 are sequentially set to FFn–FF1 respectively through the scan path $S_{path}$. Thus, the second combination circuit 53 is operated according to the normal inputs set to FFn–FF1, and the result is outputted as an external output OUT. Thus, it is determined whether or not the second combination circuit 53 is defective by determining the output of the external output OUT.

As described above, the LSI shown in FIG. 14B operates the circuit 52 according to a normal input IN from an external unit and determines the output of the external scan-out terminal $S_o$ so as to determine whether or not the circuit 52 is defective. The LSI shown in FIG. 14B also determines whether or not the circuit 53 is defective by determining the external output OUT by applying a normal input from the external scan-in terminal $S_i$ to the circuit 53.

Normally, the LSI can be divided into a plurality of functional units. If a unit is scan-tested whether or not it is defective, only the FFs related to the unit should be checked. However, when all FFs are connected serially as shown in FIG. 14B, the number of clock cycles are required is as many as the number (n−1) of other units FF1–FFn before the read content of FF1 is outputted to the external scan-out terminal $S_o$ if the unit located near the external scan-in terminal $S_i$ and assigned FF1 is to be scan-read and tested. If the unit located near the external scan-out terminal $S_o$ (for example, the unit to which FFn is assigned) is to be scan-written by a scanning and tested, the number of clock cycles are required is as many as the number (n−1) of other units FF1–FFn−1 before the content to be written reaches from the external scan-in terminal $S_i$ to FFn.

If the LSI is a small scale type, the number of clock cycles required for a scan-read and a scan-write is small because the number of FFs is small. However, as it is a large scale LSI, the number of clock cycles required for a scan-read and a scan-write for all FFs becomes large because the number of FFs to be used is large. As a result, an LSI test takes a long time if the LSI is a large scale type.

SUMMARY OF THE INVENTION

A first object of the present invention is to provide a data processing device for effectively controlling and managing a pipeline of an arithmetic operation conducted by controlling the operation of the arithmetic operation unit by using hardware.

A second object of the present invention is to provide a data processing device comprising an arithmetic operation apparatus with a simplified configuration for detecting the maximum value and the minimum value of the vector data a part of which is masked.

A third object of the present invention is to provide a multiplier used for pipeline operation in an arithmetic operation in a data processing device, the multiplier having a decreased number of gates shortens the delay of the data in an arithmetic operation.

A fourth object of the present invention is to provide data processing devices for shortening a process cycle by omitting wasteful operations as much as possible using a mask register.

A fifth object of the present invention is to provide a data processing device formed of an LSI for shortening a test time by performing a test with fewer clock cycles.

A first feature of the present invention resides in a data processing device having an arithmetic operation unit for operating according to the pipeline control and an instruction decoder for controlling the arithmetic operation unit by decoding an instruction comprising a state retaining unit for retaining the state of the operation of the arithmetic operation unit, wherein the instruction decoder controls the execution of the arithmetic operation unit according to the information stored by the state retaining unit. In addition to the above first feature, the present invention has the additional features such as a circuit for obtaining the maximum and the minimum value, which is provided in an adder of an arithmetic operation unit, a multiplier operating under an IEEE standard and a circuit for packing and unpacking the vector data which should be operated in the arithmetic operation unit. Further, the data processing device of the present invention can be tested by a simple scan path method. Such additional second to fifth features will be explained as follows.

A second feature of the present invention resides in a data processing device comprising an arithmetic operation device for obtaining the maximum or minimum value of predetermined data according to the data and the masking data for the data, comprising a selecting unit for selecting and outputting either fixed value data determined depending on whether an arithmetic operation obtains the maximum value or the minimum value according to the masking data, or the predetermined data, and a determining unit for outputting an output value from the selecting unit as is when it is the first element, and for determining which is larger, the output value or the previously outputted value, depending on whether the arithmetic operation obtains the maximum value or the minimum value when the output value from the selecting unit is an element other than the first one.

A third feature of the present invention resides in a data processing device comprising an arithmetic operation unit provided with a multiplying device for performing a multiplication of single- and double-precision data with a floating decimal point, comprising a data converting unit for outputting an input as is when the input refers to exponential part data of a multiplier and a multiplicand in double-precision data with a floating decimal point, and for outputting the input after aligning the number of digits to that of exponential part data of a multiplier and a multiplicand in double-precision data with a floating decimal point when the input refers to exponential part data of a multiplier and a multiplicand in single-precision data with a floating decimal point, a first adding unit for receiving the outputs of the data converting unit, adding and outputting them, a correcting unit for receiving data of a predetermined number of lower order digits of the output of the first adding unit, outputting the data as is if the input data refer to exponential part data in double-precision with a floating decimal point, and outputting the data after correcting a predetermined number of digits of data if the input data refer to exponential part data in single-precision with a floating decimal point, and a second adding unit for performing an addition and subtraction on the predetermined number of high order digits of data outputted by the first adding unit and the value for standardizing the input data with a standard value, and then outputting the result.

A fourth feature of the present invention resides in a data processing device comprising a vector arithmetic operation circuit comprising a vector register for storing plural pieces of vector data, an arithmetic operation unit for performing arithmetic operations such as a comparison arithmetic operation for a pair of vector data pieces and other predetermined operations, a mask register for writing for each piece of data a comparison result after the comparing operation performed by the arithmetic operation unit, a packing/unpacking unit for packing two pieces of vector data such that only valid data are retained according to the comparison result written in the mask register, writing the result separately to the vector register, writing the result of an arithmetic operation to the vector register when the arithmetic operation is performed on the packed valid data by the arithmetic operation unit, and simultaneously unpacking the result of the arithmetic operation to the original address in the vector register, and a switch for switching control between the arithmetic operation unit and the packing/unpacking unit according to the switch signal from the control system.

A fifth feature of the present invention resides in a data processing device formed of an LSI device having a plurality of scan-type flipflops (FF1–FFn, ..., FF1–FFn), wherein the flipflops (FF1–FFn, ..., FF1–FFn) can be divided and assigned to each of LSI units (U1–Um), in each of the units (U1–Um), a scan-out terminal ($S_{Out}$) of a flipflop (FFj) is connected to a scan-in terminal ($S_{in}$) of the next flipflop (FF(j+1)), a scan-in terminal ($S_{in}$) of a flipflop (FF1) at the top and a scan-out terminal ($S_{out}$) of a flipflop (FFn) at the bottom are respectively connected to an external scan-in terminal ($S_i$) and an external scan-out terminal ($S_O$), each unit (U1–Um) is separately assigned a scan path ($S_{path}1$–$S_{path}m$) respectively, and the LSI device further comprises control circuits for selecting one of the units (U1–Um).

BRIEF DESCRIPTION OF THE DRAWINGS

FIG. 1 shows an explanatory plan view of an arithmetic operation with masked data;

FIG. 2 shows an explanatory view of an arithmetic operation with masked data when the maximum value and the minimum value are detected;

FIG. 20B shows a correspondence table between a bank of a vector register and a pipeline shown in FIG. 20A;

FIGS. 20C and 20D show an example of data stored in the vector register shown in FIG. 20A;

DESCRIPTION OF THE PREFERRED EMBODIMENTS

Figure 15A:
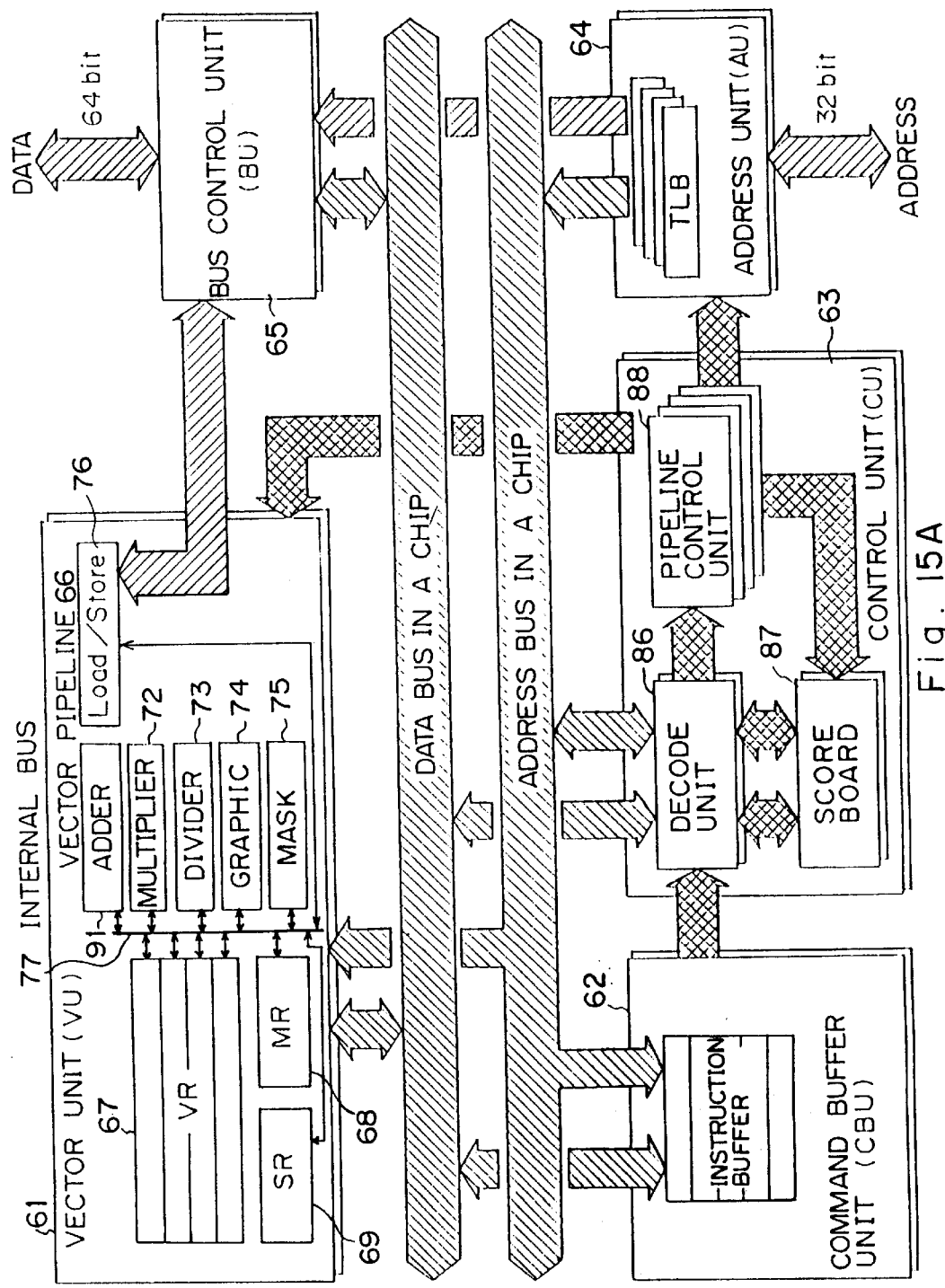
FIG. 15A shows a block diagram of a vector processor device.

FIG. 15A shows a configuration of the vector processor unit (VPU) in which the embodiments of invention are used.

The vector processor unit (VPU) comprises a vector unit (VU) 61, a command buffer unit (CBU) 62, a control unit (CU)63, an address unit (AU) 64, and a bus control unit (BU) 65.

The vector unit 61 for performing a vector operation comprises a vector pipeline 66, an 8 KB vector register (VR) 67, a 64-byte mask register (MR) 68, a 128-byte scalar register (SR) 69, an adder 71, a multiplier 72, a divider 73, a graphic processor 74, a mask processor 75, and a load/store pipe 76 for reading data to the registers, and storing data in a memory, which are connected through an internal bus 77. The vector unit 61 functions as the important part of the vector processor unit.

As shown in FIG. 15A, the control unit 63 comprises decoder 86, score board 87 and pipeline control unit 88. The address unit 64 comprises an output address generating unit and an address control unit which are not shown.

Figure 15B:
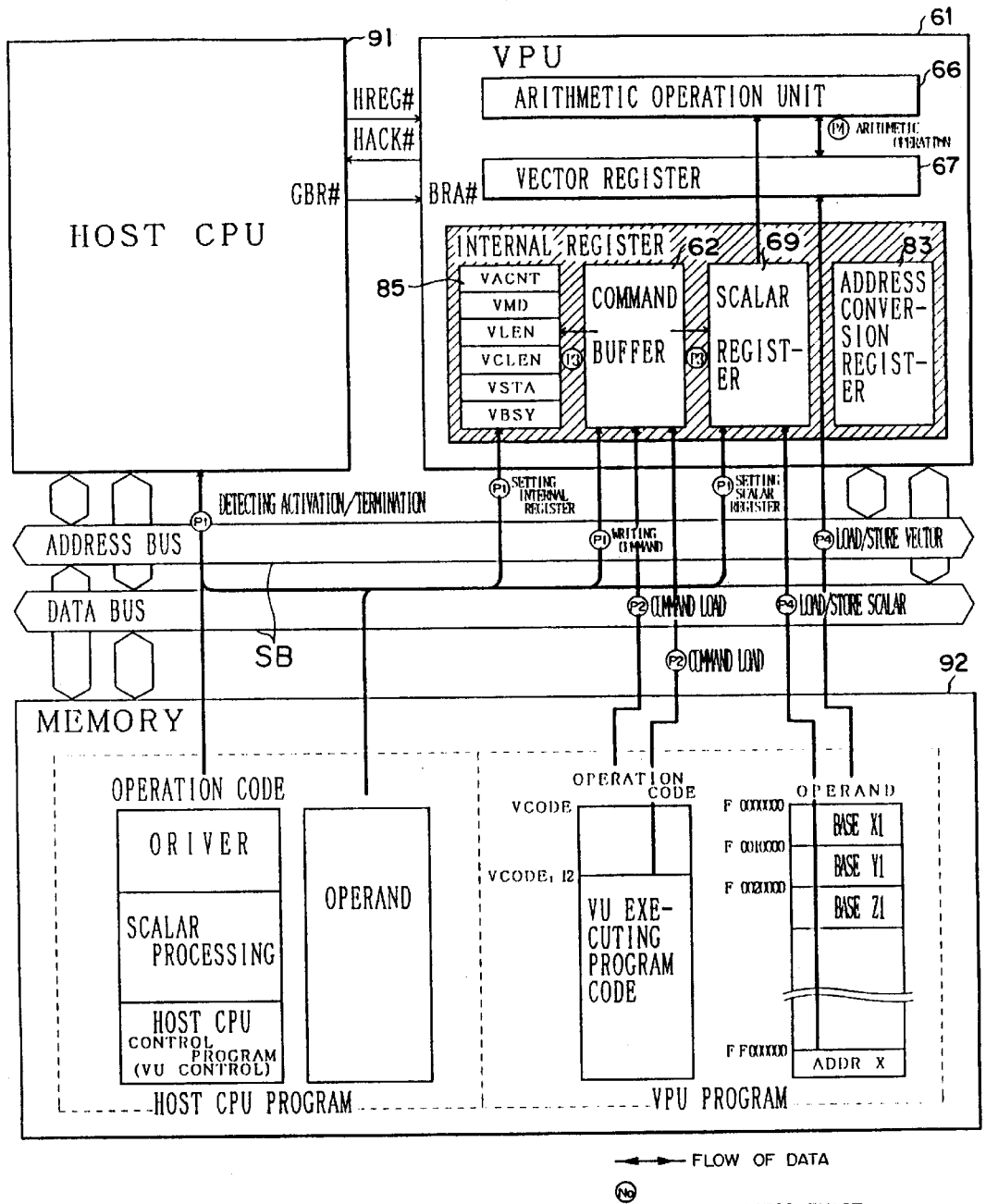
FIG. 15B shows a block diagram of a vector processor system comprising the vector processor device shown in FIG. 15A, a CPU and a memory.

As shown in FIG. 15B, a central processing unit 91 comprising a host CPU, and the vector processor unit VPU 61, are connected by a system bus SB and slave interfaces (HREQ#, HACK#, GBR#, etc.). When the central processing unit 91 performs vector operations, etc., the vector processor unit 61 is accessed in the following procedure.

FIG. 15B is a view for explaining the controlling process between the central processing unit 91 and the vector processor unit 61. In a phase P1, the central processor unit 91 executes a control program (VU control) pre-stored in the memory 92 and then initializes internal registers in the vector processor unit 61, for example, a register for the vector length, etc. A host processor program area in the memory 92 comprises an operation code area including a soft driver, scalar process, and host main processor control programs and an operand area. Then, the central processing unit 91 activates the vector processor unit 61 when the initialization is completed. This permits the vector processor unit 61 to read an operation code in the VU program area in a phase P2 and read it in the command buffer. That is, a command is loaded. Then, in a phase P3, command buffer 62 stores the loaded command and outputs the instruction corresponding to each operation to an internal register 85 and the scalar register 69. Then, in a phase P4, the vector processor unit 61 performs target operations in parallel and target processes in the pipeline mode. At this time, in the scalar process, the data of the operand in the VPU program area are loaded through the scalar register 69, and the result obtained by the arithmetic operation unit 66 is stored in the operand area. By contrast, in the vector process, it is loaded and stored through the vector register 67.

When the above-described process is completed, the central processing unit 91 accesses a register in the vector processor unit 61, reads the completion state, and determines whether or not the process has terminated normally.

In the operation above, a memory 92 is accessed in the scalar and the vector processes in the embodiment of the present invention. At this time, if a bus-use-right release signal BRL# indicating the active state is applied from the central processing unit 91, etc., the bus-use-right release signals BRL#, etc. are detected with the access response signal DC# in the cycle in which the access response signal DC# is detected so that the number of memory access addresses equal that of the pieces of the data to be processed.

Figure 16:
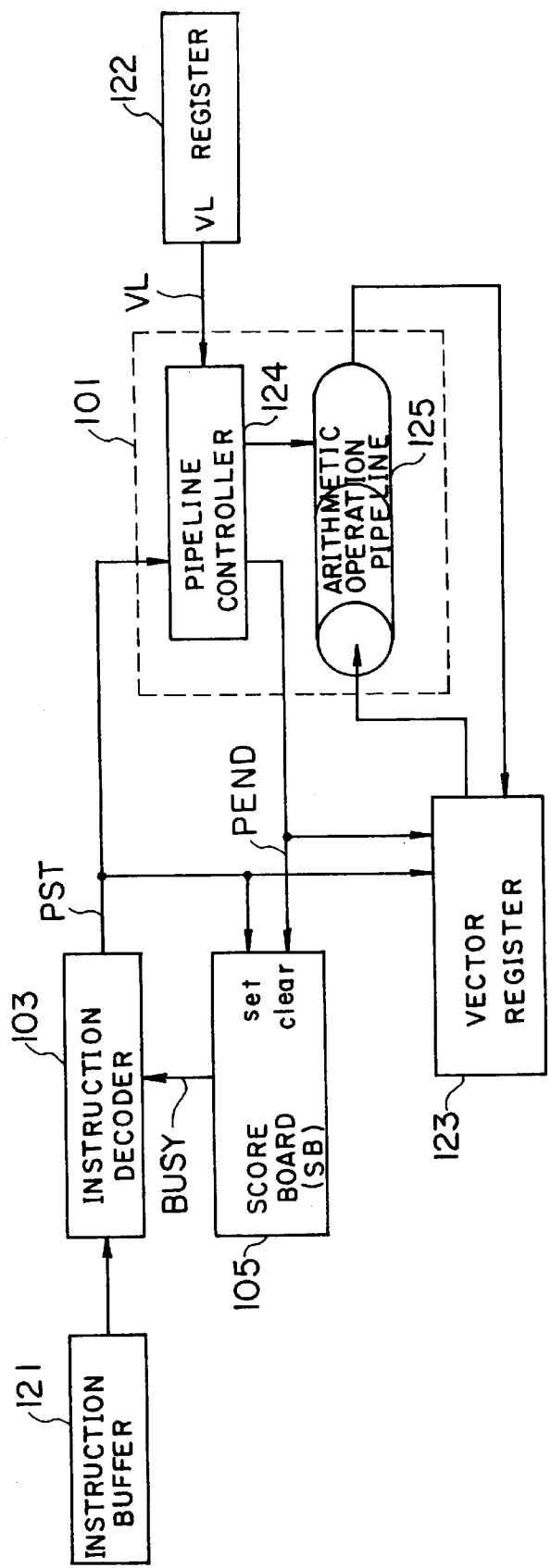
FIG. 16 shows a block diagram of an embodiment of a data processing apparatus for performing a pipeline operation according to the present invention.

The present invention provides a data processing unit according to a principle as shown in FIG. 16, comprising an arithmetic operation unit 101 for operating according to the pipeline control, an instruction decoder 103 for controlling the arithmetic operation unit 101 by decoding an instruction or command, and a state retaining unit 105 for retaining the state of the operation of the arithmetic operation unit 101. The state retaining unit 105 is also called a score board. The instruction decoder 103 controls the arithmetic operation unit 101 according to the information stored by the state retaining unit 105.

The arithmetic operation unit 101, instruction decoder 103, and vector register 123 shown in FIG. 16 correspond to arithmetic operation unit 66, command buffer 62 and vector register 67 shown in FIG. 15A, respectively.

With the data processing device according to a principle of the present invention shown in FIG. 16, the state retaining unit 105 is set according to a signal PST issued by the instruction decoder 103. The operation of the arithmetic operation pipeline of the arithmetic operation unit 101 is started according to this signal. The state retaining unit 105 is released according to a signal PEND issued by the arithmetic operation unit 101 and indicating the completion of the operation of the arithmetic operation pipeline. The instruction decoder 103 controls an execution of the arithmetic operation pipeline of the arithmetic operation unit 101 according to the information stored in the state retaining unit 105.

Accordingly, the start timing of an instruction can be adjusted by hardware regardless of the variations in vector length without executing excess instructions by software. Thus, the data processing device can be efficiently controlled and managed through the arithmetic operation pipeline.

Figure 17A:
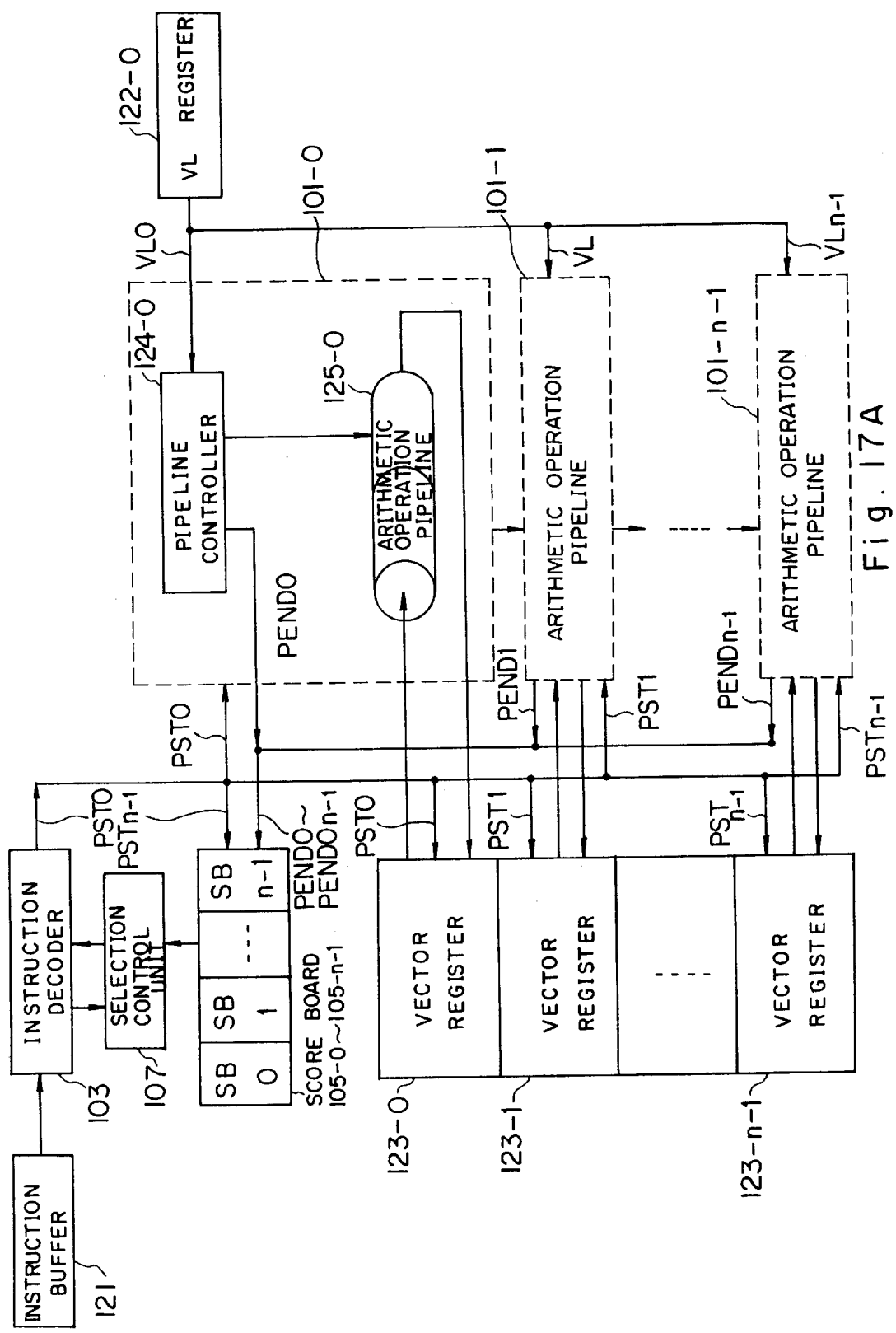
FIGS. 17A,B shows a block diagram of an embodiment of data processing device for performing a pipeline operation according to the present invention.
Figure 17B:
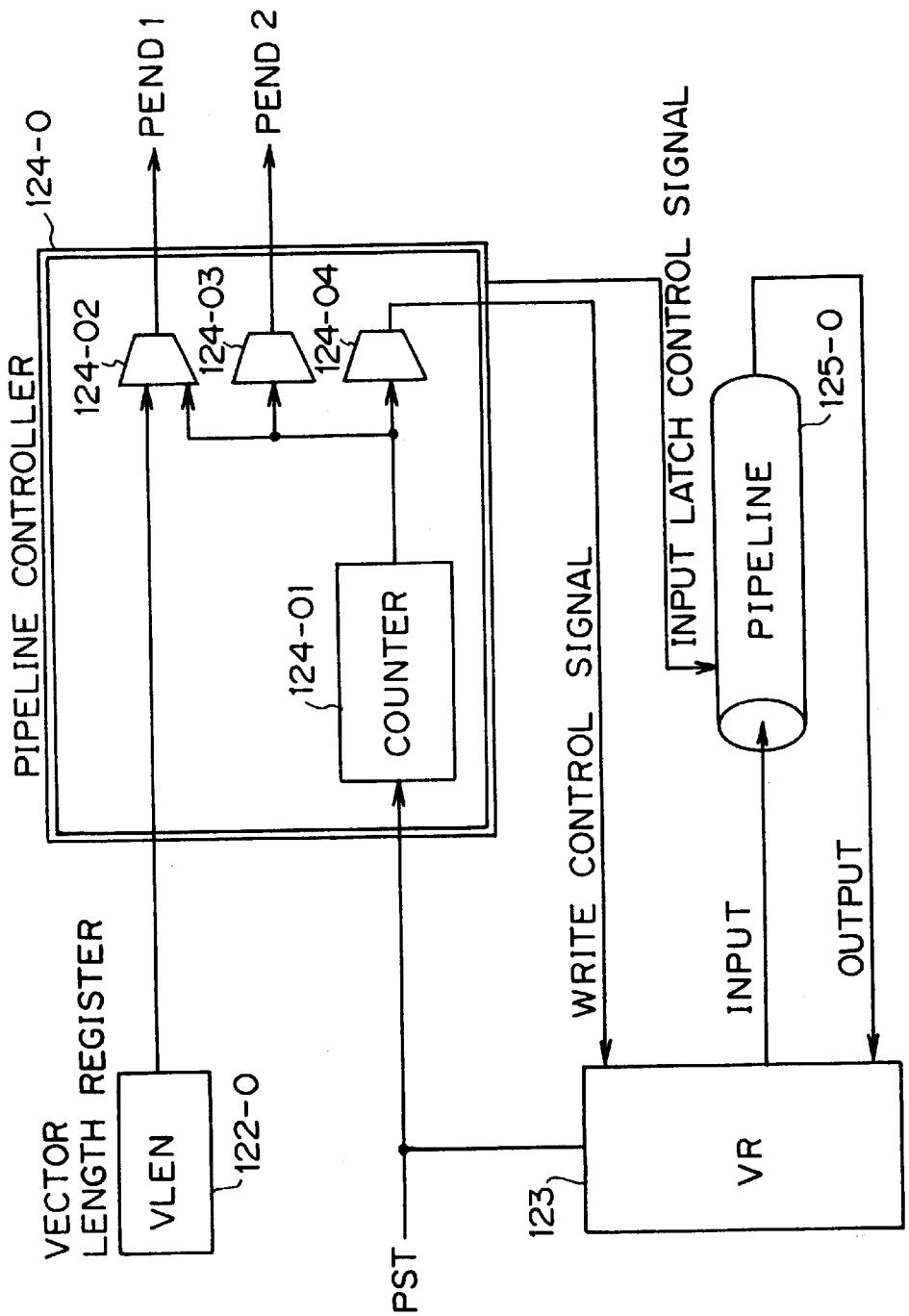
Figure 18A:
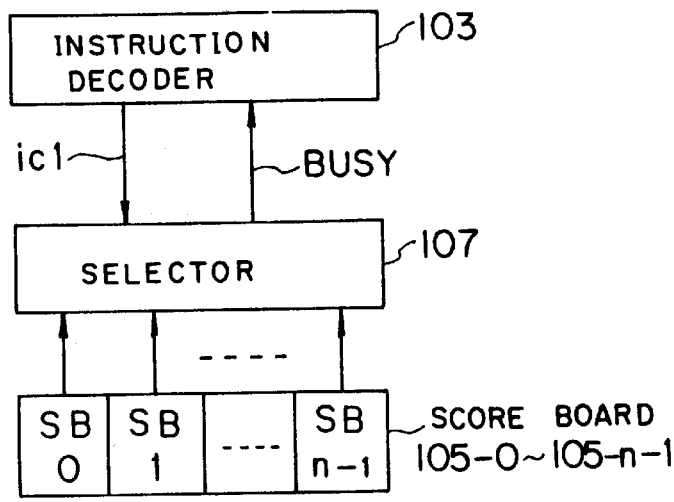
FIG. 18A shows a block diagram of an embodiment of a selection control unit shown in FIGS. 17A,B.

The data processing device according to a principle of the present invention as shown in FIGS. 17 and 18A comprises n (n can be any positive integer) arithmetic operation units 101-0–101-n−1 for operating according to the pipeline control, the instruction decoder 103 for operating arithmetic operation units 101-0–101-n−1 by decoding an instruction, n state retaining units 105-0–105-n–1 for retaining the state of the operation of the arithmetic operation units corresponding to n arithmetic operation units 101-0–101-n–1, and a selection control unit 107 for selecting according to a signal ic1 (FIG. 18A) indicating the type of an instruction from the instruction decoder 103 one of the outputs of state retaining units 105-0–105-n–1 and outputting it to the instruction decoder 103. The instruction decoder 103 controls an execution of arithmetic operation units 101-0–101-n–1 according to the output signal BUSY from the selection control unit 107.

With the data processing device according to a principle of the present invention shown in FIGS. 17 and 18A, n state retaining units 105-0–105-n–1 are set according to signals PST-0–PSTn–1 for starting the operations of the arithmetic operation pipelines for arithmetic operation units 101-0–101-n–1. The signals are issued by the instruction decoder 103. The state retaining units can be released according to operation completion signals PENDO–PENDn–1 for the arithmetic operation pipelines issued by arithmetic operation units 101-0–101-n–1. The selection control unit 107 selects one of the outputs of state retaining units 105-0–105-n–1 according to a signal ic1 indicating the type of an instruction from the instruction decoder, and then outputs it to the instruction decoder 103. The instruction decoder 103 controls an execution of the arithmetic operation pipelines of arithmetic operation units 101-0–101-n–1 according to the output signal BUSY from the selection control unit 107.

Accordingly, with the data processing unit comprising a plurality of arithmetic operation units operated through arithmetic operation pipelines, the start timing of an instruction can be adjusted by hardware regardless of the variations in vector length. Thus, the arithmetic operation pipelines can be efficiently controlled and managed.

Figure 18B:
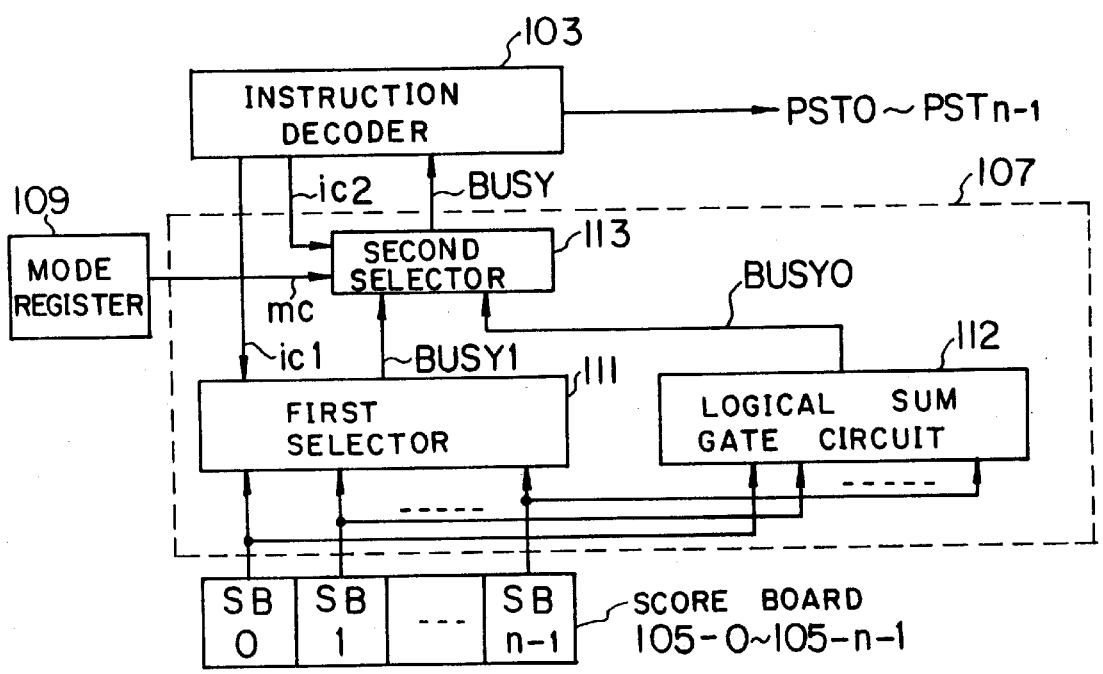
FIG. 18B shows a block diagram of another embodiment of a selection control unit shown in FIGS. 17A,B.

The data processing unit according to a principle of the present invention shown in FIGS. 17 and 18B is a modified type of the data processing unit according to the principle of the present invention shown in FIGS. 17 and 18A. The selection control unit 107 comprises a first selector 111 for selecting and outputting one of the outputs from state retaining units 105-0–105-n–1 according to a signal ic1 indicating the type of an instruction from the instruction decoder 103, a gate circuit 112 for obtaining a logical sum of the outputs of state retaining units 105-0–105-n–1, and a second selector 113 for selecting the output of either the first selector 111 or the gate circuit 112 0according to a signal ic2 indicating the type of an instruction from the instruction decoder 103 and then outputting it to the instruction decoder 103. The instruction decoder 103 controls an execution of arithmetic operation units 101-0–101-n–1 according to an output signal BUSY from the second selector 113.

With the data processing device according to a principle of the present invention, as shown in FIGS. 17 and 18B, the selector 111 selects and outputs one of the outputs of state retaining units 105-0–105-n–1 according to the signal ic1 indicating the type of an instruction from the instruction decoder 103. The gate circuit 112 obtains a logical sum of the outputs of state retaining units 105-0–105-n–1. The second selector 113 selects the output of either the first selector 111 or the gate circuit 112 according to the signal ic2 indicating the type of an instruction from the instruction decoder 103, and outputs it as a BUSY signal to the instruction decoder 103. The instruction decoder 103 controls an execution of the arithmetic operation pipelines of arithmetic operation units 101-0–101-n–1 according to the signal BUSY.

Therefore, if arithmetic operations should be controlled in a predetermined order such as in sum-of-products operations (additions are performed after multiplications), then the output of the gate circuit 112 is selected by the second selector 113 according to the signal ic2. When a series of instructions are completed and a request for modified vector length is issued, the output of the gate circuit is selected by the second selector 113 according to the signal ic2. As a result, the arithmetic operation pipelines can be controlled and managed further in detail.

The data processing unit according to another principle of the present invention as shown in FIGS. 17 and 18B is a modified type of the above-recited data processing unit according to the principle of the present invention shown in FIGS. 17 and 18B. The data processing device further comprises a mode register 109 for outputting a mode signal mc indicating whether n arithmetic operation units 101-0–101-n–1 are operated in the parallel mode where they are operated in parallel or the test mode where they are operated individually. The second selector 113 selects the output of either the first selector 111 or the gate circuit 112 according to the signal ic2 indicating the type of an instruction from the instruction decoder 103 and the mode signal mc from the mode register 109 and then outputs it to the instruction decoder 103.

In the data processing unit according to a principle of the present invention, the second selector 113 selects according to priority the mode signal mc from the mode register 109.

With the data processing unit according to the principle of the present invention, as shown in FIGS. 17 and 18B, the first selector 111 selects and outputs one of the outputs of state retaining units 105-0–105-n–1 according to the signal ic1 indicating the type of an instruction from the instruction decoder 103. The gate circuit 112 obtains a logical sum of the outputs of state retaining units 105-0–105-n–1. The second selector 113 selects the output of either the first selector 111 or the gate circuit 112 according to the signal ic2 indicating the type of an instruction from the instruction decoder 103 and according to the mode signal mc indicating whether arithmetic operation units 101-0–101-n–1 are operated in the parallel mode where they are executed in parallel or in the test mode where they are operated individually. Then, the second selector 113 outputs the selected output to the instruction decoder 103 as a signal BUSY. The instruction decoder 103 controls an execution of the arithmetic operation pipelines of arithmetic operation units 101-0–101-n–1 according to the signal BUSY. Specifically, in a data processing device operating according to this principle, the second selector 113 selects according to priority the mode signal mc from the mode register 109.

Accordingly, if a program test is conducted, for example, then the execution of the arithmetic operation pipelines of arithmetic operation units 101-0–101-n–1 can be checked in a step unit regardless of the type of an instruction by setting the mode register 109 to a test mode. Thus, the arithmetic operation pipelines can be controlled and managed further in detail.

Next, the embodiment of the present invention is described by referring to the attached drawings.

FIG. 16 shows the configuration of the data processing device associated with an embodiment of the present invention.

In FIG. 16, the data processing device of the present embodiment comprises the pipeline arithmetic operation unit 101 comprising a pipeline controller 124 and an arithmetic operation pipeline 125, an instruction buffer 121 for storing an instruction, the instruction decoder 103 for decoding an instruction from the instruction buffer 121 and controlling the pipeline arithmetic operation unit 101, the score board 105 for storing the operation state of the pipeline arithmetic operation unit 101, a vector register 123 for storing the data and the results of vector operations performed by the pipeline arithmetic operation unit 101, and a vector length (VL) register 122 for designating the vector length of a vector operation performed by the pipeline arithmetic operation unit 101.

Figure 19A:
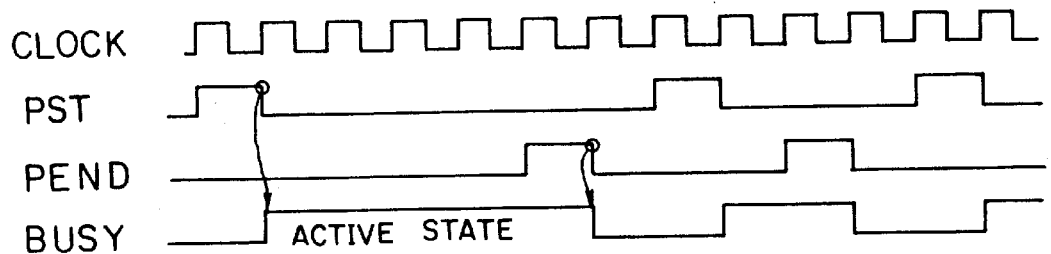
FIG. 19A shows a timing chart of the data processing apparatus shown in FIG. 16.

According to the present invention, the pipeline arithmetic operation unit 101 is executed by the instruction decoder 103 based on the information stored in the score board 105. The operation is explained below by referring to the timing chart shown in FIG. 19A.

On receiving an instruction from the instruction buffer 121, the instruction decoder 103 decodes the instruction, reads a state signal BUSY from the score board 105 for the pipeline arithmetic operation unit 101 used by an instruction, and checks whether or not the pipeline arithmetic operation unit 101 is available. If the pipeline arithmetic operation unit 101 is not available, (the signal BUSY indicates the H level), the instruction decoder 103 maintains the wait state until the pipeline arithmetic operation unit is available to the instruction decoder 103. If the pipeline arithmetic operation unit 101 is available, the pipeline start signal PST is made to indicate the active state (the H level). When the signal PST indicates the active state, the score board 105 is set and the signal BUSY indicates the active state to notify that the pipeline arithmetic operation unit 101 is being used.

On detecting that the pipeline start signal PST indicates the active state, the pipeline controller 124 receives an operation parameter from the instruction decoder 103, refers to the vector length (number of elements) VL, and starts controlling the arithmetic operation pipeline 125. When the pipeline start signal PST indicates the active state, the vector register 123 receives from the instruction decoder 103 a register number used in an arithmetic operation, and provides the arithmetic operation pipeline 125 with vector data. The arithmetic operation pipeline 125 performs a predetermined operation using the data provided by the vector register 123, and stores the result in the vector register 123.

On detecting the completion of the arithmetic operation for the number of vector elements VL, the pipeline controller 124 makes the arithmetic operation completion signal PEND indicate the active state, and terminates the control of the arithmetic operation pipeline 125. If the arithmetic operation signal PEND indicates the active state, then the vector register 123 terminates providing vector data, the score board 105 is cleared to make the state signal BUSY indicate the inactive state (L level). Thus, the instruction decoder 103 is notified that the pipeline arithmetic operation unit 101 is now available to the instruction decoder 103.

On recognizing that the state signal BUSY indicates the inactive state, the instruction decoder 103 makes the pipeline start signal PST for the next instruction indicate the active state.

Thus, according to the present embodiment, the timing of starting an instruction can be adjusted by hardware, and the arithmetic operation pipeline can be effectively controlled or managed regardless of the vector length.

FIG. 17 shows the configuration of the data processing device associated with an embodiment of the present invention.

In FIG. 17, the data processing device of the present embodiment comprises n pipeline arithmetic operation units 101-1–101-n–1, the instruction buffer 121, the instruction decoder 103 for decoding an instruction from the instruction buffer 121 and controlling pipeline arithmetic operation units 101-0–101-n, the selection control unit 107 for selecting one of the outputs of score boards 105-0–105-n–1 according to score boards 105-0–105-n–1 and signal ic1 indicating the type of an instruction from the instruction decoder 103 and then outputting the selected output to the instruction decoder 103, vector registers 123-0–123-n–1 for storing the data and the operation results of the vector operations performed by pipeline arithmetic operation units 101-0–101-n1, and vector length (VL) registers 122-0–122-n–1 for designating the vector lengths of the vector operations performed by pipeline arithmetic operation units 101-0–101-n–1. The selection control unit 107 comprises the selector 107 as shown in FIG. 18B.

The present embodiment differs from the previous embodiment in that it comprises n pipeline arithmetic operation units 101-0–101-n, and also n score boards 105, pipeline start signals PST, and arithmetic operation completion signals PEND to correspond to the number of the pipeline arithmetic operation units 101. Each of the pipeline arithmetic operation units 101-0–101-n–1 is provided with pipeline controllers 124-0–124-n–1. The vector register 105 has an interleave configuration comprising n banks to correspond to the number of the pipeline arithmetic operation units.

In the present embodiment, the instruction decoder 103 operation-controls pipeline arithmetic operation units 101-0–101-n–1 according to the state signal BUSY from the selection control unit 107. The operation is explained below by referring to the timing chart shown in FIG. 19B.

First, the instruction decoder 103 checks what the instruction uses among pipeline arithmetic operation units 101-i (i=0–n–1), selection-controls the selection control unit 107 according to the selection control signal ic1, and reads the state signal BUSY from score board 105-i corresponding to pipeline arithmetic operation unit 101-i to be used. If the read signal BUSY indicates the active state, then the instruction decoder 103 waits until it indicates the inactive state. If it indicates the inactive state, then pipeline start signal PSTi is made to indicate the active state corresponding to pipeline arithmetic operation unit 101-i.

If vector register 123-i detects that pipeline start signal PSTi indicates the active state, then it receives from the instruction decoder 103 a register number used in an arithmetic operation, and starts providing arithmetic operation pipeline 125-i with vector data. The vector register 105 has the interleave configuration comprising banks of the equal number to the number n of the pipeline arithmetic operation units. Therefore, data can be provided independently of each pipeline arithmetic operation unit.

The operation of pipeline controller 124-i is similar to that in the first embodiment. If the pipeline controller 124-i detects that pipeline start signal PSTi indicates the active state, then it performs the arithmetic operation control for the vector length VL, and makes arithmetic operation completion signal PENDi indicate the active state.

Figure 19B:
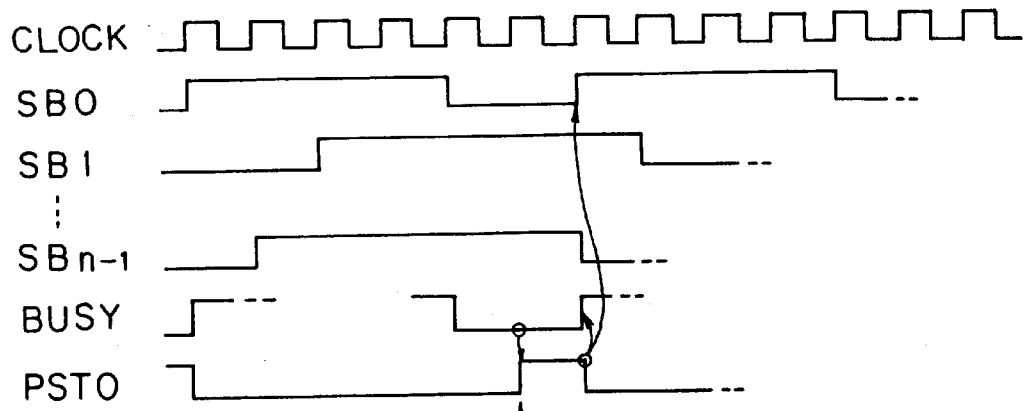
FIG. 19B shows a timing chart of the data processing device shown in FIG. 17A and FIG. 18A.

FIG. 19B is the timing chart of the operation according to the second embodiment centering on the pipeline arithmetic operation unit 101-0.

With the data processing device comprising a plurality of arithmetic operation units for performing an arithmetic operation pipeline process, the start timing of an instruction can be adjusted by the hardware. Additionally, the arithmetic operation pipeline process can be effectively controlled and managed independently of the variations in vector length.

FIG. 17 shows the configuration of the data processing device according to an embodiment of the present invention.

The present embodiment differs from the previous embodiment in that the present embodiment comprises a mode register 109 (FIG. 18B) for indicating whether n pipeline arithmetic operation units 101-0–101-n–1 are operated in the parallel mode in which they are operated in parallel, or whether they are operated in the test mode in which they are operated individually. Further, the present embodiment differs from the previous embodiment in that the selection control unit 107 has the configuration shown in FIG. 18B as its detailed structure.

That is, in FIG. 18B, the selection control unit 107 comprises the first selector 111 for selecting one of the outputs of score boards 105-0–105-n–1 according to the signal ic1 from the instruction decoder indicating the instruction type, and then outputting the selected output, the logical sum gate circuit 112 for obtaining the logical sum of the outputs of the score boards 105-0–105-n–1, and the second selector 113 for selecting any of the outputs of the first selector 111 and the logical sum gate circuit 112 according to signal ic2 indicating the type of an instruction from the instruction decoder 103 and mode signal mc from the mode register 109 and then outputting the selected output to the instruction decoder 103. The second selector 113 performs a selection operation with mode signal mc from the mode register assigned a higher priority.

Logical sum signal BUSYO generated according to the outputs of score boards 105-0–105-n–1 obtained through the logical sum gate circuit 112 indicates the active state if any of the pipeline arithmetic operation units 101-j (j=0–n–1) is being operated. In the second embodiment, score board 105-i corresponding to pipeline arithmetic operation unit 101-i to be used next is checked to control the timing at which pipeline start signal PSTi indicates the active state. If the second selector 113 selects signal BUSYO, and the selected signal is used as a state signal BUSY in controlling pipeline start signal PSTi, then the state signal BUSY indicates the active state when any of pipeline arithmetic operation units i-j is being operated. Thus, it retains the wait state without making pipeline start signal PSTi indicate the active state. That is, the state signal BUSY indicates the active state when all pipeline arithmetic operation units 101-0–101-n–1 have finished operation. Thus, pipeline start signal PSTi indicates the active state.

Figure 19C:
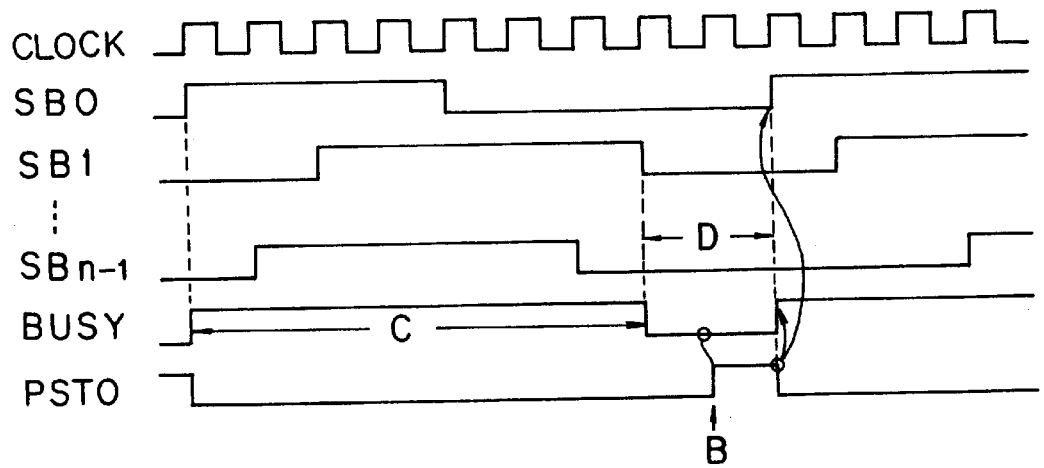
FIG. 19C shows a timing chart of the data processing device shown in FIG. 17A and FIG. 18B.

FIG. 19C is a timing chart according to which signal BUSYO is selected by the second selector 113 and is used as the state signal BUSY in controlling pipeline start signal PSTO. Since the state signal BUSY indicates the active state during the period C where any of the pipeline arithmetic operation units 101-j is being operated, pipeline start signal PSTO can be made to indicate the active state at timing B. If pipeline arithmetic operation units 101-0–101-n–1 are operating in parallel with the same configuration, pipeline start signal PSTO can be made to indicate the active state at timing A as shown by the timing chart shown in FIG. 19B.

Thus, pipeline arithmetic operation units 101-0–101-n–1 operating in parallel can be limited to one unit by outputting the logical sum of the outputs of score boards 105-0–105-n–1 as a state signal BUSY, thereby successfully synchronizing the parallel pipeline operation.

Therefore, if arithmetic operations should be controlled in a fixed order (for example, an addition is performed after a multiplication) in a sum-of-products operation, for example, or if a vector length should be modified after a series of instructions has been executed, then the second selector 113 operates such that signal BUSYO is selected according to selection control signal ic2.

At the activation of the data processing device, a single pipeline can be operated or a parallel operation can be performed by initializing the mode register 109.

For example, in conducting a program test, the arithmetic operation pipeline of each of the pipeline arithmetic operation units 101-0–101-n–1 can be checked in a step unit regardless of the type of instruction by setting the mode register 109 to the test mode. Thus, the arithmetic operation pipeline can be controlled and managed in detail.

As described above, the embodiments of the present invention comprise a state storage unit for storing the operation state of an arithmetic operation pipeline so that an instruction decoder can control the arithmetic operation pipeline of an arithmetic operation unit according to the information stored in the state storage unit. Therefore, the timing of starting an instruction can be adjusted by the hardware without adjusting the timing via software by executing excess instructions. Additionally, the present invention realizes a data processing device capable of efficiently controlling and managing an arithmetic operation pipeline regardless of the variations in the vector length.

Furthermore, the present embodiment comprises n state storage units for storing the operation states of the arithmetic operation pipelines of n arithmetic operation units so that an instruction decoder can control the arithmetic operation pipelines of n arithmetic operation units according to the information stored in the state storage units. Therefore, a data processing unit comprising a plurality of arithmetic operation units for performing the arithmetic operation pipeline process can efficiently control and manage the arithmetic operation unit regardless of the variations in the vector length by adjusting the timing of starting an instruction via hardware.

In the present embodiment, the first selector selects one of the outputs of n state storage units according to the signal indicating the type of instruction from the instruction decoder, the gate circuit obtains a logical sum of the outputs of n state storage units, the second selector selects one of either the output of the first selector or the output of the gate circuit according to the signal indicating the type of instruction from the instruction decoder, and the instruction decoder execution controls the arithmetic operation pipeline of the arithmetic operation unit according to the state signal. Therefore, if arithmetic operations should be controlled in a fixed order (for example, an addition is performed after a multiplication) in a sum-of-products operation, for example, or if a vector length should be modified after a series of instructions has been executed, then the second selector should select the output of the gate circuit. As a result, the present embodiment can provide a data processing device capable of efficiently controlling and managing an arithmetic operation pipeline in detail.

Furthermore, in the present embodiment, the second selector selects either the output of the first selector or the output of the gate circuit according to the signal indicating the type of an instruction from the instruction decoder and the mode signal indicating whether the arithmetic operation units are operated in the parallel mode or in the test mode in which they are operated individually, and outputs the selected signal as a state signal. The instruction decoder controls the arithmetic operation pipeline of the arithmetic operation unit according to the state signal. Accordingly, if a program test is conducted, for example, then the arithmetic operation pipeline of each of the pipeline arithmetic operation units can be checked in a step unit regardless of the type of instruction by setting the mode register to the test mode. Thus, the arithmetic operation pipeline can be controlled and managed in detail.

Figure 20A:
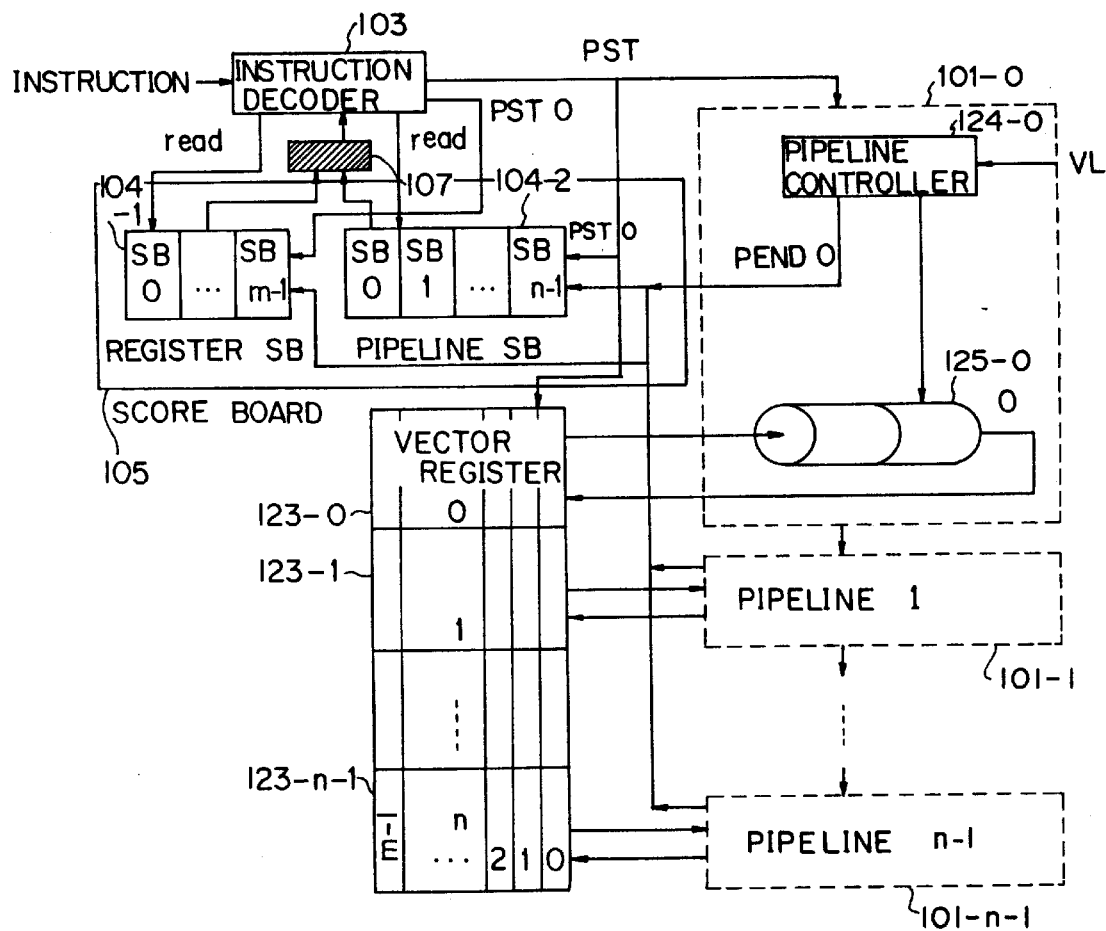
FIG. 20A shows a data processing device in which a score board and a vector register are shown in details.

FIG. 20A shows more detailed structure of the embodiment shown in FIG. 17. The score board 105 comprises register score board 104-1 and the pipeline score board 104-2. The pipeline score board 104-2 comprises portions SB0, SB1 . . . and SBn−1 which respectively represent the status of the pipelines unit 0 to n−1. The register score board 104-1 comprises portions SB0, SB1 . . . and SBm−1 which respectively represent registers 0 to m−1. The register score board 104-1 is shared by the vector register pipelines 0 to 3. When the pipeline 0 writes data in a register 0, portion SB0 of the register score board 104-1 is set to be busy. When two cycles pass after the pipeline 0 writes data in register 0, the busy state of the portion SB0 of the register score board 104-1 is cleared. Thus, when pipeline 1 reads data from the register 0, it first refers to the portion SB0 of the register score board 104-1. When portion SB0 of the register score board 104-1 is cleared, the pipeline 1 can read data from register 0. Therefore, the pipeline 0 . . . n−1 can use the registers 0 . . . m−1 in more flexible manner than previous pipelines by reducing a conflict of usage of the vector registers as much as possible by referring to the status of the register score board 104-1.

The embodiment shown in FIG. 20A is provided with the selector 107 and the pipeline score board 104-2 corresponding to pipeline score board 105 shown in FIG. 17. The selector 107 and the pipeline score board 104-2 operate in the same manner as in the embodiment shown in FIGS. 17 through 19C.

When both the register score board 104-1 and the pipeline score board 104-2 are cleared, the instruction decoder 103 produces the next pipeline start signal PST.

FIG. 20B shows a table designating a relation between a cycle and a pipeline with regard to banks 0 through 3, when the register 0 is considered. In FIGS. 20B through 20D four banks 0 through 3 corresponding to the vector register banks 123-0 through 123-3, for example, are shown.

The vector register banks, namely, 0 through 3 are used by pipelines 0 through 3 in an interleave manner such that the pipeline 0 uses the register 0 of the vector register bank at cycle 0 and the pipeline 1 uses the register 0 of the vector register bank 1 at cycle 0 and thereafter, the pipeline 0 and pipeline 1 use the register 0 of the vector register banks 1 and 2, respectively, at the next cycle 1. As shown in FIG. 20B, at cycle 0, the data of bank 0 is assigned to the pipeline 0 and the data of bank 1 is assigned to pipeline 1. Namely, the different banks are assigned to the different pipelines and thus the same register 0 can be used by two register banks 0 and 1 without causing data conflict. However, as shown in FIG. 20B, the write data of the pipeline 0 is written in the register 0 in the bank 1 at cycle 0 and the pipeline 1 reads the register 0 in the bank 1 at the same cycle 0, thereby causing the data conflict. In order to avoid this situation, the register score board 104-1 is used to show whether the same register 0 is being used or not. When the register score board 104-1 is referred to and the register 0 is not used, the data which was written into the register 0 by the previous operation by pipeline 0 is read from the register 0 by the current operation by pipeline 1. FIG. 20C shows an example of a storage of the data in the register 0. When the element numbers 0 through 7 of the data are to be stored in the register 0 as shown in FIG. 20C, the element numbers 0 through 7 of the data are stored in the register 0 in accordance with the banks 0 through 3 and the register address 0 through 7 as shown in FIG. 20D.

Figure 20E:
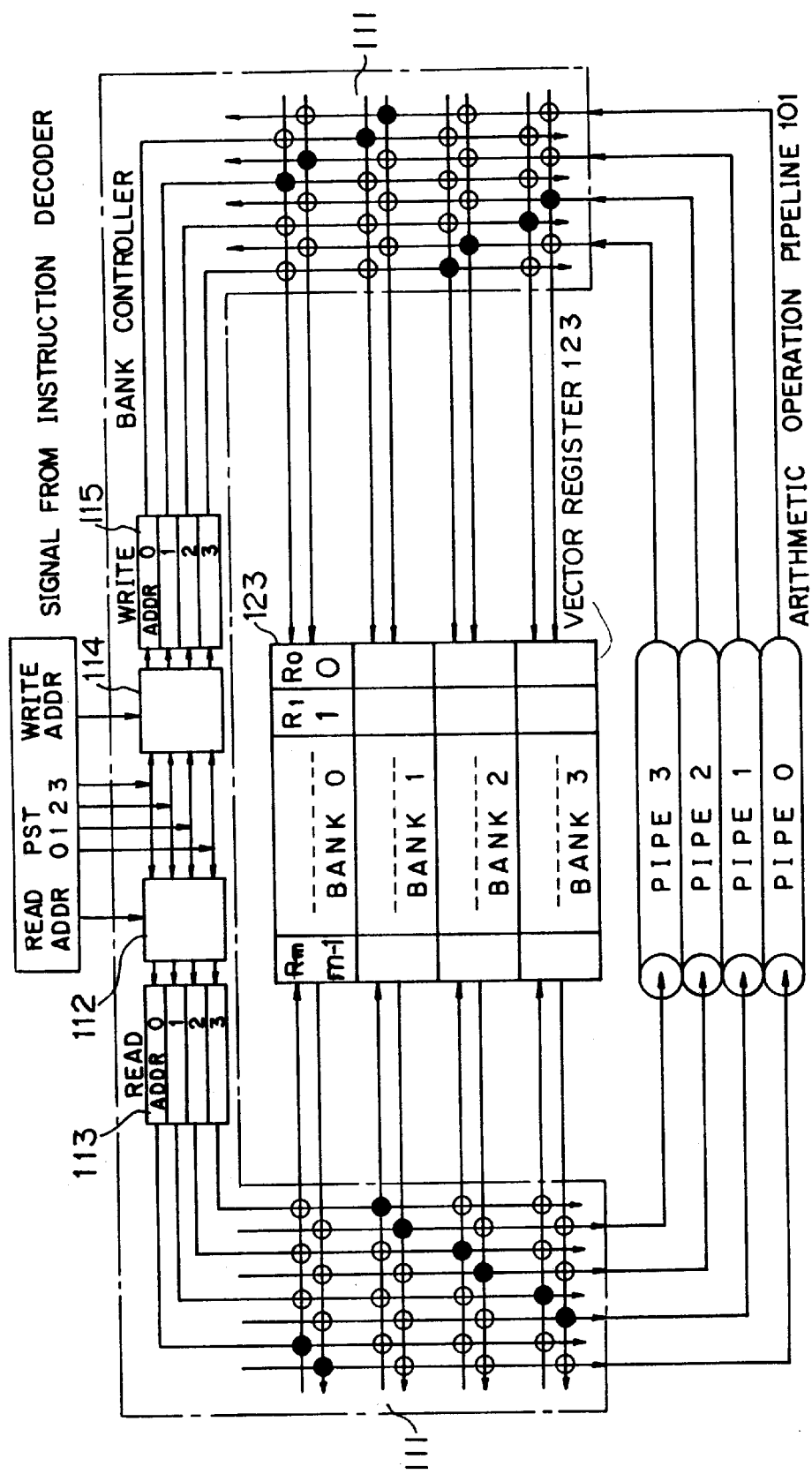
FIG. 20E shows a block diagram of a bank controller to explain an interleave operation of the banks of the vector register.

FIG. 20E shows a structure of a bank controller 110 associated with the register banks 0 through 3 and pipelines 0 through 3. The bank controller 110 controls a start timing of the instruction which uses the register of the vector register 123. A black circle shows a point at which the selector 111 is selected and a white circle shows a point at which the selector 111 is not selected. The status of the selector 111 corresponds to the cycle 0 of the corresponding table shown in FIG. 20B. The read address is inputted to a read selector 112. Then, the output of the selector 112 is stored in the read register number latch and counter 113 for pipelines 0 through 3, respectively. The read register number latch and counter 113 comprises a latch circuit for higher order addresses and a counter for lower order addresses. The read addresses designate the register 0, for example. When the PST0 and the read addresses for pipeline 0 come from the instruction decoder 103, the read address is stored in the portion for the pipeline 0 in the read register number latch and counter 113. Then, the read address is incremented by the counter to designate the element number, namely, the lower addresses in the register 0 so that the element numbers 0 through 7 stored in the banks 0 through 3 are sequentially accessed. At this time, the bank controller 110 switches a bank selector 111 (shown in FIG. 20F) as shown in the table shown in FIG. 20B so that the pipelines 0 through 3 can access the banks 0 through 3 sequentially. The result of the operation is written into the vector register 123 in accordance with the write address sent from the instruction decoder 103. Similarly, the write address is stored in a write register number latch and counter 115 through a write selector 114. The register bank comprises a RAM with one-port-write and two-port-read.

Figure 20F:
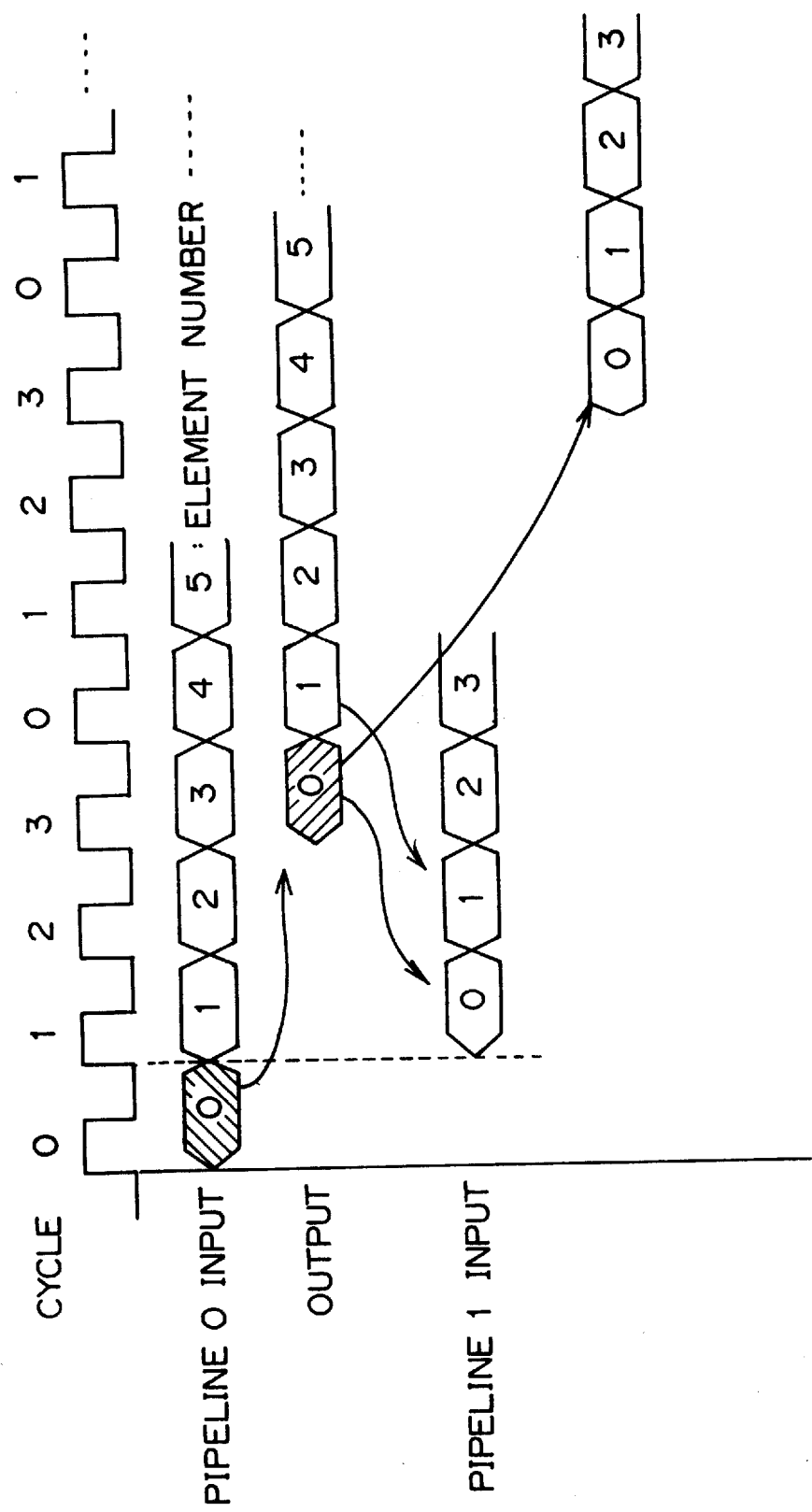
FIG. 20F shows a timing chart of a pipeline controller to designate when the register score board shown in FIG. 20A can be set or cleared.

FIG. 20F shows a pipeline control. At cycle 0, pipeline 0 inputs the data designated by element number 0. At cycle 3, the pipeline 0 outputs the data designated by element 0 with a delay of three clock cycles from the input of the element number 0. When the pipeline 1 inputs the data at cycle 1, the pipeline can not use the output of the pipeline 0. Thus, the start of the pipeline 1 is delayed up to the next cycle 3. The pipeline 1 can use the data designated by element number 0 outputted from the pipeline 0. When the pipeline 1 starts, the pipeline 0 can not complete the operation. However, the bit SB0 of the register score board 104-1, which corresponds to the register 0, is cleared two cycles after the pipeline 0 starts. The pipeline 1 can use the register 0 based on the cleared state of the bit SB0 of the register score board 104-1 without waiting for the end of the operation of the pipeline 0. Therefore, the pipeline can use the vector register 123 efficiently by using the register score board 104-1.

FIG. 20G shows a block diagram of a pipeline controller 124 shown in FIG. 20A. The vector length register 122-0 provides the vector length of the operation to be conducted by the pipeline 125-0 to the pipeline controller 124-0. The pipeline start signal PST is provided to a counter 124-01 to enable the counter 124-01 to start a counting operation and the value of the counter 124-01 is compared with the vector length outputted from the vector length register 122-0 at comparing unit 124-02. When the value of the counter 124-01 reaches the vector length stored in the vector length register 122-0, the comparing unit 124-02 outputs the pipeline end signal PEND-P for clearing the pipeline score board 104-2. A time at which the pipeline end signal PEND-R for clearing the register score board 104-1 is outputted from comparing unit 124-03 is determined by the delay of the pipeline 125-0. The delay of the pipeline 125-0 is determined by the value of the counter 124-01, after the value of the counter 124-01 is compared with the value corresponding to the delay of the pipeline 125-0. The delay of the pipeline 125-0 is determined by the number of pipeline cycles required from when the pipeline starts to when the portion of the register score board 104-1 corresponding to the pipeline should be cleared. This delay of the pipeline 125-0 is two clock cycles in the embodiment shown in FIG. 20F. A comparing unit 124-04 of the pipeline controller 124-0 sends a write control signal to the vector register 123 after a three clock cycle delays from when data is read from the vector register 123 into arithmetic operation pipeline 125-0 to when the data is outputted from the pipeline 125-0 after a completion of an execution of the arithmetic operation. The pipeline end signal PEND shown in FIGS. 16 and 17 comprises signals PEND-P and PEND-R. The pipeline controller 124-0 also sends an input latch control signal to control an input from the vector register 123 into the arithmetic operation pipeline 125-0.

Figure 21:
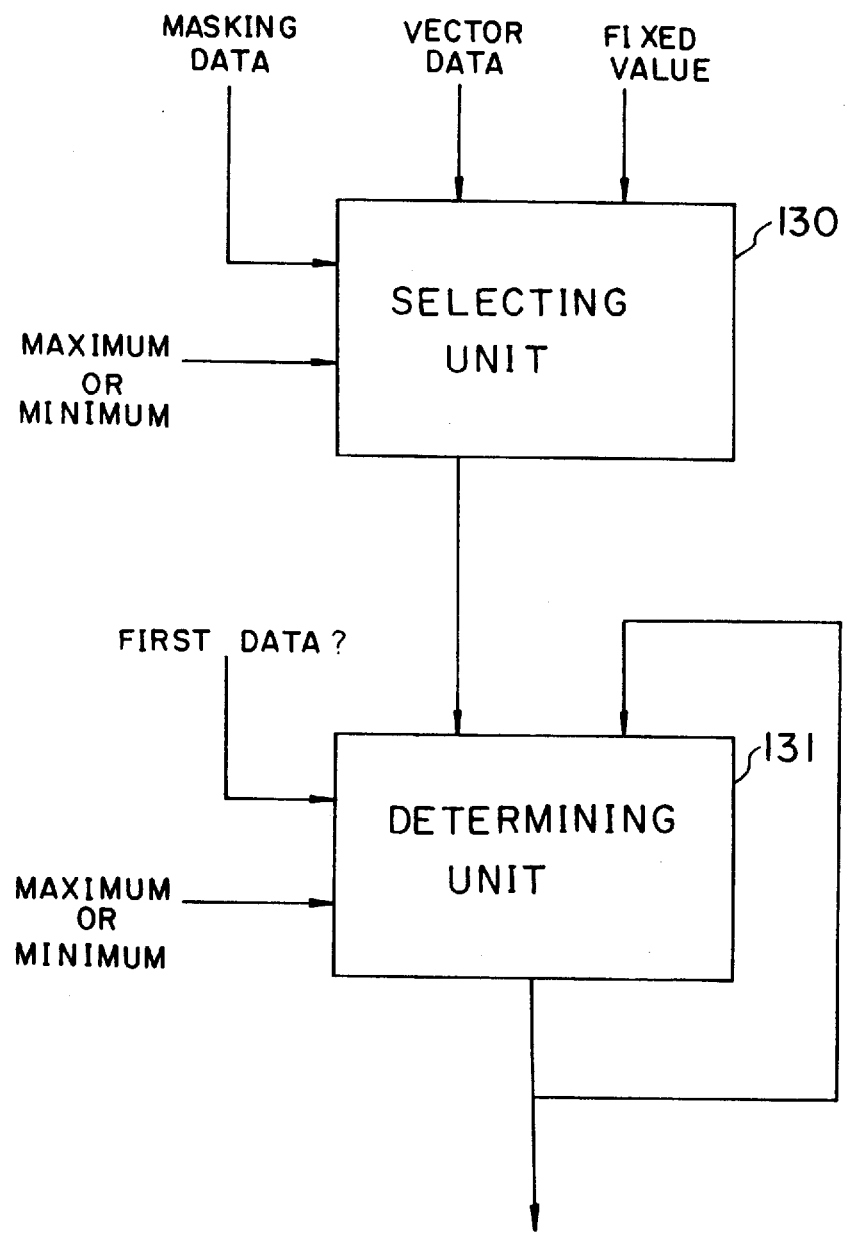
FIG. 21 shows a block diagram of a principle of an arithmetic operation device for obtaining the maximum value and minimum value according to the present invention.

As shown by a principle of the present invention shown in FIG. 21, the arithmetic operation unit calculates the maximum or the minimum value of predetermined data according to the data and the masking data for the data. The arithmetic operation unit comprises a selecting unit 130 and a determining unit 131. The selecting unit 130 selects and outputs either fixed value data determined depending on whether an arithmetic operation obtains the maximum value or the minimum value according to the above-described masking data, or the above-described predetermined data. The determining unit 131 outputs an output value from the selecting unit 130 as is when it is the first element. When the output value from the selecting unit 130 is an element other than the first element, the determining unit 131 determines which is larger, the output value or the previously outputted value, depending on whether the arithmetic operation obtains the maximum value or the minimum value.

According to the feature of the present invention, a latch circuit for storing the masking information can be omitted by limiting the application of masking data only to currently inputted predetermined data. Thus, the configuration of a selector, etc. operated according to the masking information can be prevented from becoming complicated.

That is, the circuit configuration of the unit for detecting the maximum value and the minimum value of masked vector data can be simplified.

Figure 22:
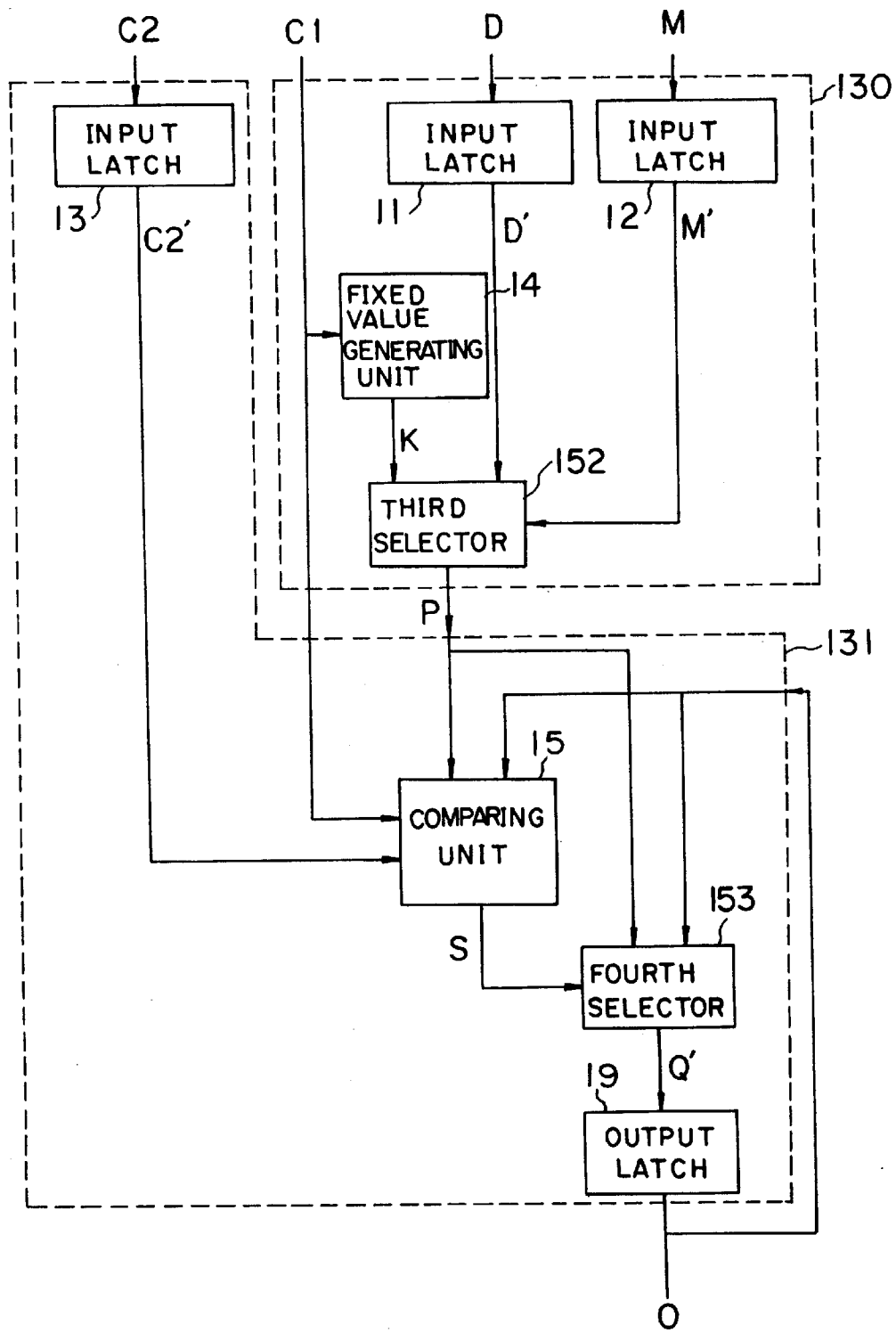
FIG. 22 shows a block diagram of an embodiment of the arithmetic operation device shown in FIG. 21.

FIG. 22 shows an embodiment of the arithmetic operation unit according to the present embodiment, and is a block diagram showing the general configuration of the arithmetic operation unit of the present embodiment. First, the configuration is described.

Figure 3:
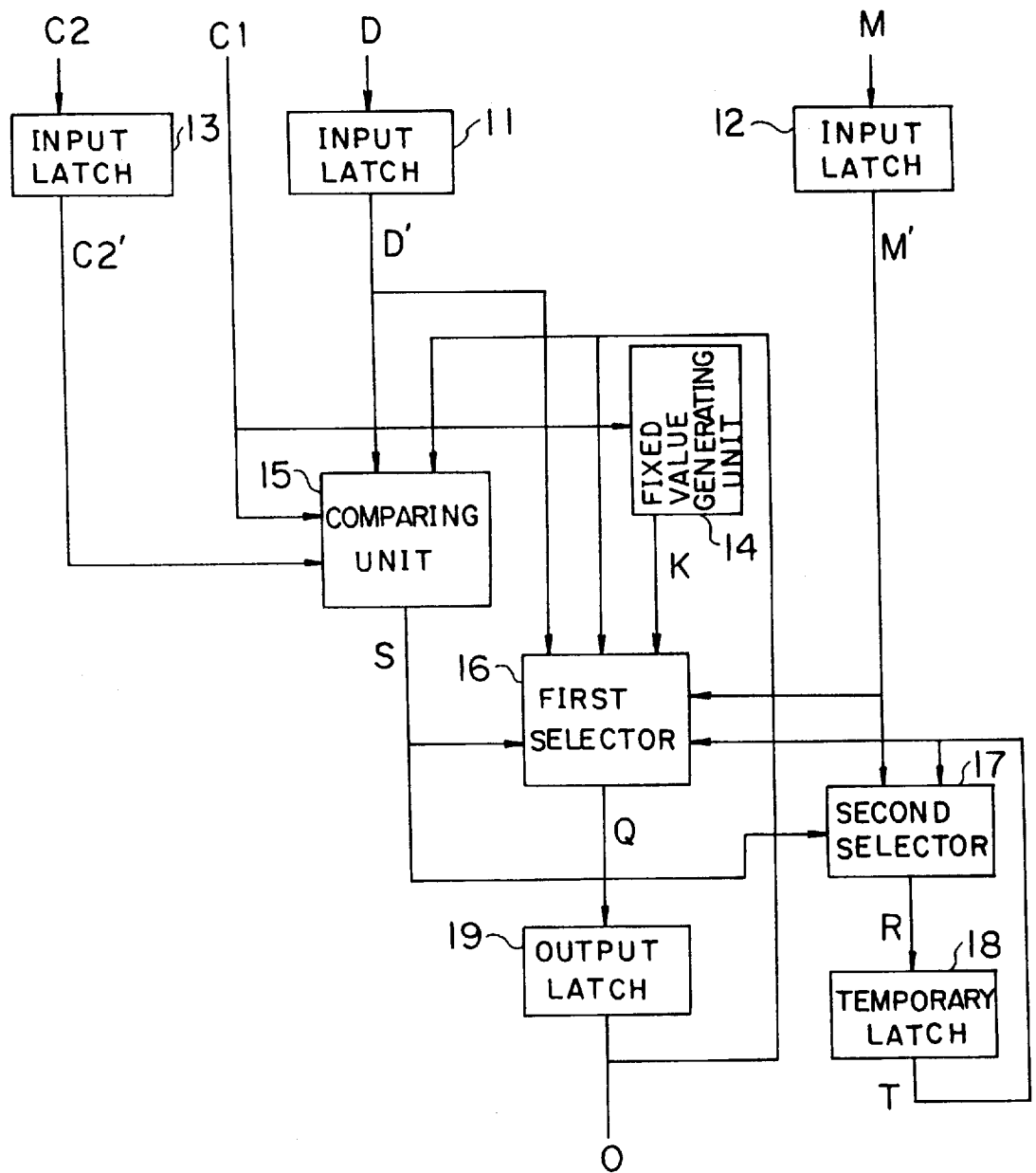
FIG. 3 shows a block diagram of an arithmetic operation device used for data and masked data.
Figure 4:
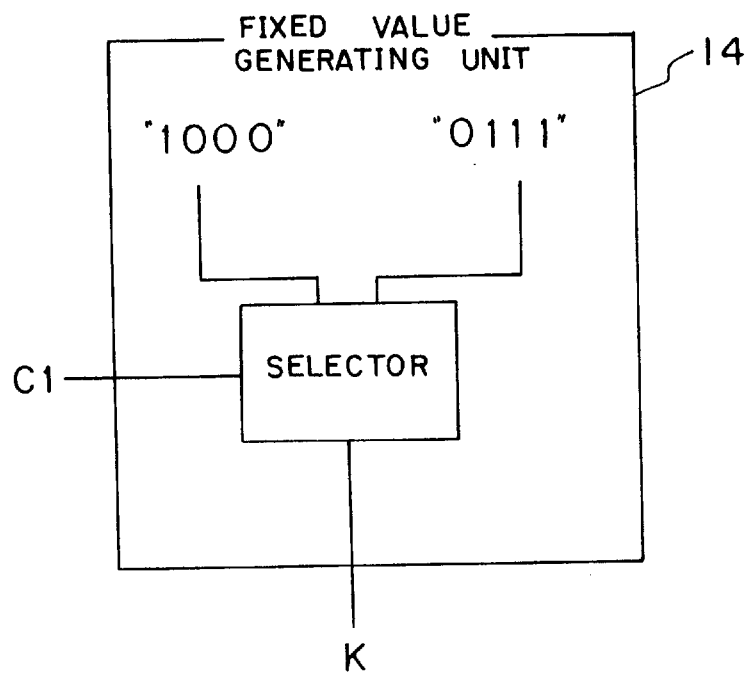
FIGS. 4A and 4B respectively show a configuration and an operation of a fixed value generating unit shown in FIG. 3.
Figures 5A, 5B:
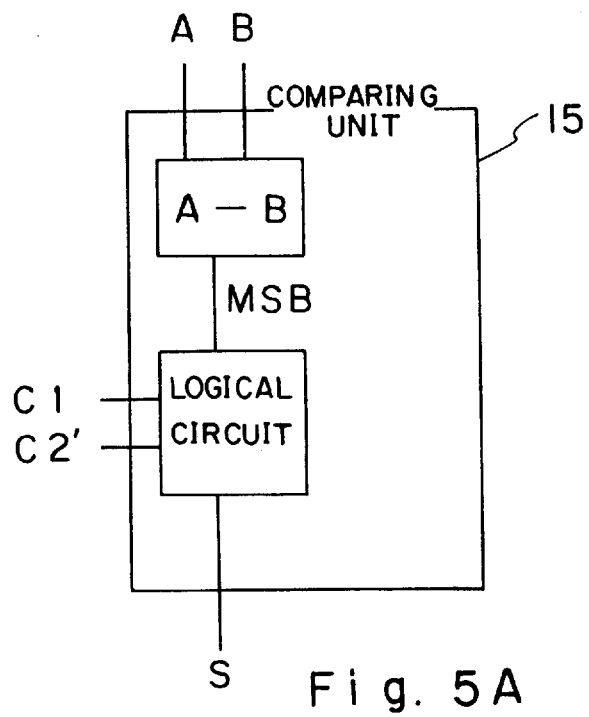
FIGS. 5A and 5B respectively show a configuration and an operation of a comparing unit shown in FIG. 3.
Figures 6A, 6B:
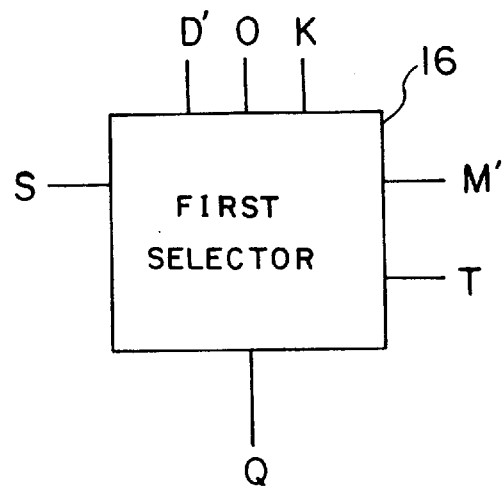
FIGS. 6A and 6B respectively show a configuration and an operation of a first selector shown in FIG. 3.
Figures 7A, 7B:
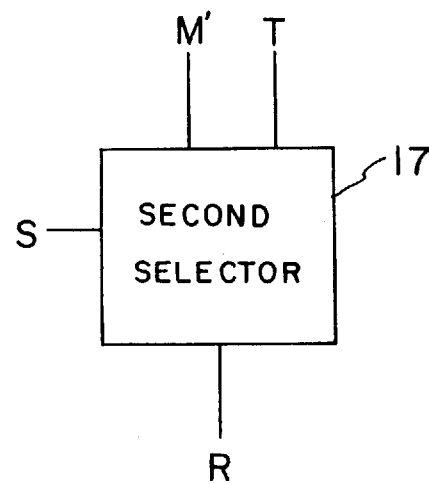
FIGS. 7A and 7B respectively show a configuration and an operation of a second selector shown in FIG. 3.

Some units commonly appear and have common corresponding reference numbers assigned in FIG. 22 and FIG. 21 showing the block diagram for explaining the principle of the present embodiment, and FIGS. 3 through 5 showing the views for explaining the related art.

The arithmetic operation unit of the present embodiment comprises the selecting unit 130 comprising the input latches 11 and 12, the fixed value generating unit 14, and a third selector 152, and a determining unit 131 comprising the input latch 13, the comparing unit 15, a fourth selector 153, and the output latch 19.

In FIG. 22, P indicates the output signal of the third selector 152, and Q' indicates the output signal of the fourth selector 153.

Figures 23A, 23B:
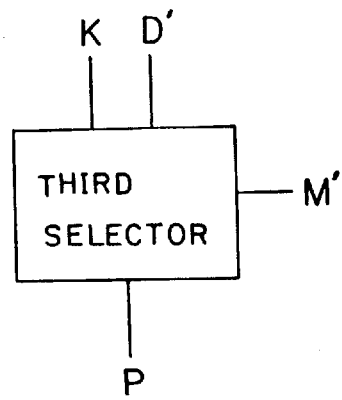
FIG. 23A and FIG. 23B respectively show explanatory views of a configuration and an operation of a third selector shown in FIG. 22.

The third selector 152 selects either the output signal D' of the input latch 11 or the output signal K of the fixed value generating unit 14 according to the output signal M' (a mask signal for the present data) as shown in FIG. 23A. In detail, as shown in FIG. 23B, the present input D' is selected and outputted "as is" as the output signal P if it is not masked, and the output K of the fixed value generating unit 144 is selected and outputted as the output signal P if it is masked (M'="1").

Figures 24A, 24B:
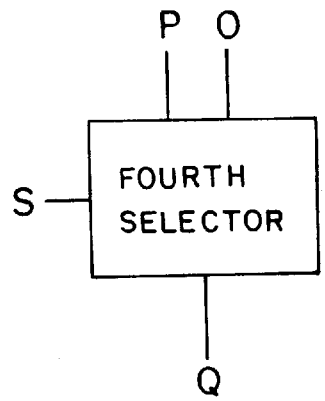
FIG. 24A and FIG. 24B respectively show a configuration and an operation of a fourth selector shown in FIG. 22.

As shown in FIG. 24A, the fourth selector 153 selects either the output signal P (for the present data) of the third selector 152 or the output signal O (for the previous data) of the output latch 149 according to the output signal S of the comparing unit 145. As shown in FIG. 24B, Q=P is selected when S="0", while Q=0 is selected when S="1".

The operation is explained next.

First, vector data and masking data are respectively read from a vector register 67 and a mask register 68 according to the instruction from a command buffer unit 62. The vector data and mask data are transferred, respectively, as signals D and M to an arithmetic operation circuit in the present embodiment, and latched by the input latches 11 and 12.

Then, the third selector 152 selects input data and a fixed value according to the value of an output signal M' from the input latch 12.

If the maximum value is detected, the value is compared as the minimum value if the vector data, that is, the input data, are masked. Therefore, a large input value can be ignored.

Next, according to the output signal S of the comparing unit 15, the fourth selector 153 selects the input data (a fixed value if masked) and either the maximum or the minimum value. Thus, the maximum or the minimum value of all inputted vector data is selected.

The output Q' of the fourth selector 153 is latched by an output latch 19 and transferred to the comparing unit 15 and an external unit as an output O.

Thus, the present embodiment can eliminate excess latch circuits for storing mask information, thereby reducing the number of elements over a circuit.

Therefore, the scale of the circuit for performing arithmetic operations to obtain the maximum or minimum value of masked vector data can be reduced.

In the above described embodiment, the data used in arithmetic operations are explained as the data represented by twos complement. Obviously, the data are not limited to these values, but can be data with a floating decimal point or data of any bit length as actual data.

Figure 25:
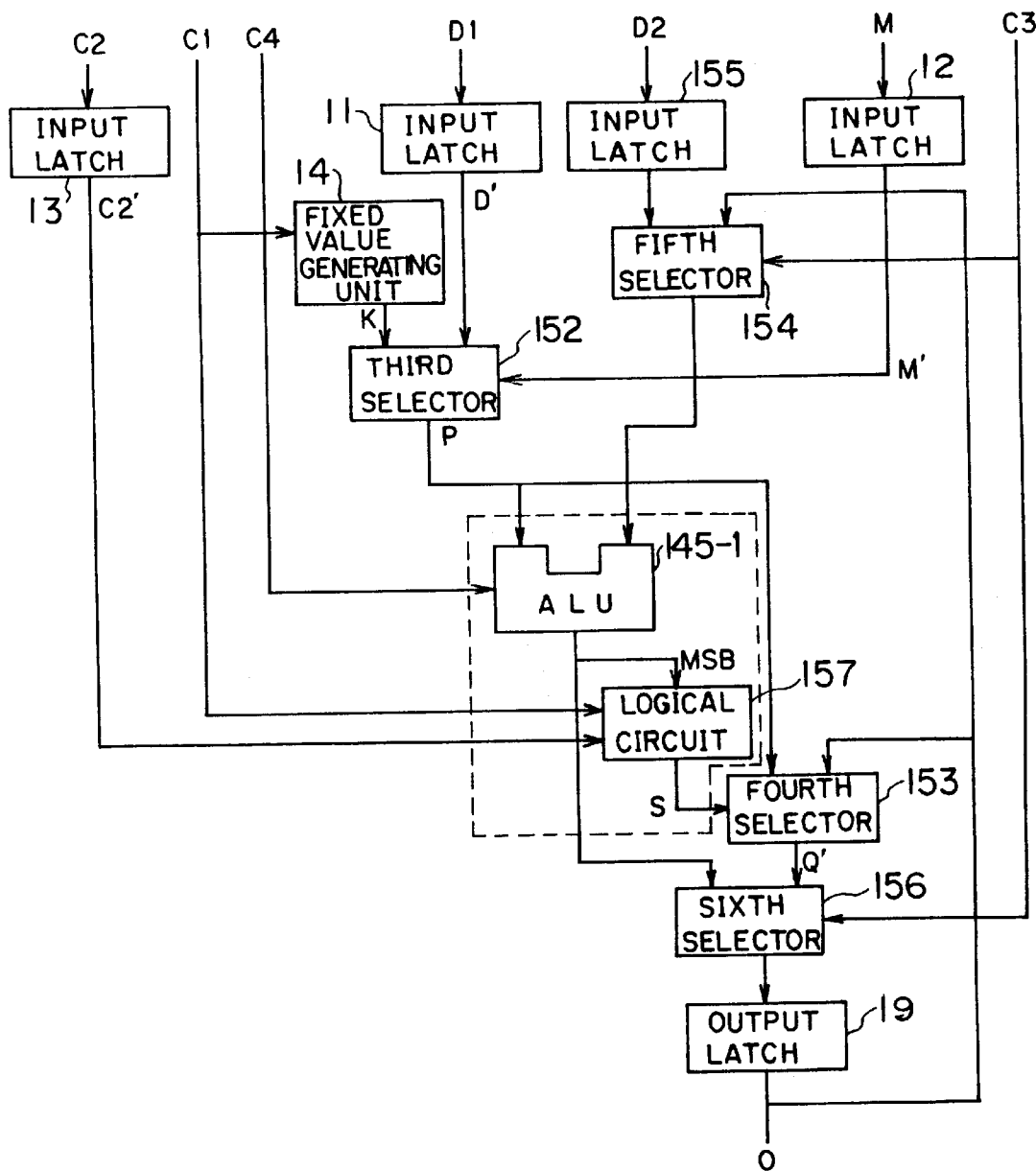
FIG. 25 shows a block diagram representing a relation between a circuit for obtaining the maximum and minimum value and an adder circuit.

FIG. 25 shows a relationship between the circuit shown in FIG. 22 and an adder circuit. The circuit shown in FIG. 22 is provided in the adder of for the adding arithmetic operation unit, namely, vector pipeline 66 shown in FIG. 15A. When the control signal C3 is 0, adding and subtracting instruction is executed during the period of mask signal=0, the mask signal being sent from the mask register 68 shown in FIG. 15A. When the control signal C3 is 1, an instruction for detecting the maximum value and minimum value is executed, as already explained by referring to FIG. 22. When the control signal C4 is 0, an ALU 145-1 executes an adding operation in accordance with an add instruction. When the control signal C4 is 1, the ALU 145-1 executes a subtraction operation in accordance with the subtraction instruction or the instruction for detecting the maximum value and the minimum value. When the control signal C3 is 0, the fifth selector 154 receives the data D2 through an input latch 155. The ALU 145-1 executes the adding or subtracting operation with regards to the data D1 and the data D2. When the control signal C1 is 1, the fifth selector 154 outputs the data from the output latch 19. The ALU 145-1 compares the output from the third selector 152 with the output from the fifth selector 154 to obtain the maximum value or the minimum value. When the control signal C3 is 0, the sixth selector 156 outputs the signal from the ALU 145-1 to provide the sum or the difference obtained in accordance with the add or the subtraction instruction. When the control signal C3 is 1, the sixth selector 156 outputs the signal Q' from the fourth selector 153 to provide the maximum value or the minimum value in accordance with the signal outputted from a logical circuit 157. The logical circuit 157 receives MSB of the output from the ALU 145-1 to designate the comparison result between the output P from third selector 152 and the output from the fifth selector 154. The logical circuit 157 provides the output S in accordance with the MSB depending on C1=1 or 0, when C2=0. It provides the output S=0 regardless of the value of C1, where C2=1. Therefore, the circuit shown in FIG. 25 performs the adding or subtracting arithmetic operation in addition to the detection of the maximum value and the minimum value in accordance with the status of the control signal C3. Therefore it becomes clear that the circuit shown in FIG. 22 is provided in the adder pipeline unit in which the ALU 145-1 is included.

In the present embodiment, the number of latch circuits for storing mask information can be reduced by applying masking data only to predetermined data inputted at present. Accordingly, the configuration of a selector, etc. operating based on the mask information can be prevented from being complicated.

Therefore, the circuit configuration of a unit for detecting the maximum and minimum values of masked vector data can be simplified.

Figure 26:
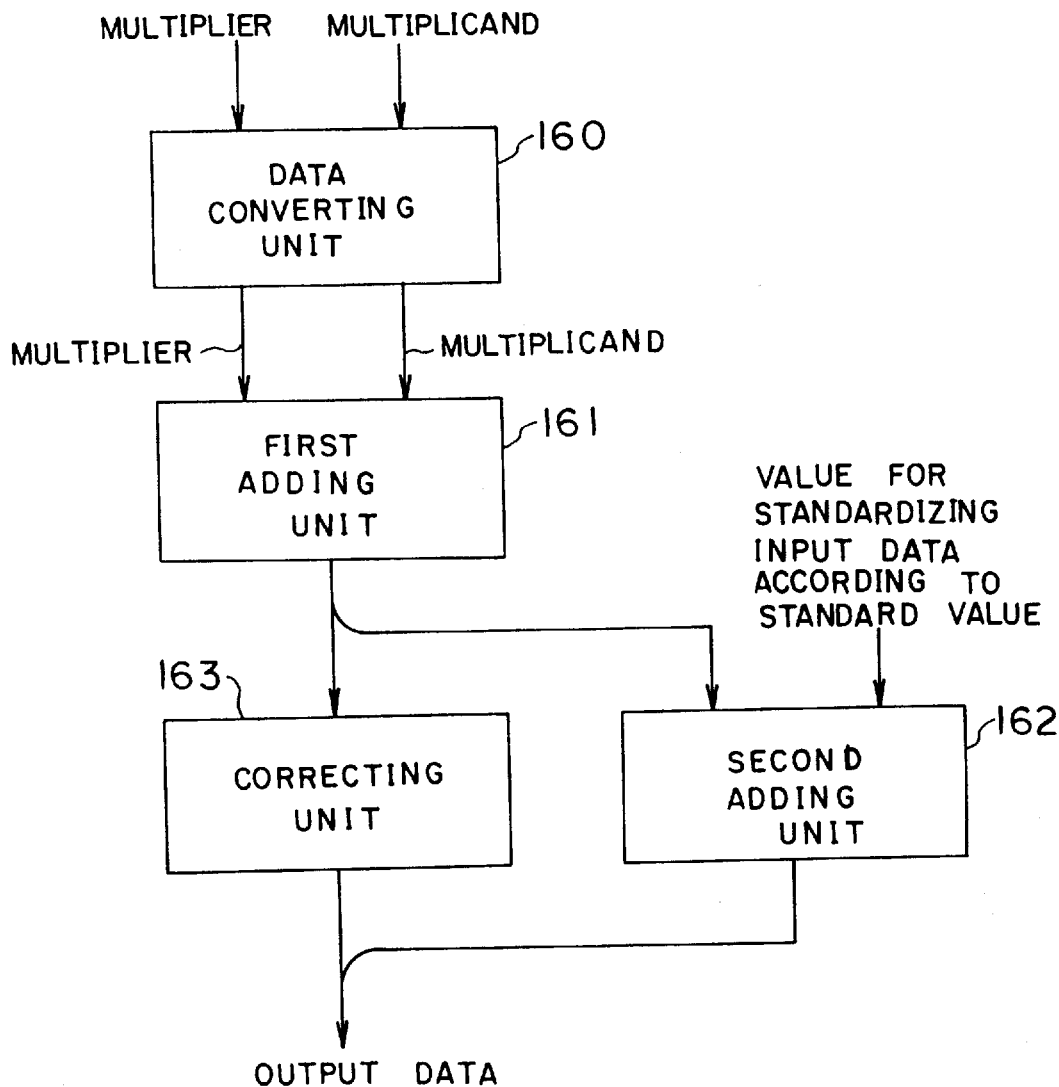
FIG. 26 shows a block diagram of a principle of a multiplier according to the present invention.

FIG. 26 shows a block diagram of a multiplier of the present embodiment while the multiplier is used to the arithmetic operation pipeline unit 66 in the vector processor unit.

In FIG. 26, a data converting unit 160 outputs an input as is when the input refers to exponential part data of a multiplier and a multiplicand in double-precision data with a floating decimal point. When the input refers to exponential part data of a multiplier and a multiplicand in single-precision data with a floating decimal point, the number of digits is aligned to that of exponential part data of a multiplier and a multiplicand in double-precision data with a floating decimal point.

A first adding unit 161 receives the outputs of the data converting unit 160 and adds and outputs them.

A correcting unit 163 receives the data of a predetermined number of lower order digits of the output of the first adding unit. The correcting unit 163 outputs the input as is if the input refers to exponential part data in double-precision with a floating decimal point. The correcting unit 163 corrects a predetermined number of digits of data if the input refers to exponential part data in single-precision with a floating decimal point, and then outputs the result.

A second adding unit 162 performs an addition and subtraction on the predetermined number of high order digits of data outputted by the first adding unit and the value for standardizing the input data with a standard value, and then outputs the result.

In FIG. 26, a data converting unit 160 outputs an input as is when the input refers to exponential part data of a multiplier and a multiplicand in double-precision data with a floating decimal point. When the input refers to exponential part data of a multiplier and a multiplicand in single-precision data with a floating decimal point, the number of digits is aligned to that of exponential part data of a multiplier and a multiplicand in double-precision data with a floating decimal point.

The first adding unit 161 receives the output of the data converting unit 160, and adds and outputs the exponential part data of a multiplier and a multiplicand.

When single-precision data with a floating decimal point is processed, the correcting unit 163 corrects data of a predetermined number of digits of the data outputted by the first adding unit, and then outputs the result.

When double-precision data with a floating decimal point are processed in an arithmetic operation, the second adding unit performs an addition and subtraction on the predetermined number of high order digits of data outputted by the first adding unit and the value for standardizing the input data with a standard value, and then outputs the result.

As a result, when double-precision data with a floating decimal point are processed, since the data converting unit 160 aligns the number of digits of the exponential part data to that of the exponential part of double-precision data with a floating decimal point and outputs the result, the circuit can be easily configured and the number of gates can be reduced.

When double-precision data with a floating decimal point are processed, the second adding unit performs an addition and subtraction on the predetermined number of high order digits of data outputted by the first adding unit 161 and the value for standardizing the input data with a standard value, and then outputs the result. Therefore, the circuit can be designed in a small scale, the number of gates can be reduced, and the delay time of data can be greatly shortened.

Figure 27:
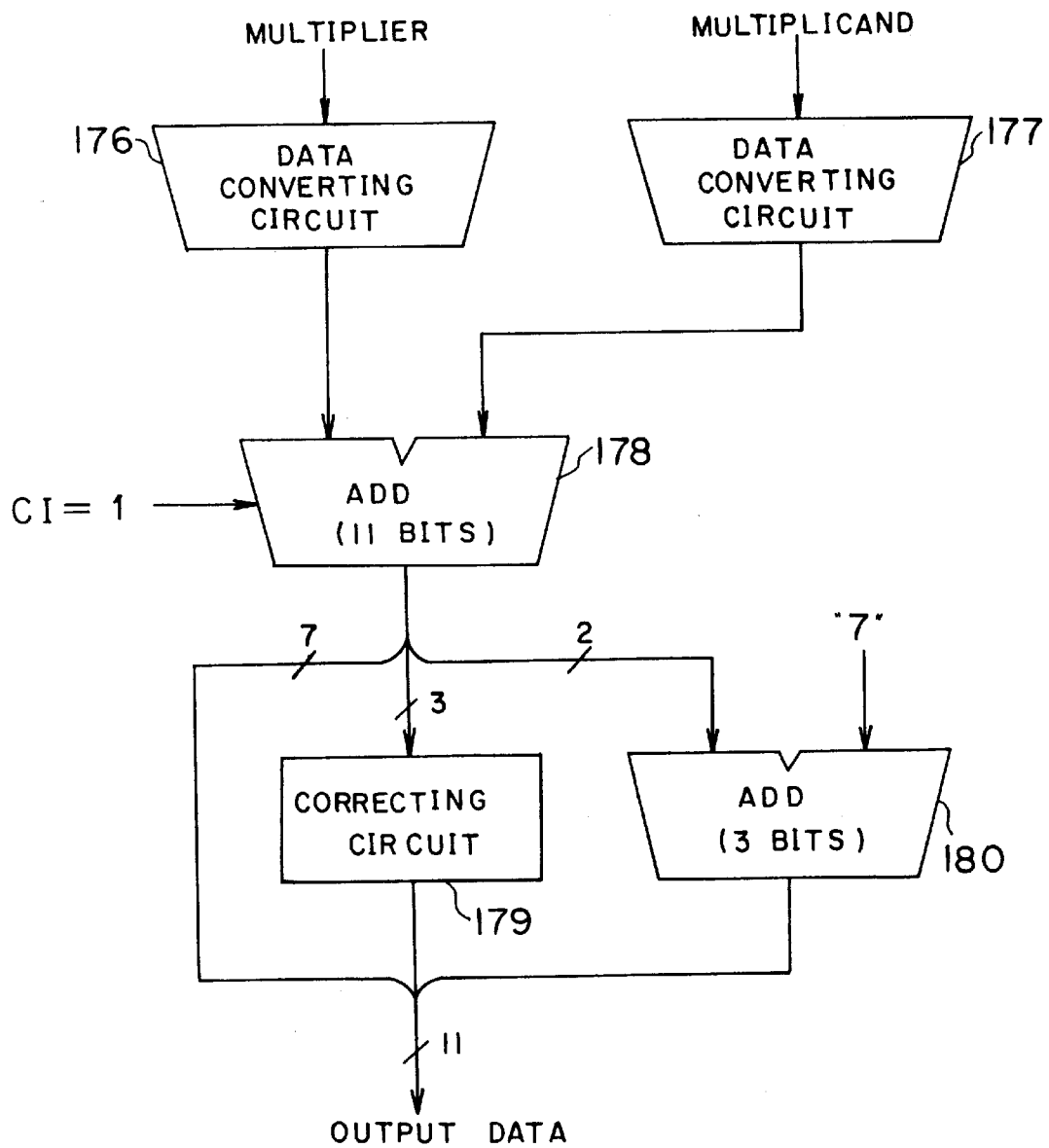
FIG. 27 shows a block diagram of an embodiment of an arithmetic operation processing circuit for the exponential part data in the multiplier shown in FIG. 26.

FIG. 27 is a block diagram for explaining the configuration of the arithmetic operation circuit for processing the data in the exponent part according to an embodiment of the present embodiment.

Figure 28A:
FIG. 28A shows an explanatory view of an operation of a data converting unit according to the present invention where e7=0 for floating point single precision.
Figure 28B:
FIG. 28B shows an explanatory view of an operation of a data converting unit according to the present invention where e7=1 for floating point single precision.

FIG. 28A and FIG. 28B show the operation of the data converting circuit of the embodiment of the present embodiment.

Figure 29:
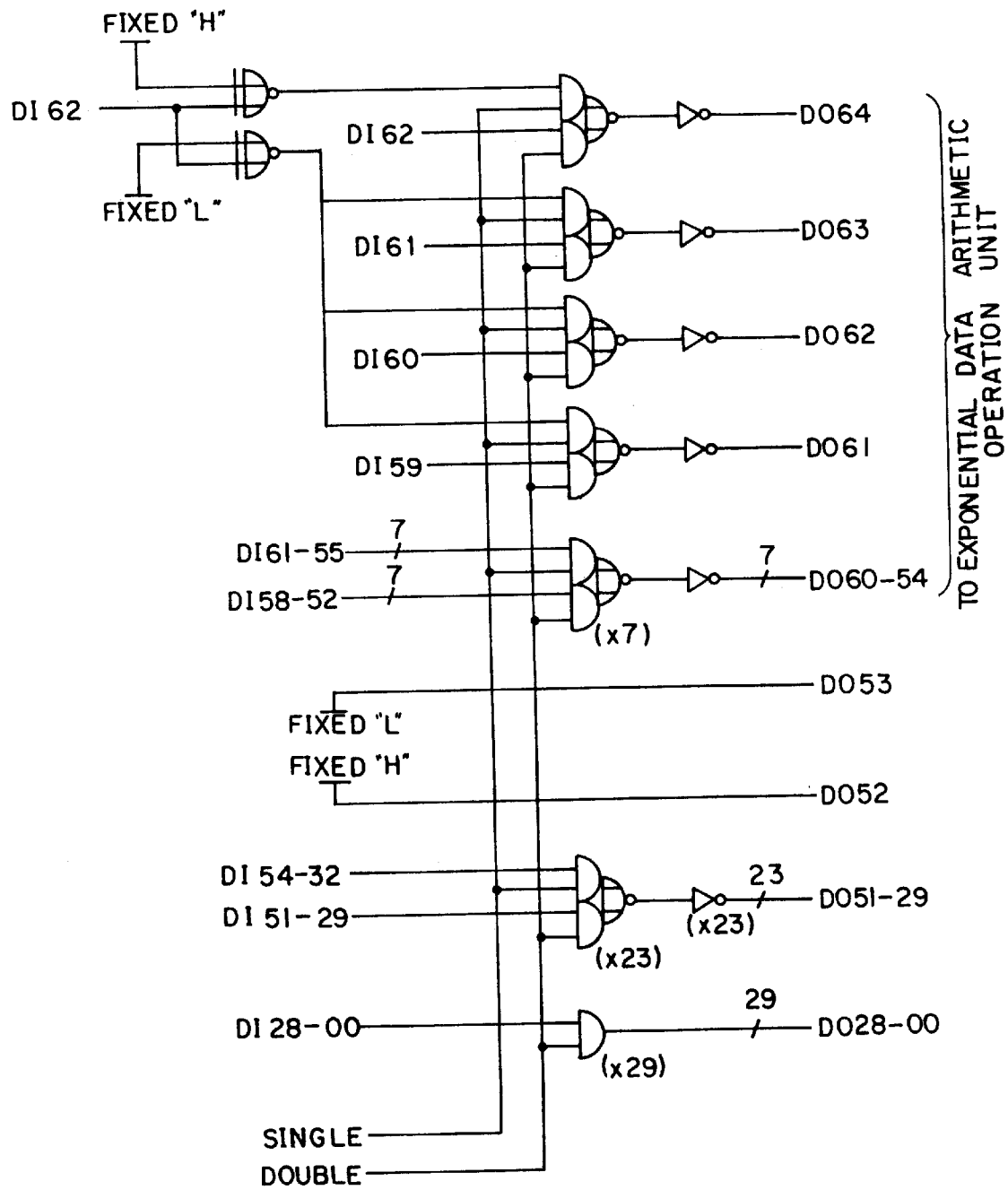
FIG. 29 shows a detailed circuit diagram of a data converting unit shown in FIG. 27 according to the present invention.

FIG. 29 shows a circuit diagram of a data converting circuit.

Figures 30A, 30B:
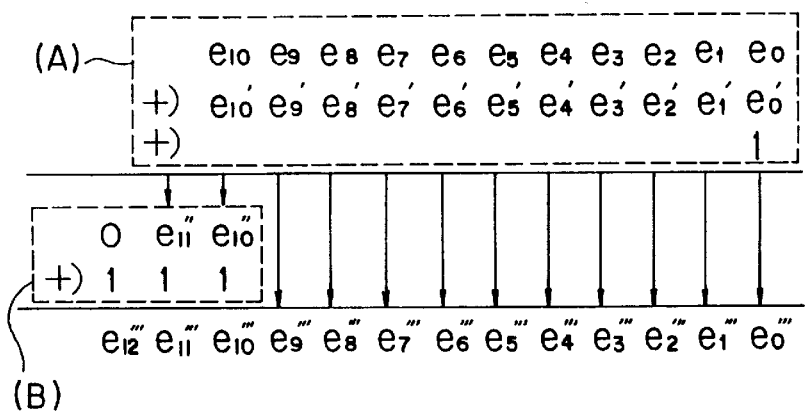
FIG. 30A shows an operation of an adder used in a multiplier shown in FIG. 27.
FIG. 30B shows a simplification of an equation shown in FIG. 30A.

FIG. 30A shows the operation of the adder (ADD) of the embodiment of the present embodiment.

FIG. 30B shows the simplified representation for the equation shown in FIG. 30A.

Figure 31:
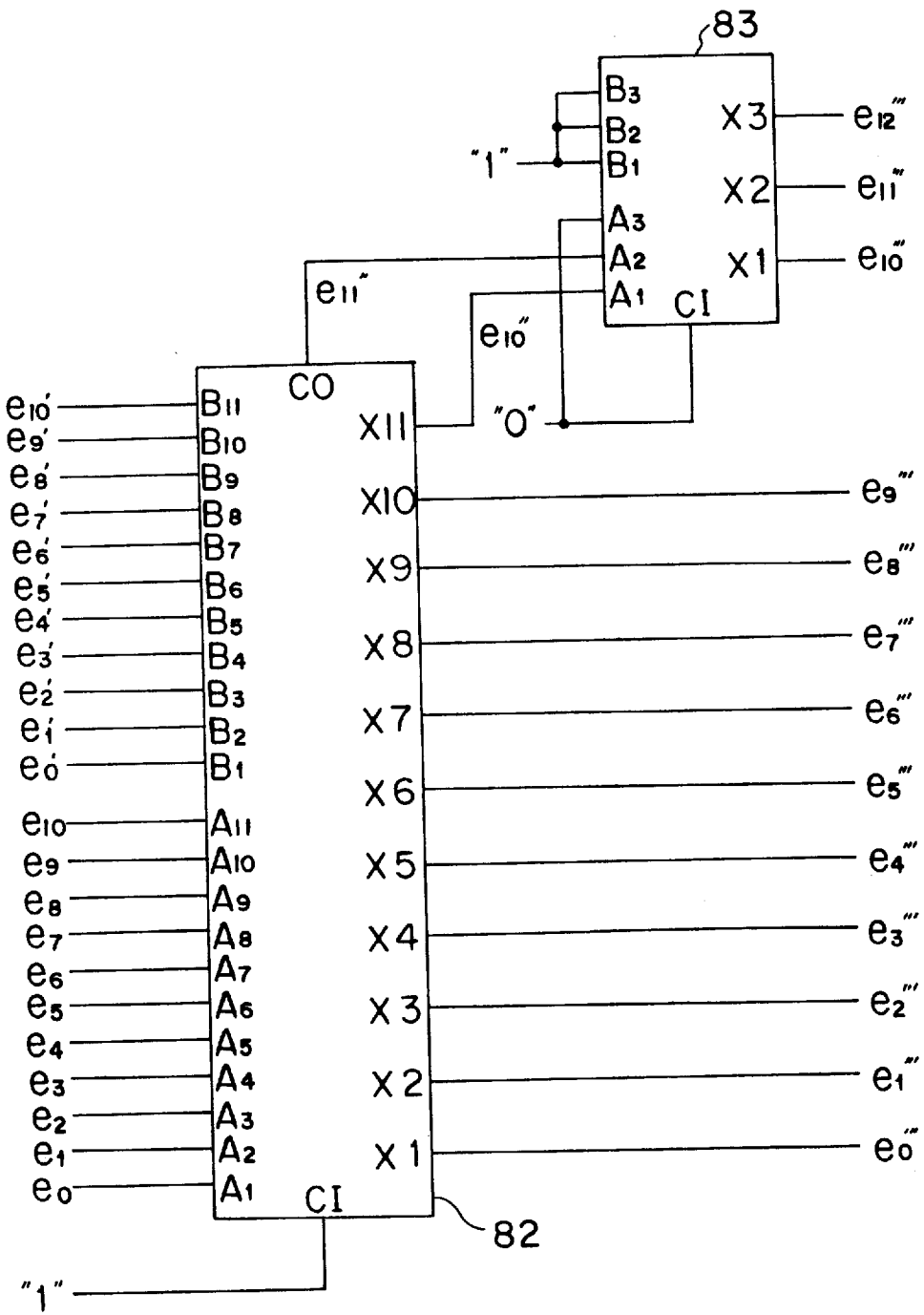
FIG. 31 shows a circuit diagram configured based on FIG. 30B.

FIG. 31 shows the circuit configured based on FIG. 30A and 30B.

Figure 32:
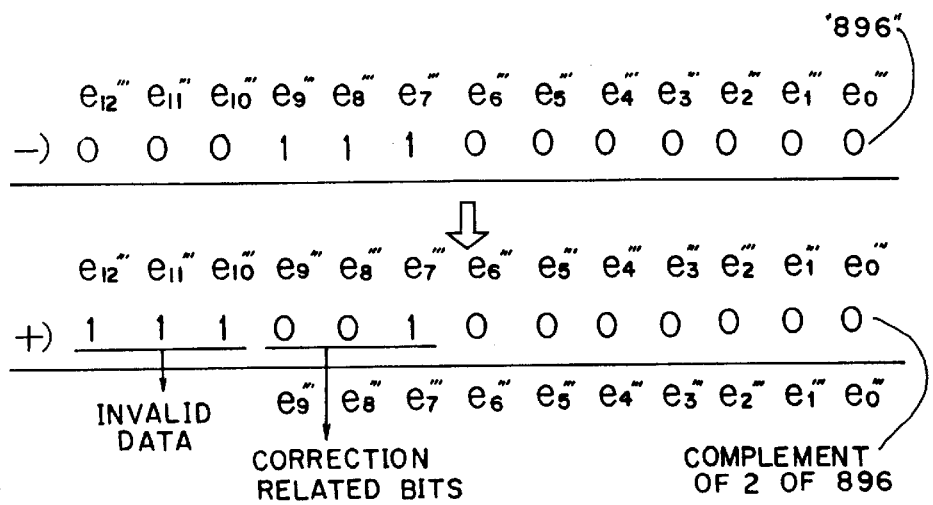
FIG. 32 shows a data processing method for use in a correction circuit used in a multiplier shown in FIG. 27 according to the present invention.
Figure 8A:
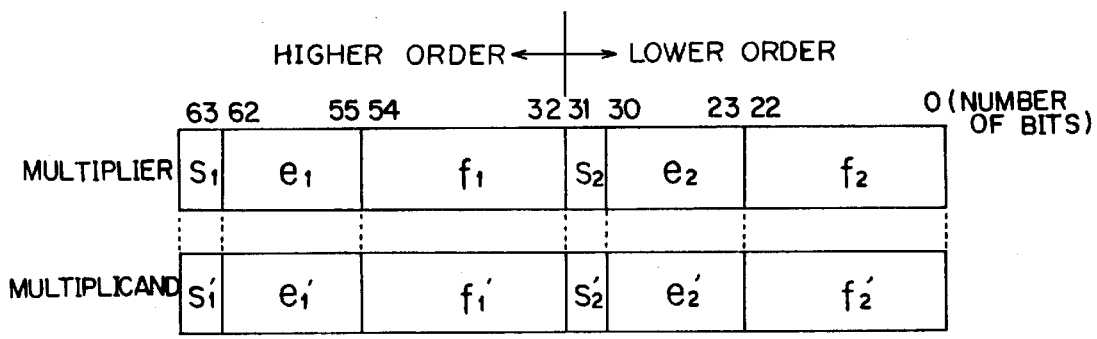
FIG. 8A shows an example of a data format for a floating point single precision.
Figure 8B:
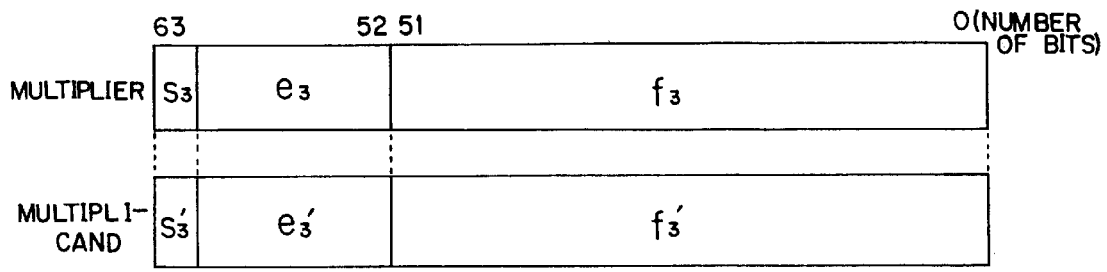
FIG. 8B shows an example of a data format for a floating point double precision.
Figure 9:
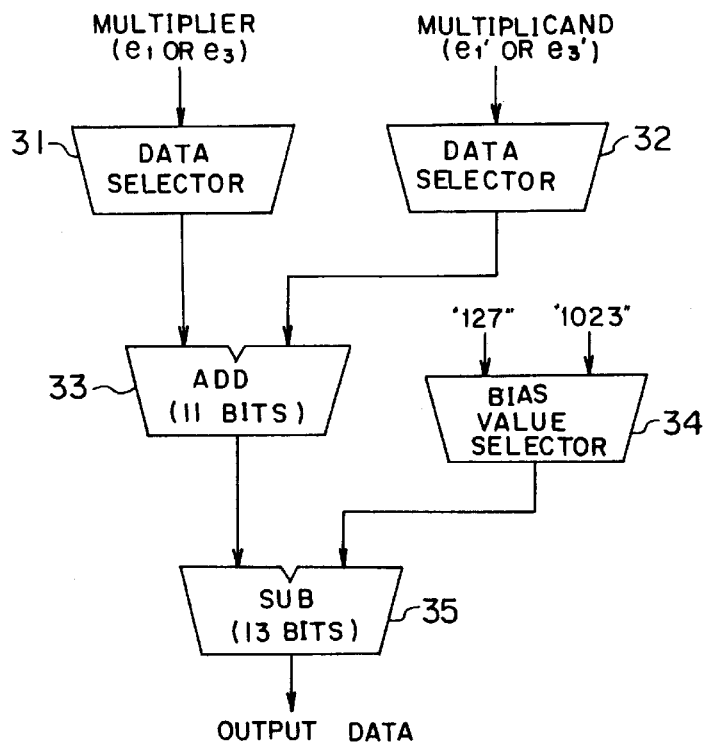
FIG. 9 shows a block diagram of a related art of arithmetic operation processing circuit for exponential part data when a multiplier is operated.

FIG. 32 shows a method of processing data for the correcting circuit according to the present embodiment shown in FIG. 31.

Figure 33:
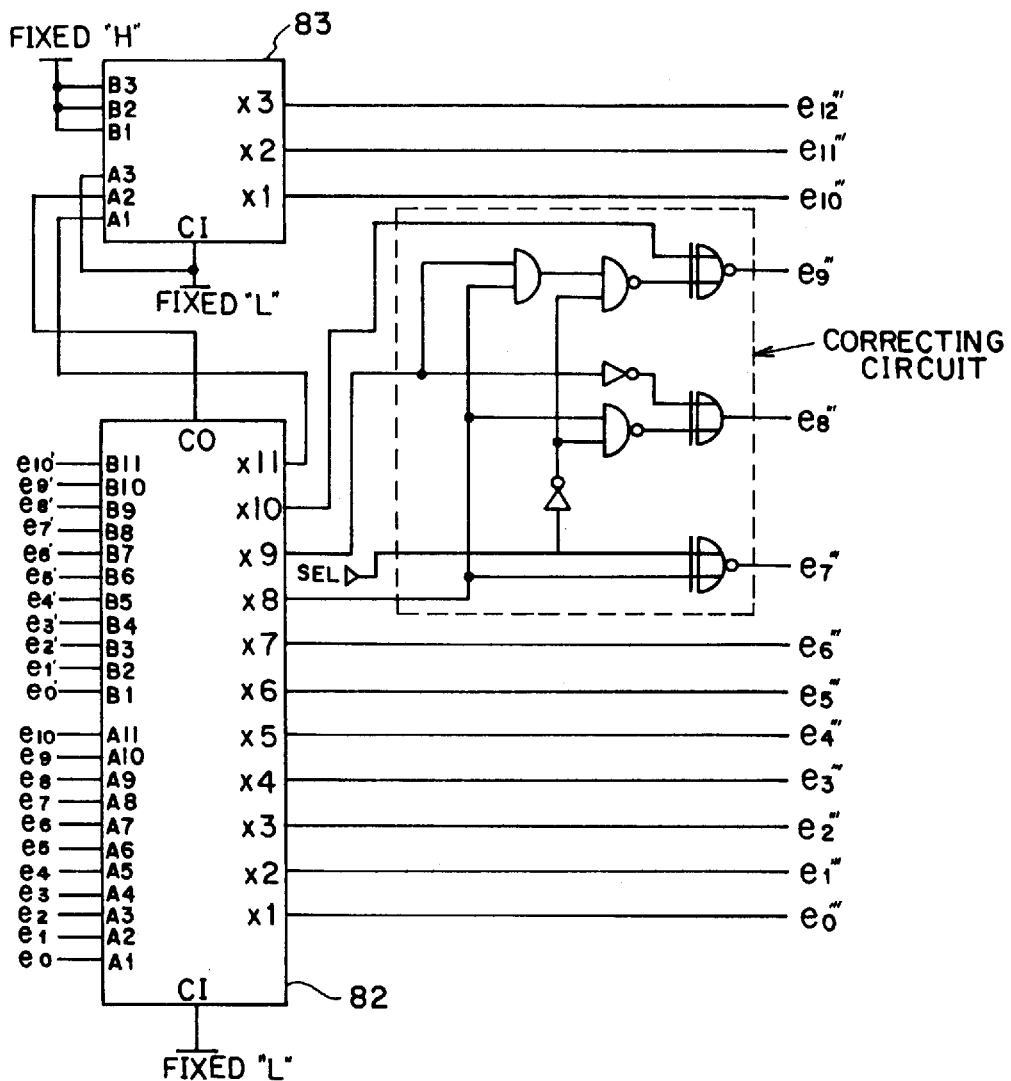
FIG. 33 shows a circuit diagram of a correction circuit used in a multiplier shown in FIG. 27 according to the present invention.

FIG. 33 shows a circuit diagram of a correcting circuit shown in FIG. 27.

In all figures, each unit is referred to by a unique number.

In FIG. 27, data converting circuits 176 and 177 adjust data formats of a multiplier and a multiplicand respectively; an adder (ADD) 178 adds data, and adds a part of a twos complement of a bias value; a correcting circuit 179 operates during the single-precision arithmetic operation; and an adder 180 (ADD) adds a part of a twos complement of a bias value during the double-precision arithmetic operation.

When single-precision data involving a floating-point are applied to the data converting circuits 176 and 177, the number of digits of the data is adjusted to that of double-precision data, and then a bias value (=1023) is subtracted from the adjusted value. Actually, the single-precision data are added to the difference 896 (represented as "1110000000" in binary) between the two bias values (1023–127).

Figure 28C:
FIG. 28C shows an explanatory view of an operation of a data convertor for a floating double precision.

Concretely, the exponent part of 8-bit single-precision data is represented as, for example, $e_7\ e_6\ e_5\ e_4\ e_3\ e_2\ e_1\ e_0$. If the highest order bit (MSB, $e_7$) equals O as shown in FIG. 28B, the value "$e_7 111$" is outputted as followed by seven (7) lower order bits ($e_6$–$e_0$). If MSB=1 as shown in FIG. 28B, the value "$e_7\ 000$" is outputted as followed by seven (7) lower order bits ($e_6$–$e_0$) of the exponent part of the data. If the data involve a floating decimal point in double-precision, then the 11-digit data are represented as, for example, $e_{10}$–$e_0$, and the data converting circuits 176 and 177 output the value "as is" as shown in FIG. 28C.

FIG. 29 shows a detailed structure of the data converting circuits 176 and 177. In the case of single precision, the data converting circuit 176 outputs D054 to D064 to the exponential part operating unit with regard to the input data DI55 to DI61 with the values of DO61 to DO63 corresponding to the fixed low level input and with the value of DO64 corresponding to the fixed high level input. The data converter 177 outputs the DO54 to DO64 to the exponent portion data arithmetic operation unit with regard to the input data DI52 to DI62 in the case of double precision. Therefore, the output is similarly obtained from the data DO54 to 64 in both the single precision and the double precision, thereby aligning the digits of the exponential part data for both the single precision and the double precision. The input data DI00 to 54 or 51 are provided to the fixed index, i.e., mantissa part data of the arithmetic operation unit.

The outputs of the above-described converting circuits 176 and 177 are applied to the ADD 178, and an addition is performed individually for the both circuits. If the outputs of the data converting circuits 176 and 177 are, respectively, $e_{10}$–$e_0$ and $e_{10'}$–$e_{0'}$, the maximum sum of 11 bits+11 bits can be 12 bits. The value is not preceded by a sign. However, a sign is required in a subtraction involving a bias value. Therefore, "0" indicating a positive value is added. As a result, the value (0) $e_{11''}$–$e_{0''}$ can be obtained as shown in FIG. 30A. The subtraction of a bias value, that is, 1023, can be performed by adding a twos complement of the value 1023.

FIG. 30B shows a simplified representation of the equation indicating the arithmetic operations in time series shown in FIG. 30A. The arithmetic operation shown in FIG. 30B is performed by the ADD 178 shown in FIG. 27, while that shown in FIG. 30B is performed by the ADD 180 shown in FIG. 27. FIG. 31 shows the circuit configured according to the equation shown in FIG. 30B. The part 82 of FIG. 31 shows the ADD 178 shown in FIG. 27, while the part 83 of FIG. 31 shows the ADD 180 shown in FIG. 27. The input/output data correspond to the data name shown in FIG. 30B. Adding "1" to the lowest order bit in the part (A) in FIG. 30B is realized by inputting "1" to the carry-in (CI) terminal in the portion 82 in FIG. 31.

In the arithmetic operation in part 83, the data ($e_{10}$ shown in FIG. 30B) outputted from the terminal X11 (the highest order bit) shown in part 82 in FIG. 31 and the data ($e_{11}$ shown in FIG. 30B) outputted by the terminal of the carry-out (CO) are applied to $A_0\ A_1$ and $A_2$, respectively. Then, "0" is added to $A_3$. On the other hand, "1" is added to the other input data $B_1, B_2,$ and $B_3$ of the adder shown in part 83, while "0" is added to the terminal of the carry-in (CI) in part 83. Thus, $e_{0'''}$–$e_{9'''}$ are outputted from part 82, and $e_{10'''}$–$e_{12'''}$ are outputted from part 83.

FIG. 32 shows the processes performed in the correcting circuit 179.

During the single-precision arithmetic operation involving a floating decimal point, since a format conversion was not conducted in the data converting circuits 176 and 177, the data require no modifications, and $e_{12'''}$–$e_{0'''}$ are outputted as is. (However, $e_{10'''}$–$e_{0'''}$ are used as exponential data).

During the single-precision arithmetic operation, "896" is added twice because it is added to the multiplier and the multiplicand separately in the data converting circuits 176 and 177. Therefore, 896 should be subtracted from the result. That is, the value is subtracted from $e_{12'''}$–$e_{0'''}$ by the correcting circuit 179 as shown in FIG. 32. In this circuit, subtracting 896 is replaced with adding the twos complement of the value 896. However, since the number of significant digits of the single-precision data is represented by eight (8) bits, "1s" in higher order three (3) bits are invalid and not included in an addition.

Since an overflow or an underflow is determined using $e_{8'''}$ and $e_{9'''}$, the correction should be made to the 8th, 9th, and 10th bits.

DATA BEFORE AND AFTER INPUT TO THE
CORRECTING CIRCUIT DURING THE
SINGLE-PRECISION ARITHMETIC
OPERATION

TABLE 1

| BEFORE INPUT | | | AFTER INPUT | | |
|---|---|---|---|---|---|
| $e_{9'''}$ | $e_{8'''}$ | $e_{7'''}$ | $e_{9''''}$ | $e_{8''''}$ | $e_{7''''}$ |
| 0 | 0 | 0 | 0 | 0 | 1 |
| 0 | 0 | 1 | 0 | 1 | 0 |
| 0 | 1 | 0 | 0 | 1 | 1 |
| 0 | 1 | 1 | 1 | 0 | 0 |
| 1 | 0 | 0 | 1 | 0 | 1 |
| 1 | 0 | 1 | 1 | 1 | 0 |
| 1 | 1 | 0 | 1 | 1 | 1 |
| 1 | 1 | 1 | 0 | 0 | 0 |

Table 1 shows the data before and after input to the correcting circuit during the single-precision arithmetic operation (bits involved in the correction). To realize this, random logic replaces an adder in the configuration.

Thus, in the single-precision operation data, $e_{7''''}, e_{6'''}$–$e_{0'''}$ are outputted as exponent parts.

As a result, during the single-precision data involving a floating decimal point in the data converting circuits 176 and 177, the number of digits of the exponent part data is adjusted to that of the double-precision data. At this time, the value at the highest order bit of the exponent part data (MSB, $e_7$) determines the fixed data to be added to the exponent part data. Thus, the circuit can be easily configured with the reduced number of gates.

During the single-precision data involving a floating decimal point, since the adder (ADD) 180 adds a part of the twos complement of the bias value (1023) to two higher order bits of the output of the ADD8, the circuit can be designed in smaller size. Therefore, a data selector provided for conventional circuits is not applied, or a multi-bit adder is not configured in a two-step design. Thus, the number of gates can be reduced and the data delay time can be eliminated.

FIG. 33 shows a detailed circuit of the correction circuit 179 shown in FIG. 27. The correction circuit 179 changes the output 1, 1, 1, from the output terminal X8, X9, and X10 of the part 82 to the 0,0,1 which are respectively obtained as values of e'''7, e'''8, e'''9. Therefore, the correction circuit 179 changes the signal e'7, e'8, and e'9 from 1, 1, 1 to 0,0,1 as is clear from the logic circuit shown as the correction circuit 179 in FIG. 33.

As described above, since the present embodiment is not provided with a data selector mounted in the related art technologies, nor a multi-bit adder is configured in a two-step design, the number of gates can be reduced and the data delay time can be eliminated.

Figure 34:
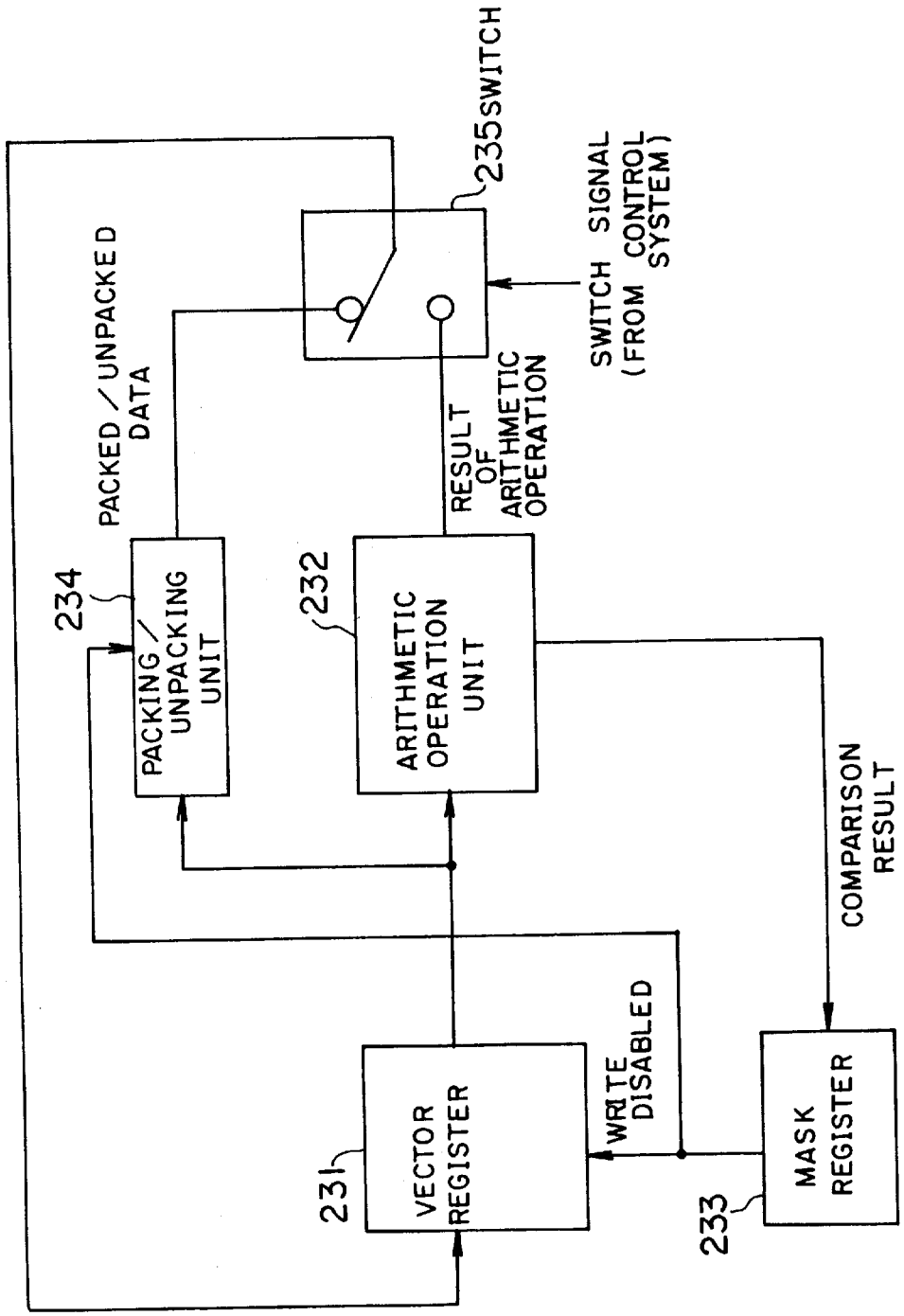
FIG. 34 shows a block diagram of a principle of a data processing device equipped with a packing and unpacking unit according to the present invention.

FIG. 34 shows an embodiment of the present invention in which the vector arithmetic operation circuit comprises a vector register 231 for storing plural pieces of vector data, an arithmetic operation unit 232 for performing arithmetic operations such as a comparison arithmetic operation for a pair of vector data pieces and other predetermined operations, a mask register 233 for writing for each piece of data a comparison result after the comparing operation performed by the arithmetic operation unit 232, a packing/unpacking unit 234 for packing the two pieces of vector data such that only valid data are retained according to the comparison result written in the mask register 232, writing the result separately to the vector register, writing the result of an arithmetic operation to the vector register 231 when the arithmetic operation is performed on the packed valid data by the arithmetic operation unit, and simultaneously unpacking the result of the arithmetic operation to the original address in the vector register 231, and a switch 235 for switching control between the arithmetic operation unit 232 and the packing/unpacking unit 234 according to the switch signal from the control system. The vector register 231, the arithmetic operation unit 232 and mask register 233 shown in FIG. 34 respectively correspond to the vector register 67, vector pipeline 66 and mask register 68.

The operation of the arithmetic operation circuit according to the present embodiment shown in FIG. 34 is explained below by referring to the flowchart showing the vector arithmetic operation and to FIGS. 36A and 36B each showing the packing and unpacking unit (not shown in FIG. 35) respectively. The example of the flowchart shown in FIG. 35 is given corresponding to the related art technology shown in FIG. 12.

Figure 12:
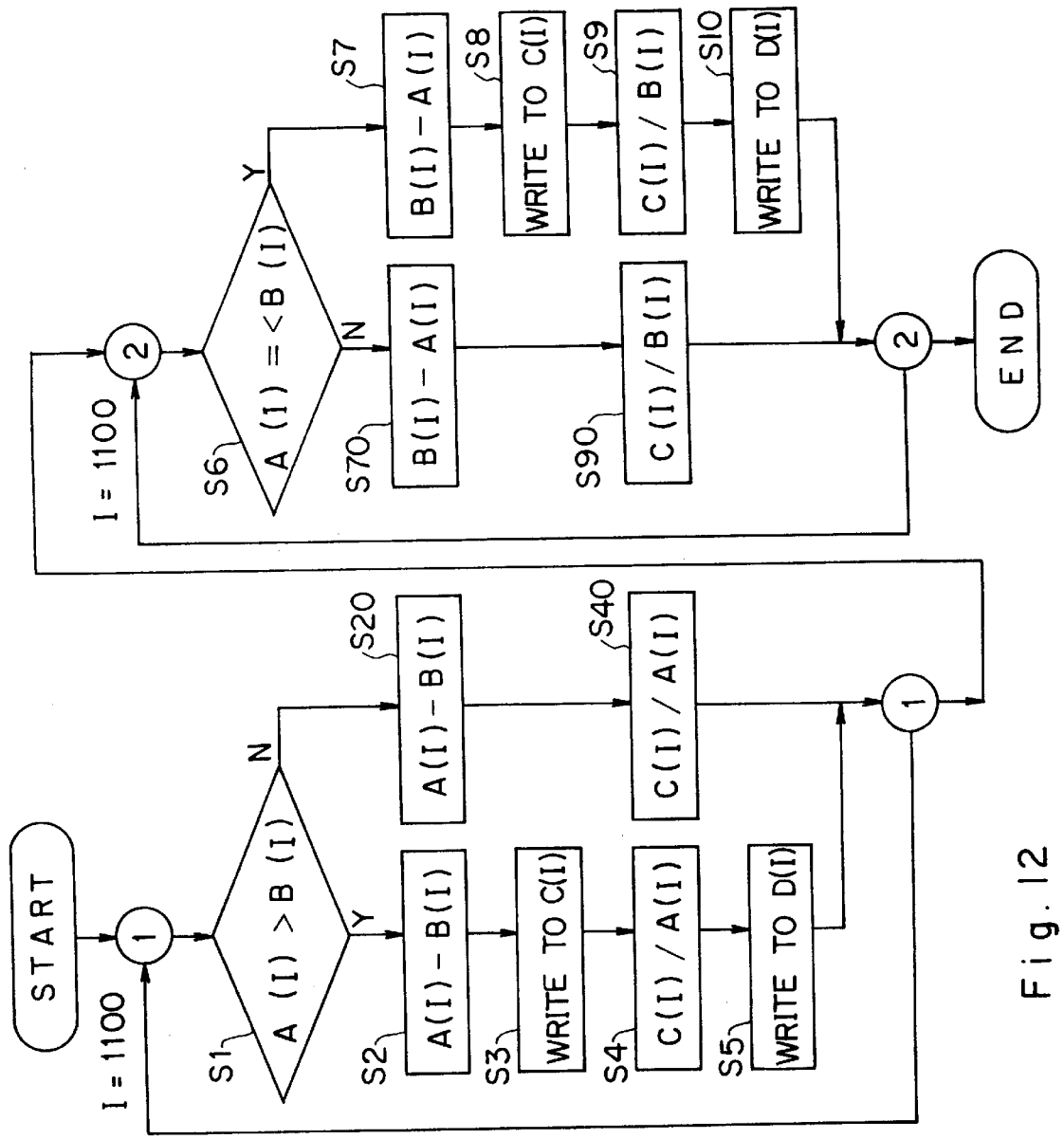
FIG. 12 shows a flowchart of a related-art vector arithmetic operation.
Figure 35:
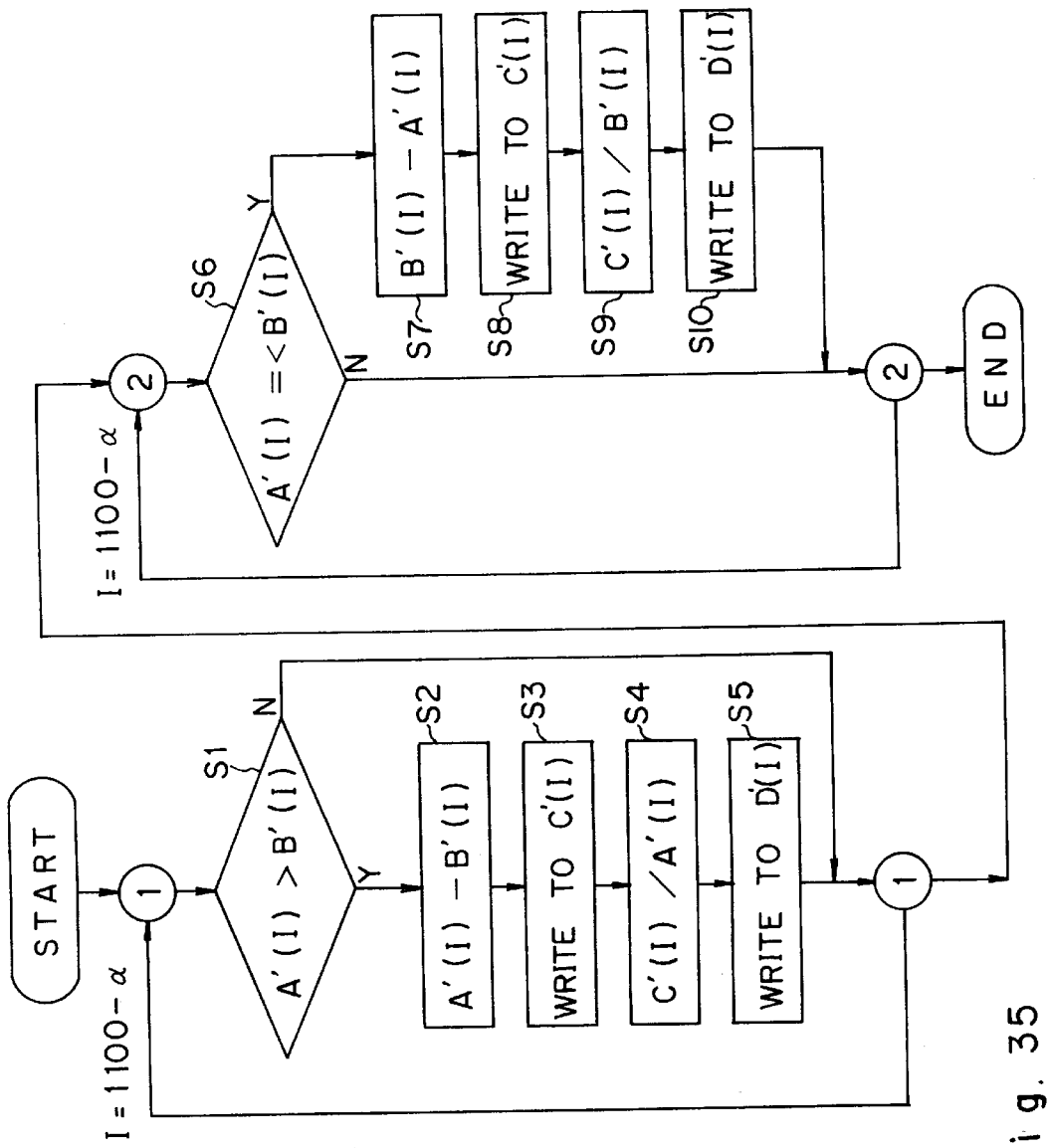
FIG. 35 shows a flowchart of a vector arithmetic operation used in the circuit used in FIG. 34 according to the present invention.

First, in step S1 shown in FIG. 35 of the present embodiment, vector data A'(i) and B'(i) are read from the vector register 231 as in the case shown in FIG. 12. After both data are compared by the arithmetic operation unit 232, the comparison result is stored as masking data in the mask register 233. The masking data are shown in FIGS. 36A and 36B.

Figure 36A:
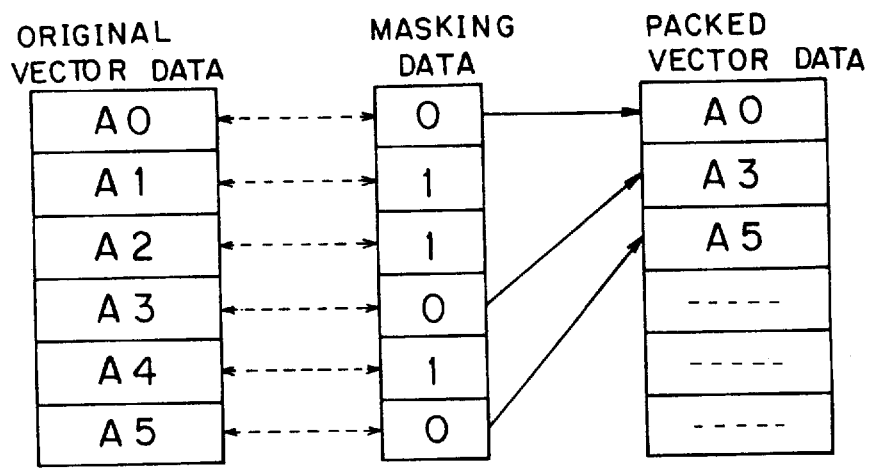
FIG. 36A shows an explanatory view of a packing process according to the present invention.

Thus, after writing the masking data to the mask register 233, the present embodiment packs data as shown in FIG. 36A before executing step S2 and the following steps.

That is, the packing/unpacking unit 234 obtains only packed vector data (A0, A3, and A5) as shown in FIG. 36A by reading vector data A'(i) and B' (i) processed in step S1 from the vector register 231 according to the comparison result in step S1 stored in the mask register 233, retrieving the value where the masking data indicate "0" as shown in FIG. 36A, and storing the data back in the vector register 231 through the switch 235 currently switched to the packing/unpacking unit 234 according to the switch signal from the control system (not shown in Figures).

Accordingly, in the arithmetic operations in step S2–S5 shown in FIG. 35, the arithmetic operation unit 232 retrieves only the packed vector data (A0, A3, and A5) shown in FIG. 36A, and stores them at other addresses in the vector register 231 through the switch 235 (at this time, switch 235 is switched to the arithmetic operation unit 232) after performing a predetermined arithmetic operation other than the comparison arithmetic operation performed in steps S2–S5 shown in FIG. 35. Since packed data are mainly processed in the operation shown in FIG. 35, parameter i=1 through 100–α.

Figure 36B:
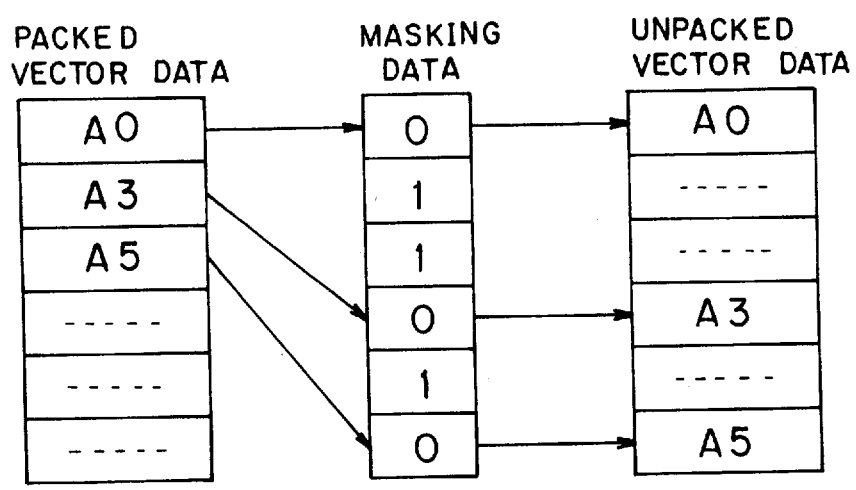
FIG. 36B shows an explanatory view of an unpacking process according to the present invention.

Then, as shown in FIG. 36B, the vector data packed and stored in the vector register 231 as shown in FIG. 36B (A0, A3, and A5) are unpacked to the original address according to the masking data written in the mask register 233, and written to the original address position in the vector register 231 through the switch 235 (at this time, the switch 235 is switched to the packing/unpacking unit 234).

As described above, since only the packed instructions are executed, only the essential data are used in the arithmetic operations. Therefore, the processes can be carried out at a high speed.

Figure 10:
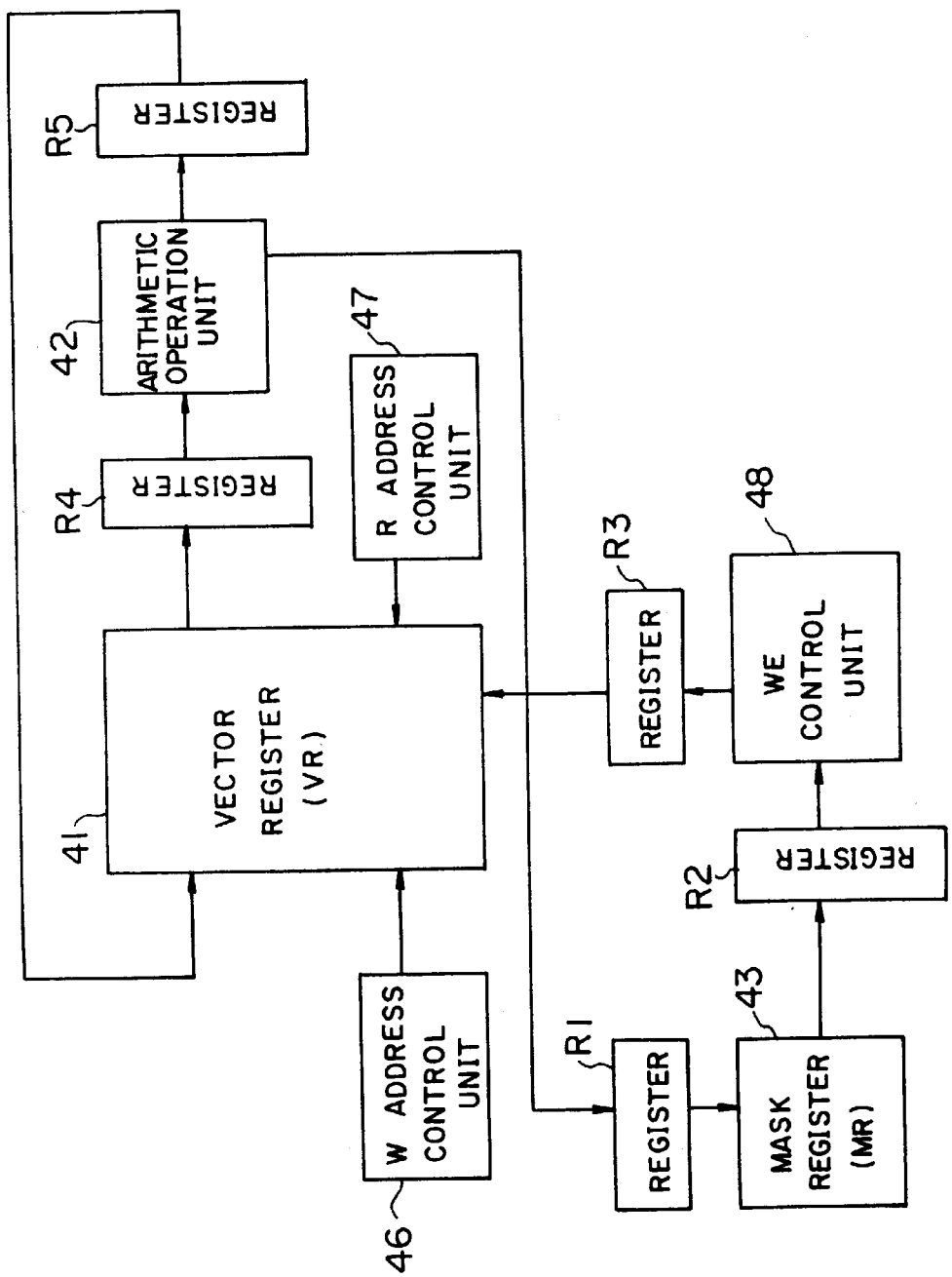
FIG. 10 shows a block diagram of a vector arithmetic operating device.
Figure 37:
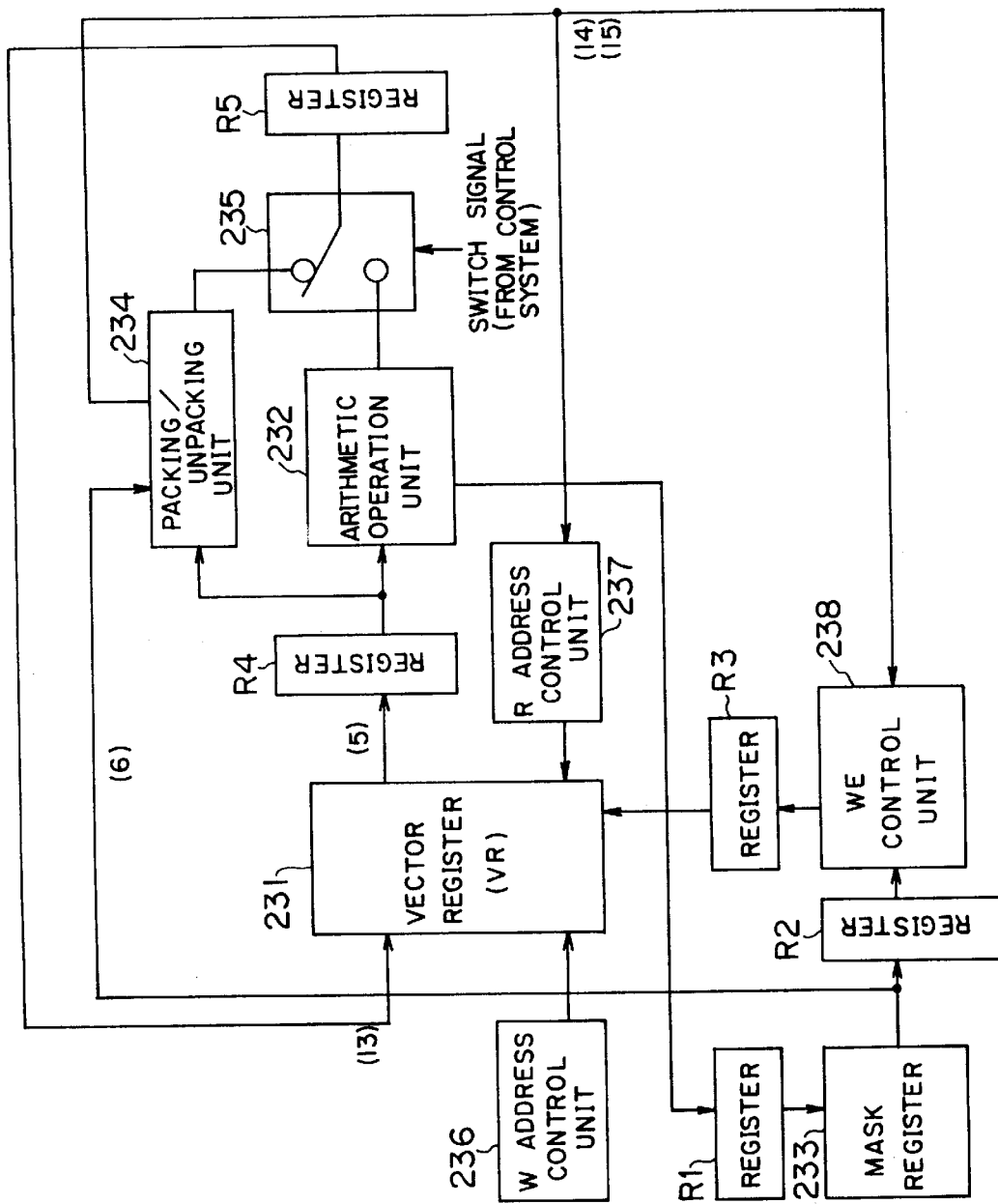
FIG. 37 shows a block diagram of an embodiment equipped with a packing and unpacking unit according to the present invention.

FIG. 37 shows the embodiment of the vector arithmetic operation circuit according to the present embodiment, and shows the entire configuration of the clock diagram shown in FIG. 34. In FIG. 37, the circuit comprises, in addition to the components of the conventional circuit shown in FIG. 10, a packing/unpacking unit 234 in parallel with the arithmetic operation unit 232, and a switch 235 for switching control to the packing/unpacking unit 234 or to the arithmetic operation unit 232. The packing/unpacking unit 234 is assigned mask data by the mask data register 233, and provides the write enable control unit 238 with a write control signal.

Figure 38:
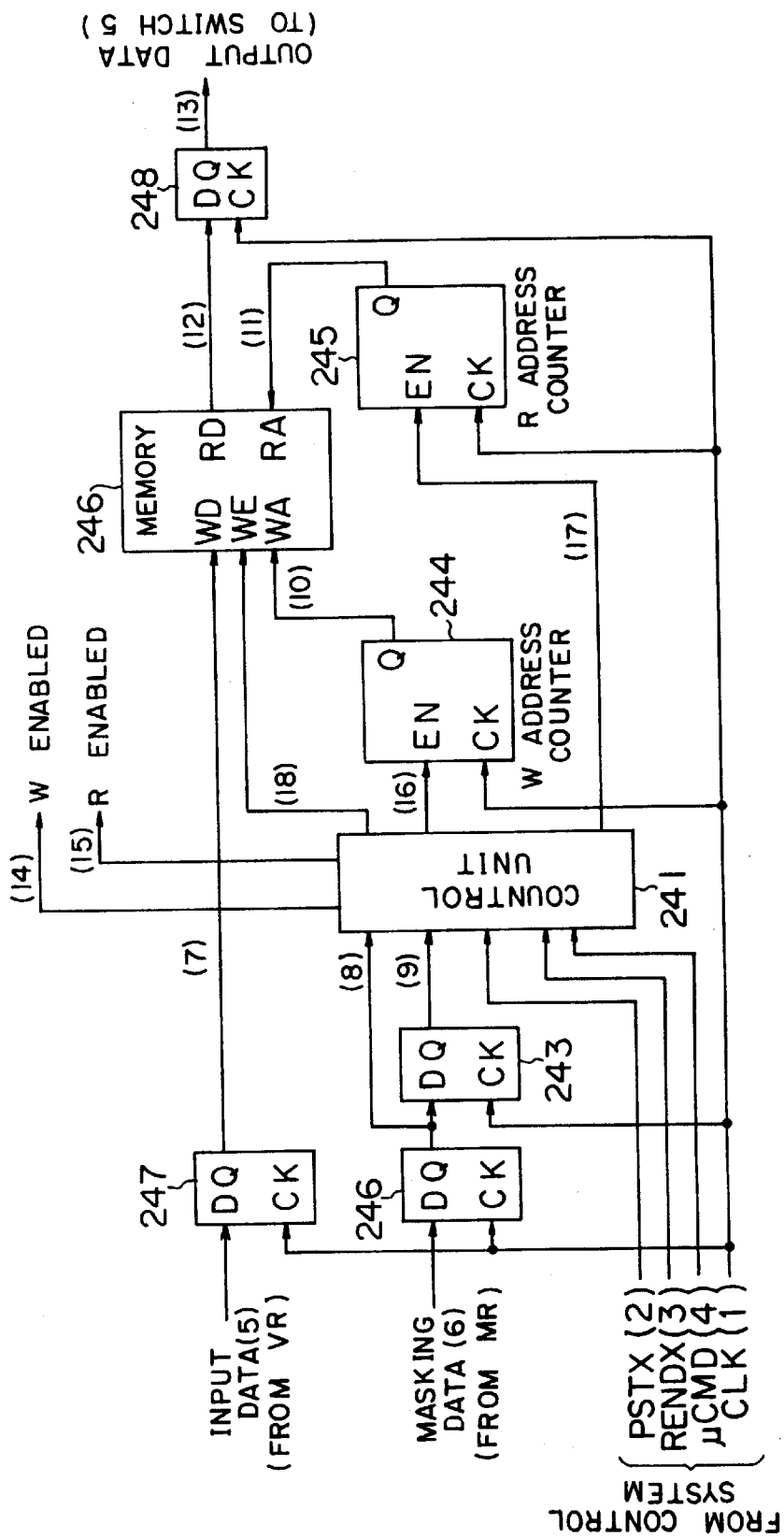
FIG. 38 shows an embodiment of a packing and unpacking unit shown in FIG. 34 according to the present invention.

FIG. 38 shows the embodiment of the packing/unpacking unit 234. A clock (1) is applied from a control system (not shown in Figures) to each block, and a control signal PSTX (2), a RENDX (3), and μCMD (4) are applied to a control unit 241. The mask data (6) from the mask register 233 are applied as signals (8) and (9) to the control unit 241 through flipflops 242 and 243. As resultant output signals, a write enable signal (14) to the write enable (WE) control unit 238, a read enable signal (15) to the read address control unit 237, an enable (EN) signal (16) to a write address counter 244, an enable signal (17) to a read address counter 245, and a write enable signal (18) to a memory 246 are generated.

The input data (5) are applied from the vector register 231 to a flipflop 247, and then applied as mask data (7) to the memory 246. The write address for the memory 246 is provided through a signal (10) outputted by the write address counter 244. The read address for the memory 246 is provided through a signal (11) outputted by the address counter 245. The data (12) read out from the memory 246 are sent to the switch 235 as output data (13) through the flipflop 248.

Figure 39:
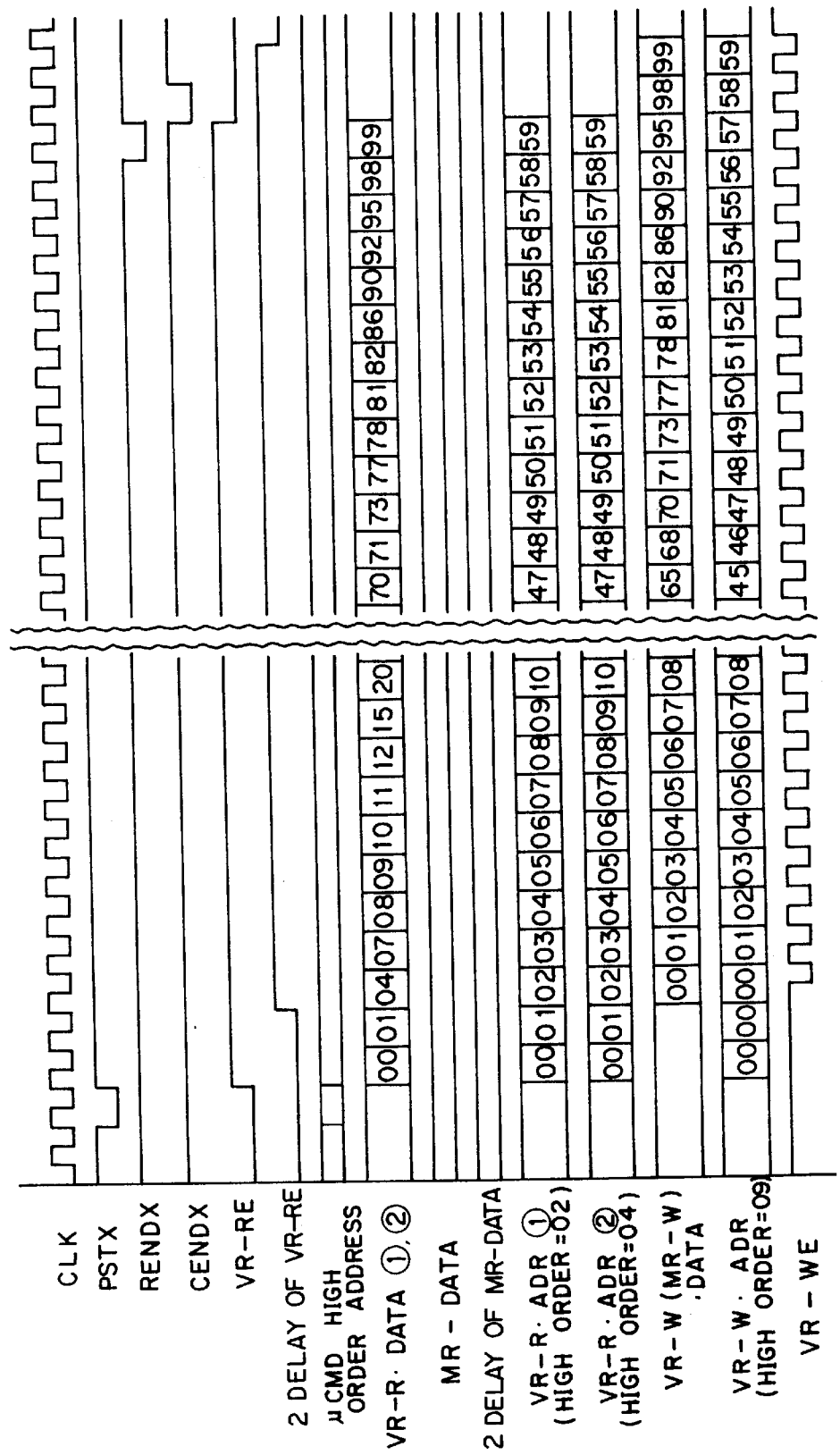
FIG. 39 shows a timing chart of a vector arithmetic operation according to the present invention.
Figure 40:
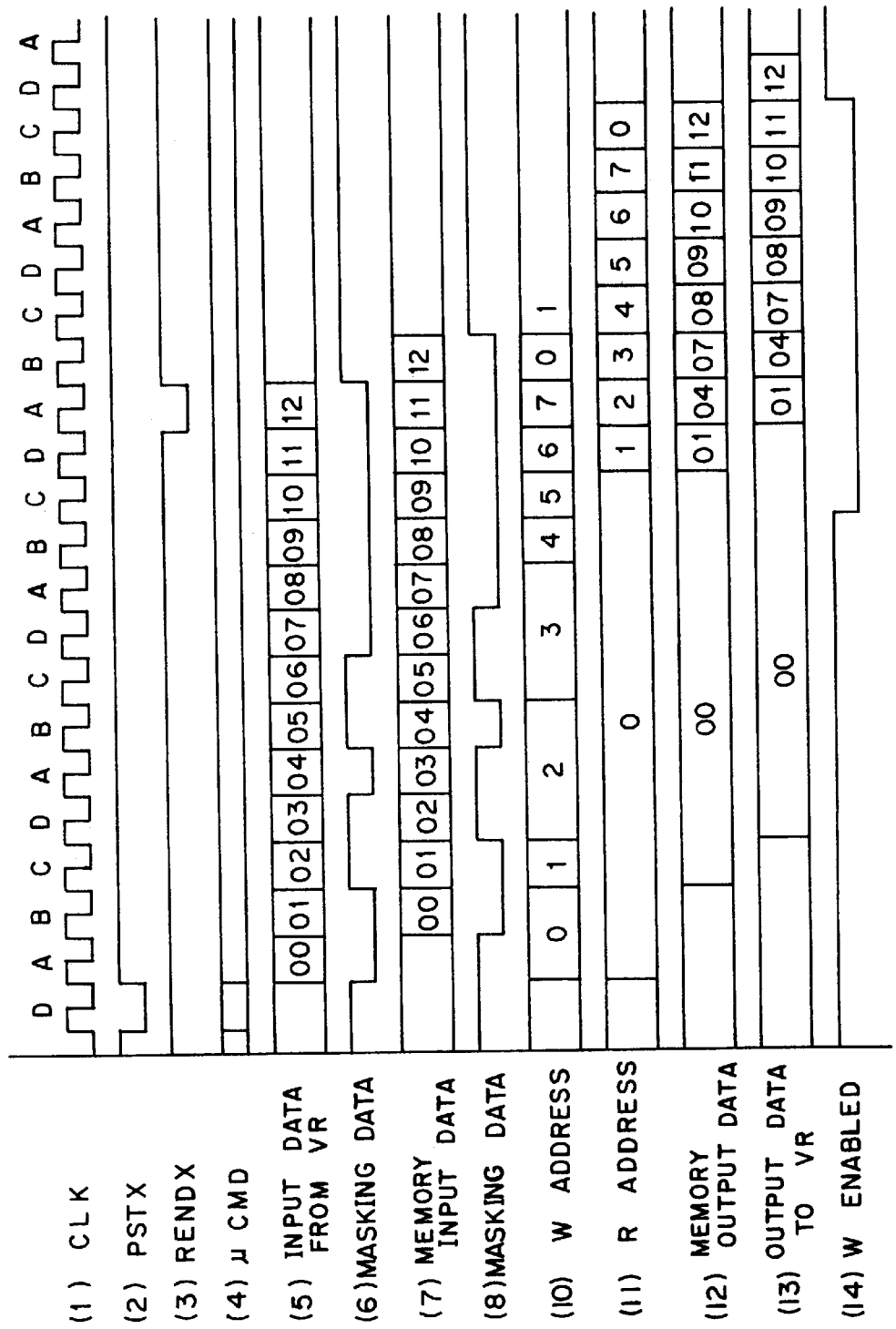
FIG. 40 shows a timing chart of the present invention in the case of a packing operation.

The operation of the above-described embodiment of the present embodiment is explained below by referring to the flowchart shown in FIG. 35, the time chart of vector arithmetic operations shown in FIG. 39, the time chart when data are packed as shown in FIG. 40, and the time chart when data are unpacked.

First, in present embodiment, as in the related art technology, vector data A'(i) obtained in step S1 are compared with vector data B'(i), and the result are stored in the mask register 233. At this time, as in the case shown in FIG. 13, data R.DATA 1 and 2 are read from the vector register 231 according to the low order address, and compared in a comparison arithmetic operation by the arithmetic operation unit 232 through register R4. The comparison result is written as write data M-W.DATA to the mask register 232 through the register R1. This process is performed for all data (64 bits) having the lower addresses 00–99.

After the comparison result of step S1 has been written to the mask register 233, in the present embodiment, the switch 235 switches control from the arithmetic operation unit 232 to the packing/unpacking unit 234 according to the switching signal provided by the control system so as to perform the process when data are packed as shown in FIG. 40.

In the packing process, the data start being outputted at slot C marked on the clock CLK(1) when four pieces of input data (unmasked data) are stored.

Figure 13:
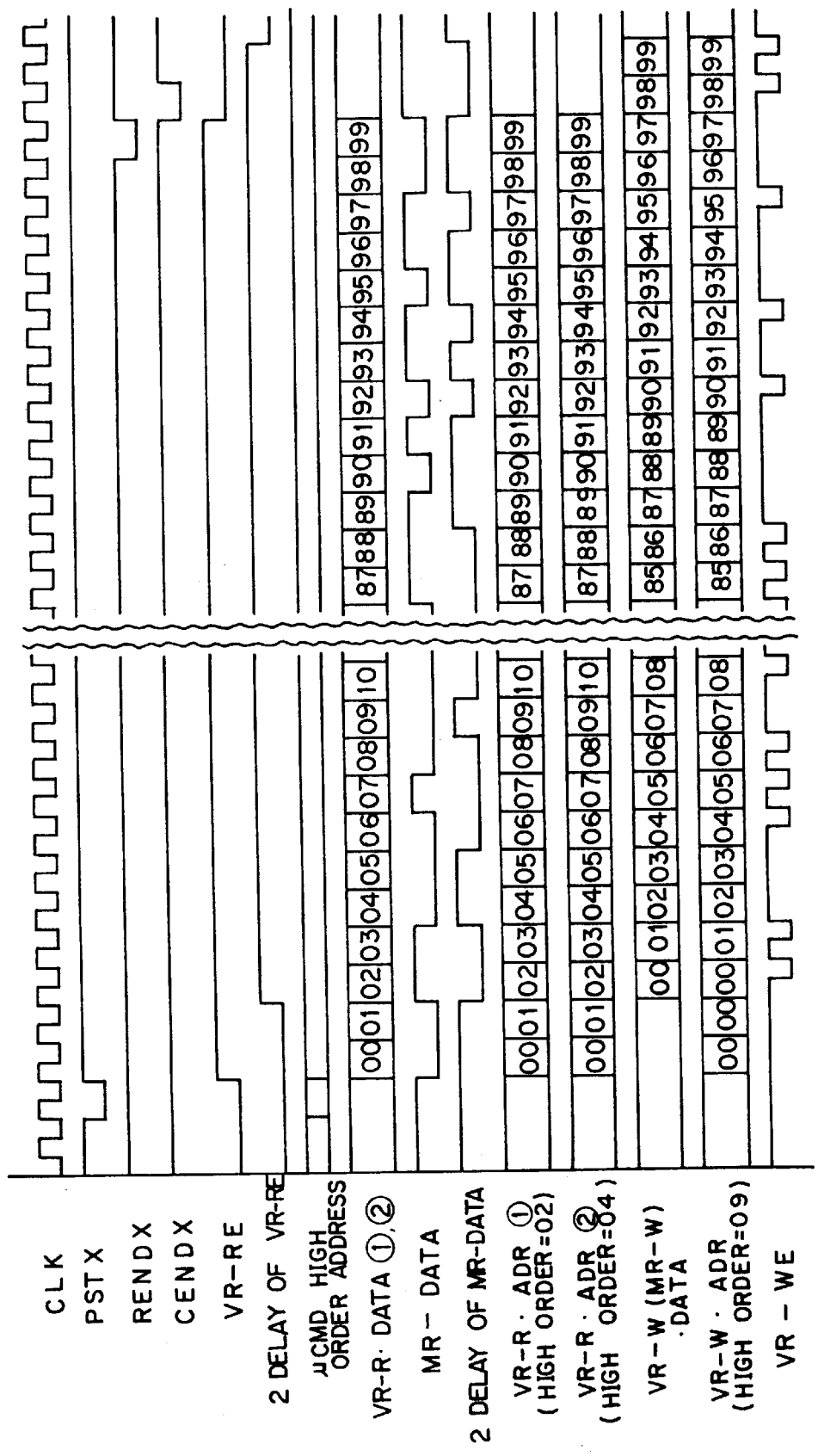
FIG. 13 shows a timing chart of a related-art vector arithmetic operation.

When the control signal PSTX from the control system indicates the active state (L level) as described in FIG. 13, the control signal μCMD (4) from the control system is accepted by the control unit 241 shown in FIG. 38, and then the process is started.

The mask data (6) from the mask register 233 are applied as mask data (8) to the control unit 241 through the flipflop 242. Since the mask data (8) is applied as an output signal (18) from the control 241 to the memory 246 as a write enable signal, the input data (5) from the vector register 231 are applied as data (7) to the memory 246 after being delayed by one clock cycle by the flipflop 247. If the mask data (8) indicate the inactive state (the H level), the data are not written to the memory 246. At this time, the output signal (10) from the write address counter 244 for receiving the output signal (16) from the control unit 241 (corresponding to a signal (8) when data are packed) also generates a write address.

Accordingly, if a read address counter 240 applies its output count value (11) as a read address to the memory 66 on receiving the output signal (17) as an enable signal from the control unit 241, the data (12) read from the memory 246 are outputted with the data at lower order addresses 02, 03, 05, and 06 removed (where the mask data (8) indicate the inactive state). Then, the data are applied as output data (13) to the switch 235 through the flipflop 248.

Figure 11A:
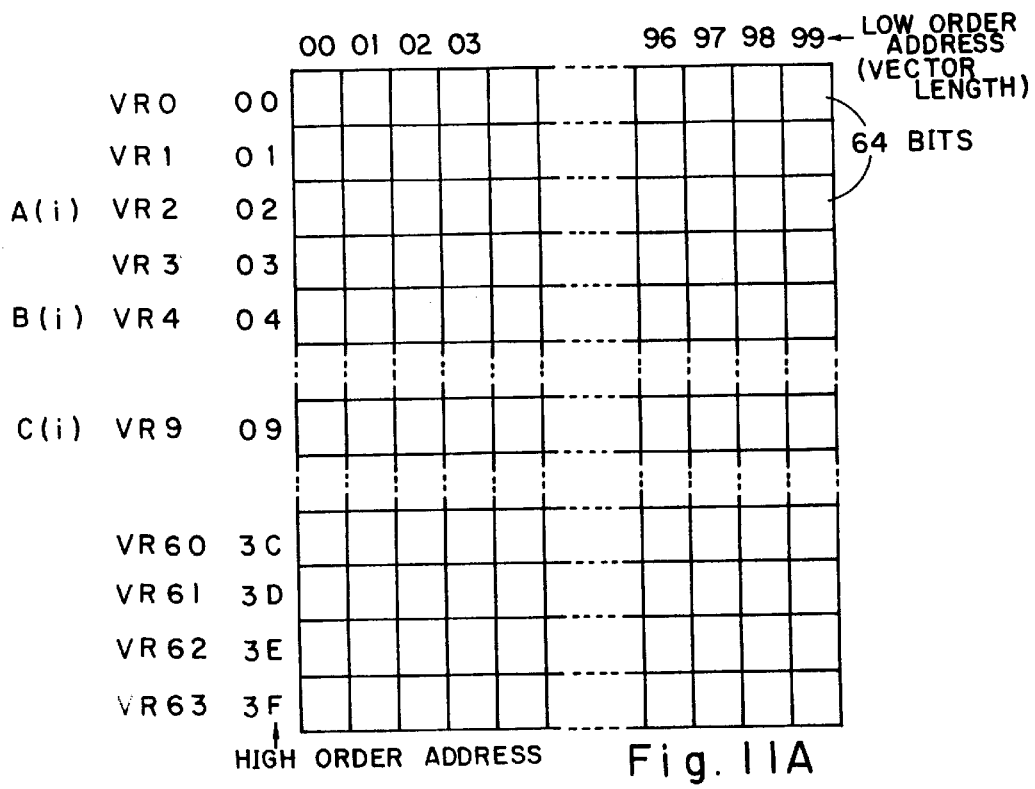
FIG. 11A shows an example of a configuration of a vector register used in the vector arithmetic operation device.
Figure 11B:
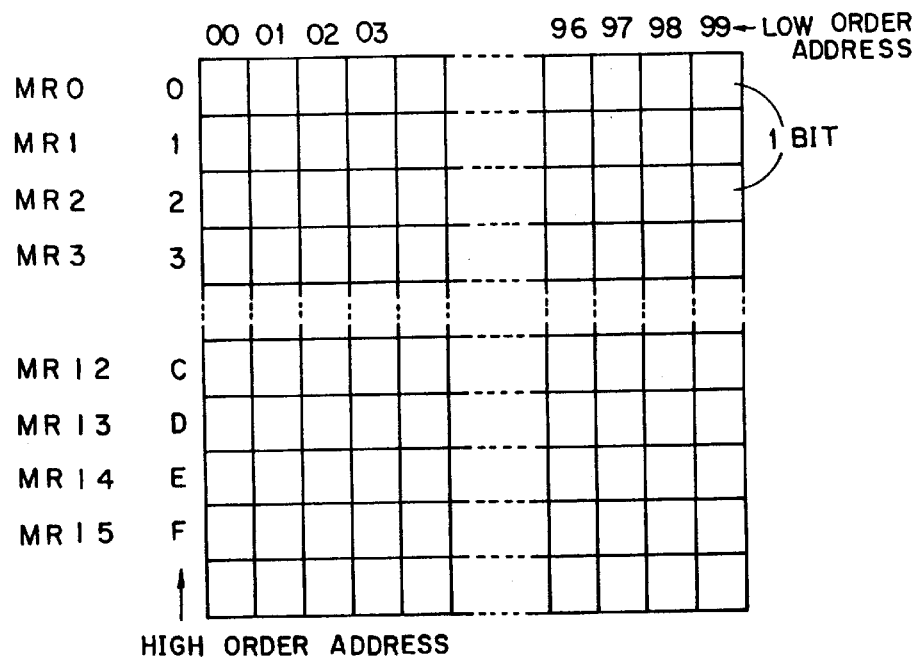
FIG. 11B shows an example of a configuration of a masked register used in the vector arithmetic operation device.

Since the control unit 241 applies a write enable signal (14) to the write enable control unit 238, the output data (13) are applied and written to the vector register 231 through the switch 235 and the register R5. At this time, storage is designated at a higher address other than the areas storing vector data A (i) and B (i) as shown in FIG. 11A.

A data packing process is performed to preliminarily remove unnecessary data so that a vector arithmetic operation shown in FIG. 39 is performed only when the comparison arithmetic operation in step S1 results in "yes" after omitting excess steps such as steps S20, S40, S70, and S90 shown in FIG. 12 according to the result of the comparison arithmetic operation performed in step S1 in FIG. 35.

That is, the time chart for the vector arithmetic operation shown in FIG. 39 is similar to that used for the conventional vector arithmetic operation shown in FIG. 13. The difference from the time chart shown in FIG. 13 is that the vector data used in arithmetic operations have already been packed, and therefore, the data for the mask register (data at lower addresses 02, 03, 05, and 06) become unnecessary, and steps S2 through S5, for example, are packed and the data stored in the vector register 231 are all executed.

That is, vector data C'(i) are obtained by performing the arithmetic operation in step S2, for example, on the data R.DATA 1 and 2 read as the data at addresses R.ADR 1 and R.ADR 2 in the vector register 231 by the arithmetic operation unit 232. The vector data C'(i) are written as write data W.DATA to vector data VR9 at higher address 09 in the vector register 231 through the switch 235. Therefore, write enable signal WE (14) of the vector register 231 is generated at every C1 clock timing, and excess arithmetic operations are successively removed.

Figure 41:
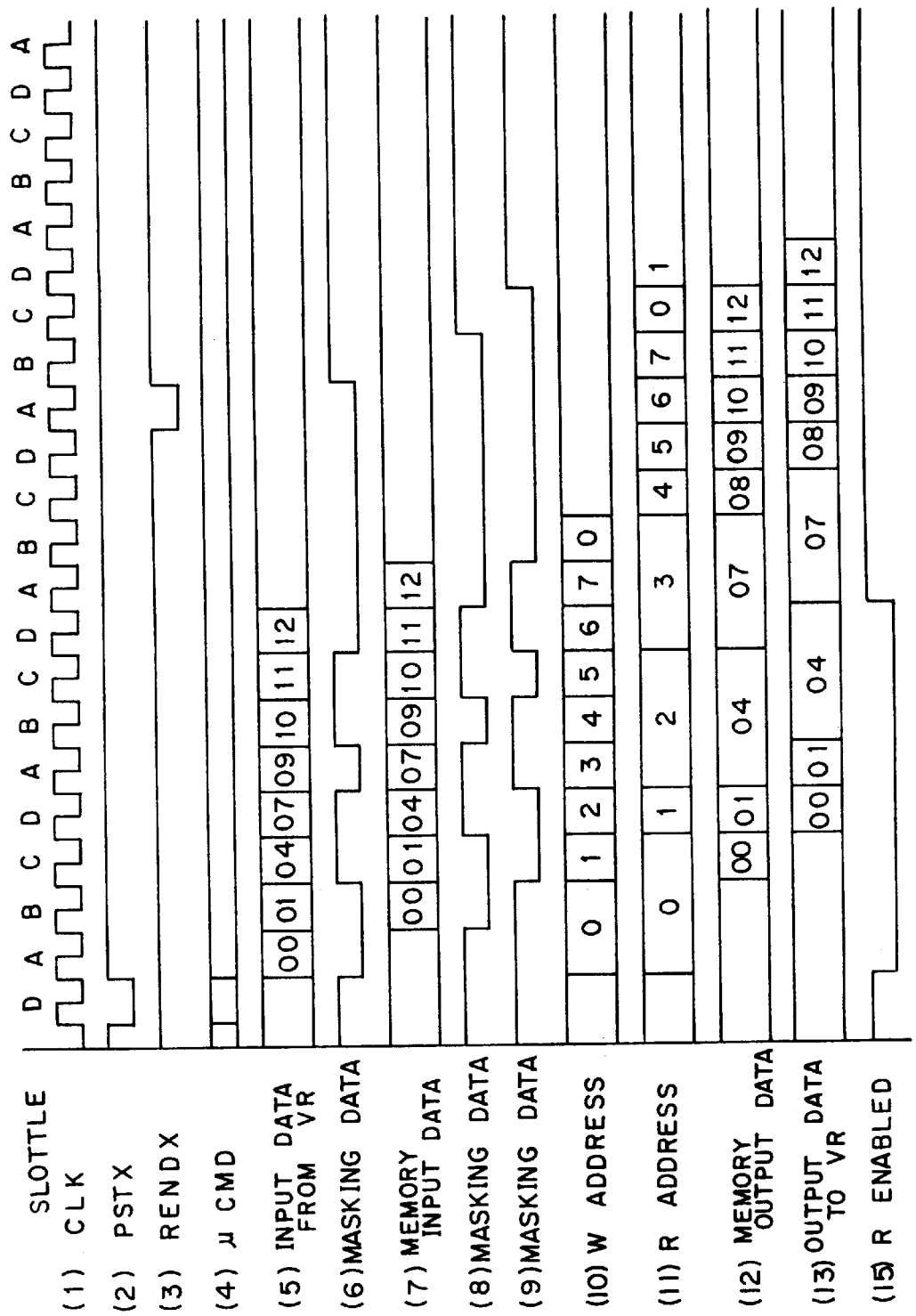
FIG. 41 shows a timing chart of the present invention in the case of an unpacking operation.

The data obtained through the vector arithmetic operation according to the packed data and stored in the vector register 231 are unpacked as including the data at lower addresses according to the time chart used when data are unpacked as shown in FIG. 41.

That is, the input data (5) from the vector register 231 are stored in the packed form such as addresses "00", "01", "04", "07", "08", "09", "10", and "11". On the other hand, the mask data (6) from the mask register 233 are processed according to the time chart used when data are packed as shown in FIG. 40. Therefore, these data are applied to the flipflops 247, 242, and 243 to obtain the data (7) through (9).

Among these data, data (9) are converted through the control unit 241 to a write enable signal (18) to the memory 246 and an output signal (10) indicating the memory write address WE from the write address counter 241, and the input data (7) are written to the memory 246 as is.

The signal (17) outputted by the control unit 241 in response to these mask data (9) is received as an enable signal EN by the read address counter 245. Since an address is generated according to a read address signal (11) such that the data omitted when data are packed as shown in FIG. 40 can be inserted, the data (12) read from the memory 246 are formed as unpacked as data "04" and "07" individually occupying the length of three pieces of data. Therefore, when the output data (13) are returned to the vector register 231 through the switch 235, they are written at higher addresses "04" and "07", while other independent data are stored at lower addresses "02", "03", "05", and "06". Thus, the data obtained by arithmetic operations according to the processes shown in FIG. 35 are correctly stored again at predetermined addresses.

Figure 42A:
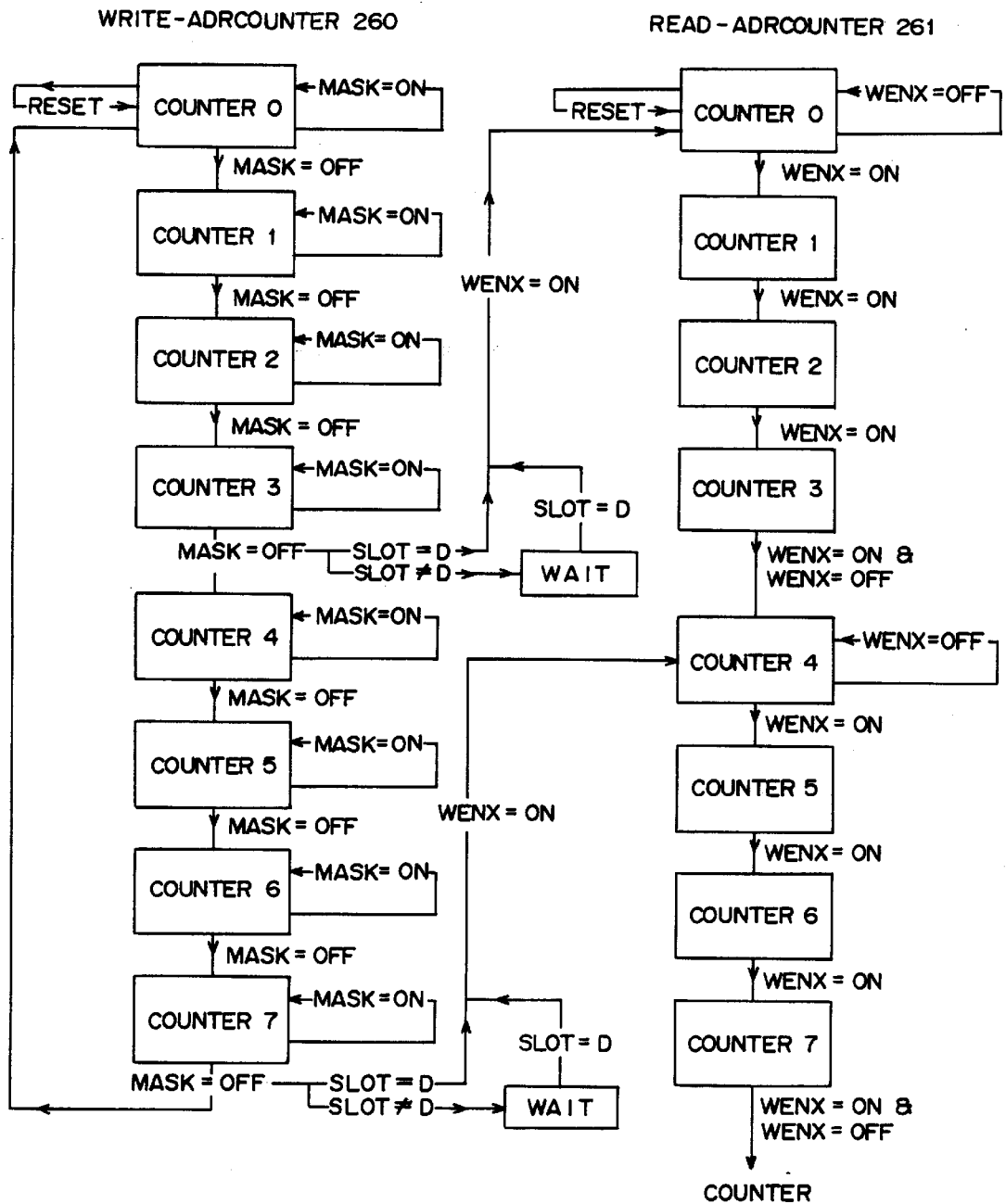
FIGS. 42A and 42B show a status sequence diagram of a control unit used in the packing and unpacking unit in FIG. 38.
Figure 42B:
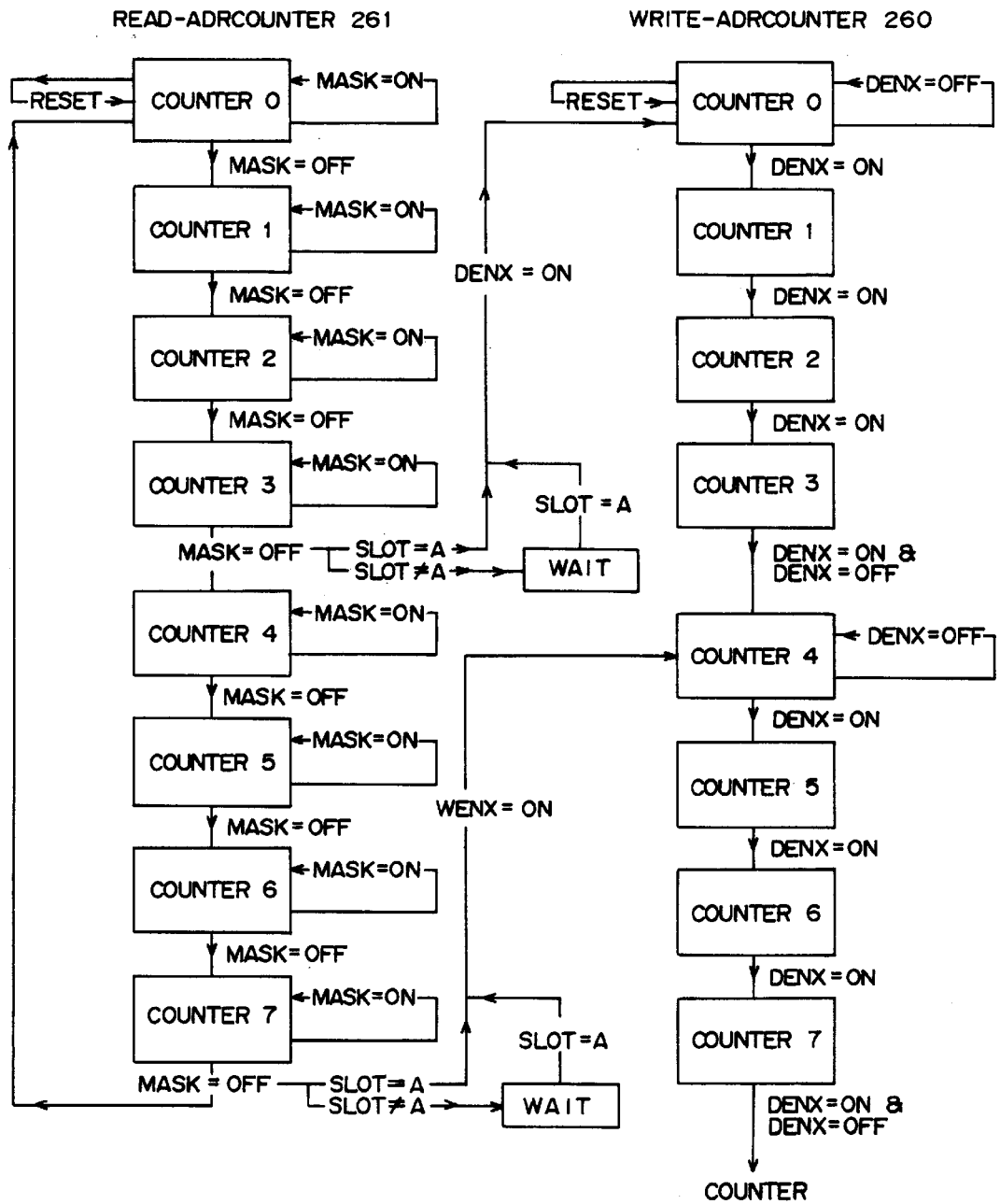

FIGS. 42A and 42B show a detailed block diagram of the control unit 241 shown in FIG. 38.

FIGS. 42A and 42B respectively show a diagram of a state sequence of the packing instruction and the unpacking instruction which is conducted in the control unit 241 shown in FIG. 38. In FIG. 42A, the write address counter 260 maintains a counter 0 pack the data when the mask is on. When the mask is off, the write address counter 260 advances to a count 1 and thus the next data is written into the next address without enabling the data to be packed. When the slot or cycle is D, the write enable WENX is on and read address counter 261 starts the count so that the read data can be read from the memory 246. When the write enable WENX is off, the read address counter 261 maintains the counter 0. The read address counter 261 performs the count sequentially when the read enable signal WENX is on. Therefore, the packed data is sequentially read from the memory 246. When the cycle is not for reading, the read counter 261 is kept waiting until the cycle becomes D.

FIG. 42B shows a diagram of a state sequence of the unpacking instruction. The read counter 261 maintains the counter 0 when the mask is on. Thus the data read from the memory 246 is unpacked while the mask is on. When the mask is off, the read address counter 261 advances the count by one to read the next data. When the slot is A, the read enable DENX is on and thus write address counter 260 starts the count and writes the data sequentially. Therefore, the data is expanded when the data is read from memory 246 and the unpacked data is written into the vector register 231 sequentially.

As described above, the vector arithmetic operation circuit of the present embodiment comprises a packing/ unpacking unit, in parallel with the arithmetic operation unit, for selecting only significant data between two vector data according to a comparison result written in the mask register, storing them in a packed form in the vector register if other predetermined arithmetic operations are performed by the arithmetic operation unit on these packed significant data, and for restoring the results of the arithmetic operations as written at the original addresses in the vector register. Accordingly, since the data to be processed by an arithmetic operation with mask data are packed before performing the operation and then they are unpacked, vector arithmetic operations can be carried out at a high speed when they are performed using the same mask data. The packing and unpacking unit 234 is provided in the vector pipeline 68 shown in FIG. 15A and performs a pipeline operation. The mask register 233 corresponds to the mask register 68 in FIG. 15A.

The vector processor unit of the present invention is formed of "LSI" and it is necessary to test the vector processor unit comprising an LSI device efficiently.

Figure 43:
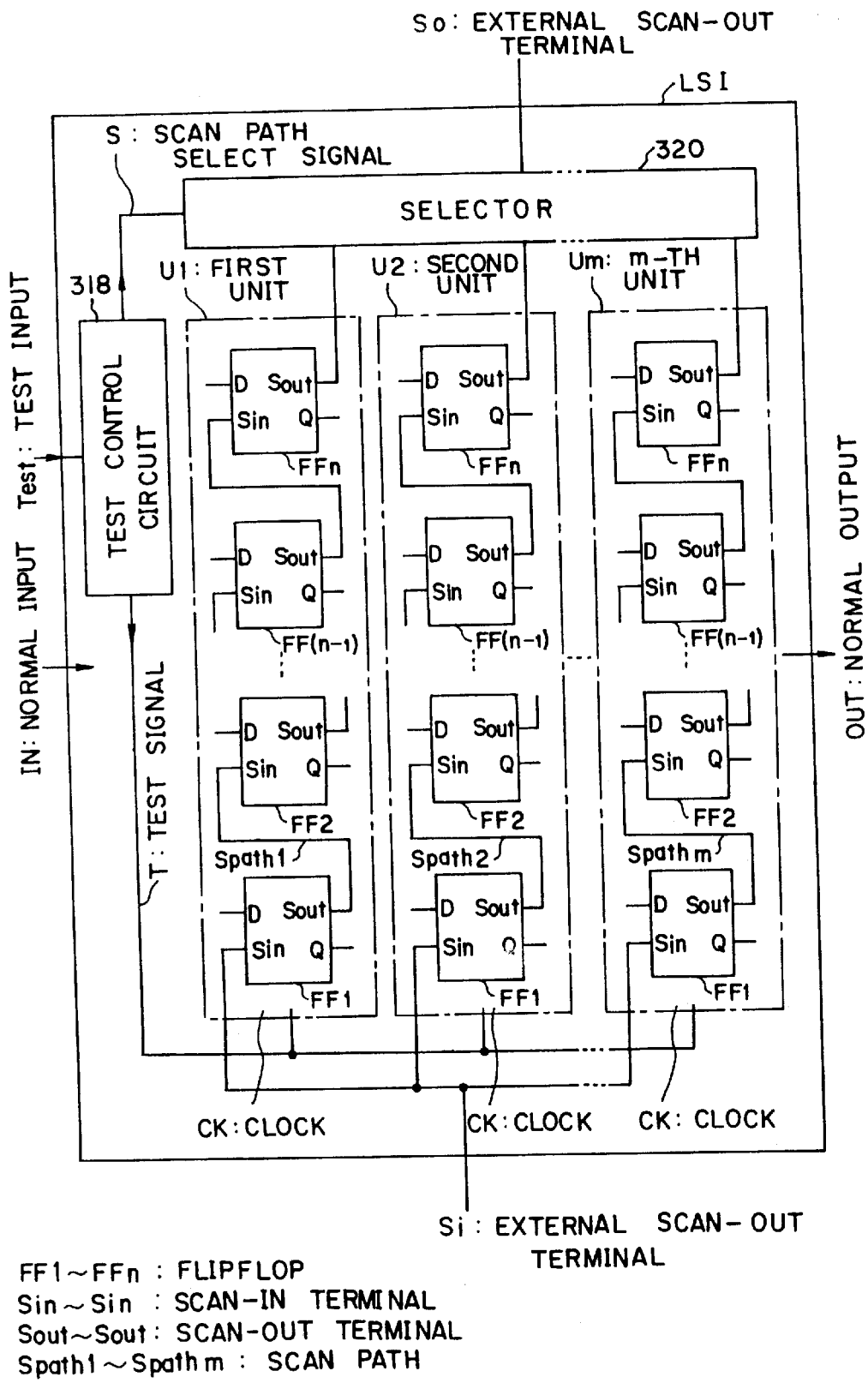
FIG. 43 shows a structure of an LSI circuit using a scan type DFF according to the present invention.

FIG. 43 shows an LSI device according to the present embodiment, which comprises a plurality of scan-type flip-flops (FF1–FFn, . . . , FF1–FFn). The flipflops (FF1–FFn, . . . FF1–FFn) can be divided and assigned to each of the LSI units (U1–Um). In each of the units (U1–Um), the scan-out terminal ($S_{out}$) of a flipflop (FFj) is connected to the scan-in terminal ($S_{in}$) of the next flipflop (FF(j+1)). The scan-in terminal ($S_{in}$) of the flipflop (FF1) at the top and the scan-out terminal ($S_{out}$) of the flipflop (FFn) at the bottom are respectively connected to the external scan-in terminal ($S_i$) and the external scan-out terminal ($S_O$). Each unit (U1–Um) is separately assigned a scan path ($S_{path}1$–$S_{path}m$), respectively. The LSI device also comprises control circuits (18 and 20) for selecting one of the units (U1–Um).

According to the test method of the present embodiment, a plurality of scan-type flipflops (FF1–FFn, . . . , FF1–FFn) is scanned to test an LSI. The flipflops (FF1–FFn, . . . , FF1–FFn) are divided and assigned to each LSI unit (U1–Um). Each unit (U1–Um) is provided an individual scan path ($S_{path}1$–$S_{path}m$) for connecting an external scan-in terminal ($S_i$) to an external scan-out terminal ($S_O$) through a flipflop (FF1–FFn) in a unit (U). The test method conducts a test for each unit (U1–Um) of the LSI by separately using any of the scan paths ($S_{path}1$–$S_{path}m$).

In conducting an LSI test, a unit (Uj) is selected from a plurality of units (U1–Um), and a test is conducted on the selected unit (Uj) through the scan path ($S_{path}j$) assigned to the target unit (Uj). That is, a scan-read and a scan-write can be performed in a unit (U) by using the scan path ($Sp_{path}j$) assigned to the target unit (Uj). Since the number of FFs in one unit (U) is smaller than that of the FFs of all units (U1–Um) in the LSI, a test can be conducted on the target unit (Uj) according to the clocks in a small number.

Figure 44:
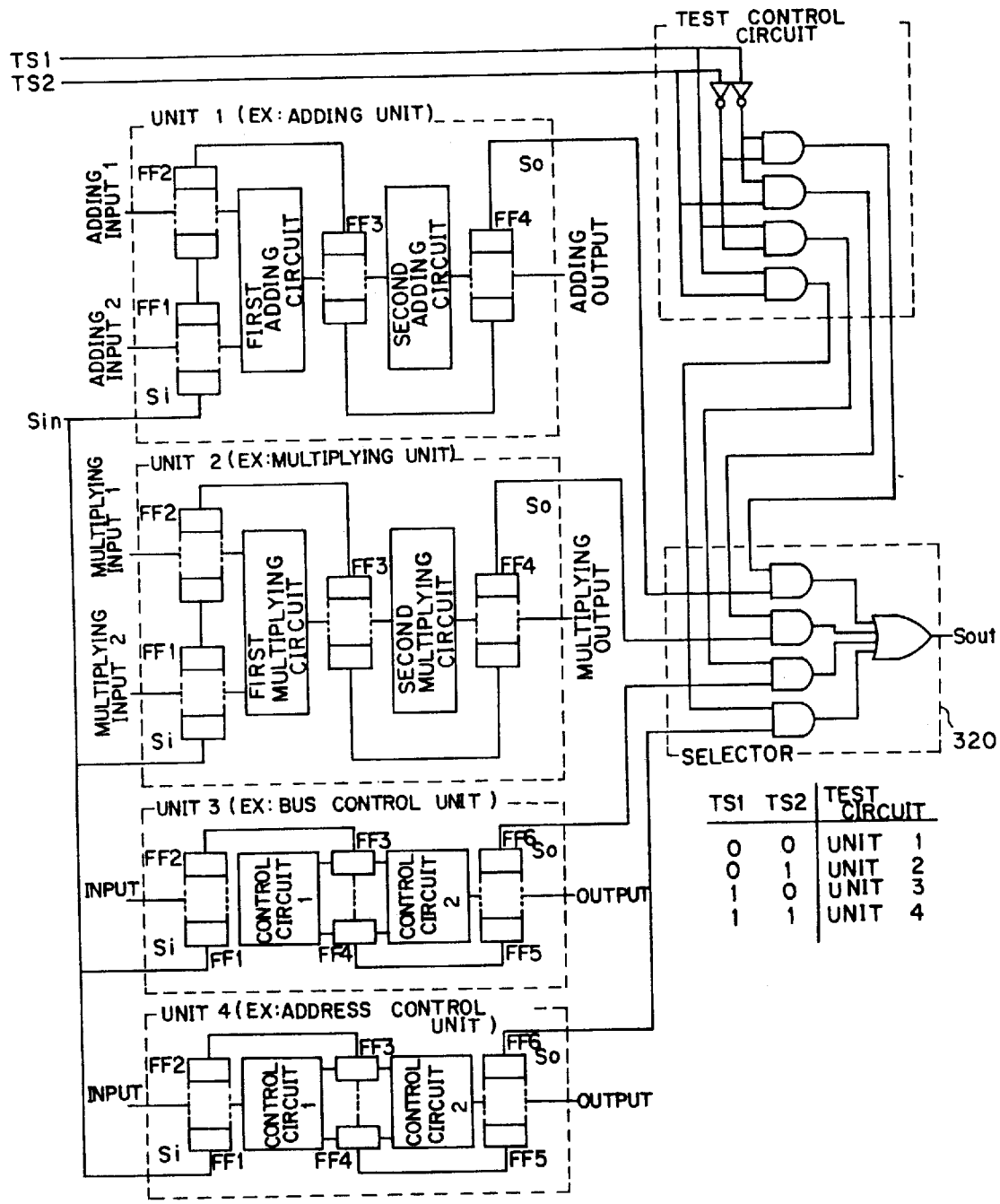
FIG. 44 shows an example of a scan path in the LSI according to the present invention.

As shown in FIG. 44, the LSI according to present embodiment uses a scan type FF.

Figure 14A:
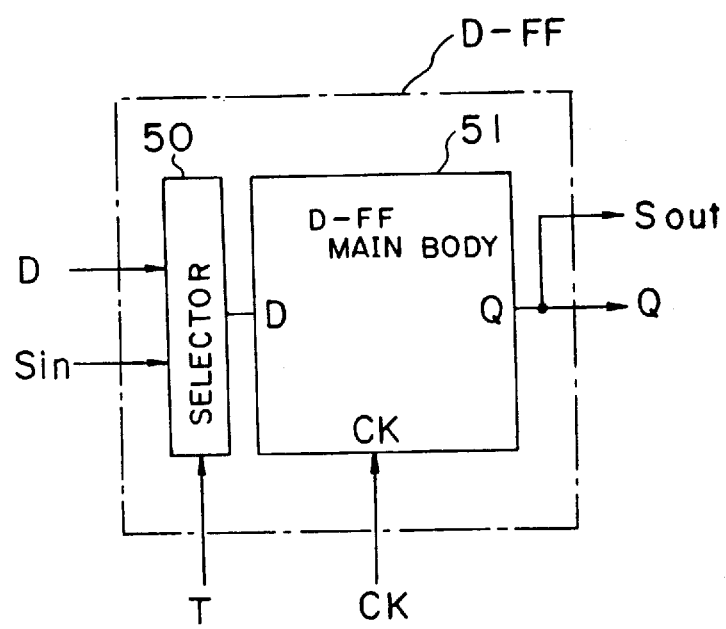
FIG. 14A shows a configuration of scan type DFF for use in a scan circuit.

The LSI can be divided into a plurality of units U1, U2, . . . Um. For example, the first unit U1 is an adder, the second unit U2 is a multiplier, . . . and the m-th unit Um is a subtractor. The first unit U1 comprises n flipflops FF1–FFn. Each of the flipflops FF1–FFn comprises a selector and a main body D-FF as shown in FIG. 14A. The scan-in terminal $S_{in}$ in the FF1 in the uppermost row is connected to the external scan-in terminal $S_i$, and the scan-out terminal $S_{out}$ of the FF1 is connected to the scan-in terminal $S_{in}$ in the next row, and so on. Thus, the scan-out terminal $S_{out}$ of the FF(n−1) is connected to the scan-in terminal $S_{in}$ of the FFn in the bottom line, and the scan-out terminal $S_{out}$ of the FFn is connected to the external scan-out terminal $S_O$. Then, the above-described path $S_{in}→S_{out}→S_{in}→S_{out}→$ . . . is called the first scan path $S_{path}1$. The second unit U1—the m-th unit Um has the same configuration as that of the first unit U1, and each unit has the second scan path $S_{path}2$—the m-th scan path $S_{path}m$.

As described above, scan paths $S_{path}1$ through $S_{path}m$ can be positioned respectively for units U1 through Um. One terminal of each of the scan paths $S_{path}1$ through $S_{path}m$ is connected to the common external scan-in terminal $S_i$, and the other terminal is connected to the common external scan-out terminal $S_O$.

Figure 14B:
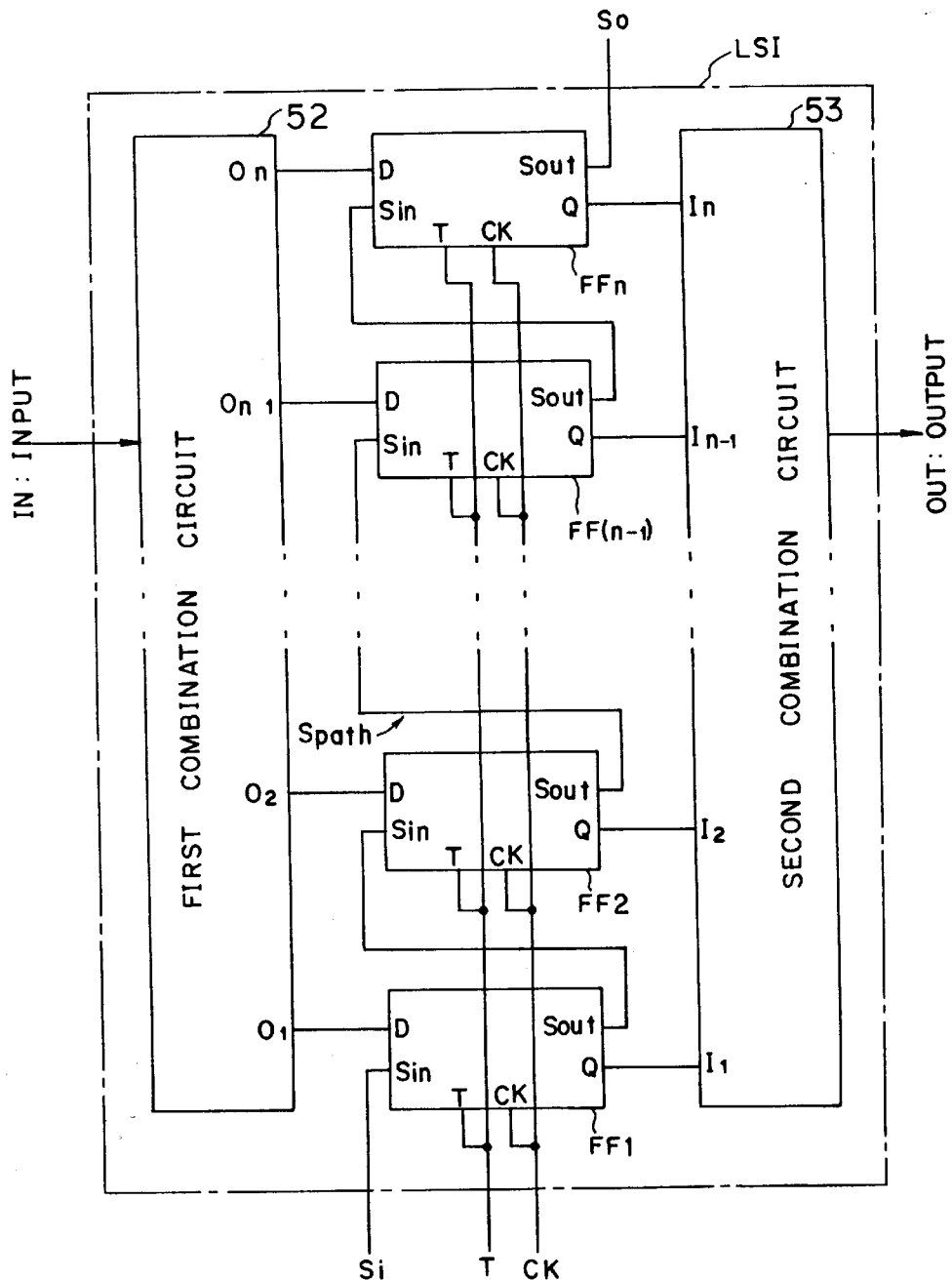
FIG. 14B shows a block diagram of a related-art LSI in which a scan type DFF shown in FIG. 14A is used.

In the first unit U1, the terminals D of FF1–FFn are connected to the circuit on the input side of the LSI (corresponding to the circuit 54 shown in FIG. 14B), and the terminals Q of FF1–FFn are connected to the circuit on the output side of the LSI (corresponding to the circuit 56 shown in FIG. 14B). Like the first unit U1, the second unit U2 through the m-th unit Um are also connected to the circuits on the input and the output sides of the LSI.

Units U1 through Um are provided with a clock CK individually. A normal input IN is applied to the LSI, and the LSI outputs a normal output OUT.

The LSI also comprises a test control circuit 318 and a selector 320. The test control circuit 318 generates a test signal T and a scan path select signal S according to a test input $T_{est}$, provides units U1–Um with a test signal T, and provides the selector 320 with a scan path select signal S. In units U1–Um, a mode is selected for FF1–FFn, . . . . FF1–FFn according to a test signal T. That is, it is determined whether the mode for FF1–FFn, . . . , FF1–FFn is a normal operation mode or a test mode. The selector 320 is positioned between units U1–Um and the external scan-out terminal $S_O$, selects one unit from among units U1–Um according to a scan path select signal S, and provides the external scan-out terminal $S_O$ with the scan-out output from scan path $S_{path}j$ of the selected unit Uj.

The operation of the LSI shown in FIG. 43 is described below.

During the normal operation (not in the test mode), since a test signal T from the test control circuit 318 does not indicate the active state, FF1–FFn, . . . , FF1–FFn in units U1–Um is in the normal operation mode. As a result, units U1–Un are operated normally. That is, the LSI receives a normal input IN and outputs a normal output OUT.

During the test, a test signal T from the test control circuit 318 indicates the active state, FF1–FFn, . . . , FF1–FFn in units U1–Um are in the test mode. Additionally, any unit to be tested, for example the first unit U1, is selected from among units U1–Um according to a scan path select signal S from the test control circuit 318.

In this state during the scan read test, units U1–Um are operated according to a normal input IN inputted externally, and the scan-out outputs from paths $S_{path}1$–$S_{path}m$ of the units U1–Um are applied to the selector 320. If the first unit U1 is selected, then the scan-out output from scan path $S_{path}1$ of the selected first unit U1 is applied to the output scan-out terminal $S_O$. Thus, the fault test is conducted for the first unit U1.

In the scan write test, a normal input is applied to units U1–Um from the external scan-in terminal $S_{in}$ through scan paths $S_{path}1$–$S_{path}m$, and thus the units U1–Um are operated. Then, at the output OUT from a target unit, for example the first unit U1, the fault test of the first unit U1 is conducted. All normal inputs from the external scan-in terminal $S_{in}$ are applied to units U1–Um. All the units U2–Um other than the test unit U1 can be ignored (as "Don't care").

As described above, in the LSI shown in FIG. 43, the scan read and write is performed for each unit Uj in units U1–Um to conduct a fault test for the unit Uj.

FIG. 44 shows an example of a scan path provided in accordance with an embodiment shown in FIG. 43. The scan path runs through latches FF1 to FF6 which are provided in the output or input of the first stage or the second stage of the adder with regard to unit 1. The scan path runs through the latches FF1 to FF6 which are provided in the input or output of the first stage or second stage of the multiplier with regard to unit 2. The scan path runs through the latches FF1 to FF6 which are provided in the output or the input of the first control unit 1 or second bus control unit 2 with regard to unit 3. The scan path runs through latches FF1 to FF6 which are provided in the output or input of the address control unit 1 or 2 with regard to unit 4. When the test signals TS1 and TS2 are 0, 0, respectively, the output of the unit 1 is selected by the selector 20 in accordance with the output of the test control circuit to which the test signals TS1, TS2 are provided. Similarly, when the test signals TS1 and TS2 are 0, 1, the selector 320 selects unit 2. Therefore, in accordance with the status of the test signals TS1 and TS2, outputs from one of the units 1 to 4 is selected, thereby enabling the test of one of the unit 1 to 4 to be conducted in accordance with a test of a scan path method.

As described above, in the present embodiment, since each unit is provided with a scan path individually, only a target unit should be considered for an individual fault test. Therefore, clocks used for the test are required in a number smaller than that required for the entire LSI test, thereby shortening the total testing time. This is specifically effective when a large scale LSI comprising a great number of FFs is tested.

What is claimed is:

1. A data processing device comprising:
    a plurality of arithmetic operation means for operating according to pipeline control;
    an instruction decoder decoding an instruction and controlling said arithmetic operation means according to the decoded instruction;
    a plurality of state retaining means, corresponding to the plurality of arithmetic operation means, for retaining respective states of operation of said plurality of arithmetic operation means;
    selection control means for selecting, according to a signal indicating a type of an instruction from said instruction decoder, one output of said plurality of state retaining means and outputting said selected output to said instruction decoder so that said instruction decoder controls said arithmetic operation means according to an output signal from said selection control means; and
    a vector register storing data to be processed by said arithmetic operation means; wherein
    said plurality of state retaining means further comprises means for retaining a state of the vector register, said plurality of arithmetic operation means using the state stored in the means for retaining the state of the vector register.

2. A data processing device comprising:
    a plurality of arithmetic operation means for operating according to pipeline control;
    an instruction decoder decoding an instruction and controlling said arithmetic operation means according to the decoded instruction;
    a plurality of state retaining means, corresponding to the plurality of arithmetic operation means, for retaining respective states of operation of said plurality of arithmetic operation means;
    selection control means for selecting, according to a signal indicating a type of an instruction from said instruction decoder, one output of said plurality of state retaining means and outputting said selected output to said instruction decoder so that said instruction decoder control said arithmetic operation means according to an output signal from said selection control means; wherein
    said selection control means comprises:
        a first selector means for selecting and outputting one of the outputs from said n state retaining means according to a first signal indicating a type of an instruction from said instruction decoder;
        a gate circuit means for determining a logical sum of the outputs of said n state retaining means; and
        a second selector means for selecting an output of one of said first selector means and said gate circuit means according to a second signal indicating a type of an instruction from said instruction decoder, and outputting said selected output to said instruction decoder, so that said instruction decoder controlling said n arithmetic operation means according to an output signal from said second selector means.

3. The data processing device according to claim 2, wherein
    said data processing device further comprises a mode register outputting a mode signal indicating whether the n arithmetic operation means are operated in one of a parallel mode, where the n arithmetic operation means are operated in parallel, and a test mode, where the n arithmetic operation means are operated individually; and
    said second selector means selects an output of one of said first selector means and said gate circuit means according to the second signal indicating a type of an instruction from said instruction decoder and the mode signal from the mode registers, and outputs said selected output to said instruction decoder.

4. The data processing device according to claim 3, wherein
    said second selector means selects according to priority the mode signal from said mode register.

5. A data processing system comprising:
    a memory;
    a CPU; and
    a data processing device controlled by said CPU by referring to said memory, said data processing device comprising an arithmetic operation device for obtaining one of a maximum and a minimum value of predetermined data according to said data processing device and masking data for said predetermined data, comprising:
        selecting means for selecting and outputting one of fixed value data determined depending on whether an arithmetic operation obtains one of the maximum value and the minimum value according to said masking data, and said predetermined data; and
        determining means for outputting an output value from said selecting means as is when the output value is a first element, and for determining which one of the output value and a previously outputted value is larger, depending on whether the arithmetic operation obtains one of the maximum value and the minimum value when the output value from said selecting means is an element other than the first element.

6. A multiplying device for performing a multiplication of single- and double-precision data in a floating point, comprising:

data converting means for outputting an input as is when the input refers to exponential part data of a multiplier and a multiplicand in double-precision floating point, and for outputting said input after aligning bits of exponential part data of a multiplier and a multiplicand with bits of double-precision floating decimal point when the input refers to exponential part data of a multiplier and a multiplicand in single-precision floating point;

first adding means for receiving the outputs of said data converting means and for adding and outputting a sum of the outputs of said data converting means;

correcting means for receiving a predetermined number of lower order bits of data output from said first adding means, outputting said data as is if the received data refer to exponential part data in double-precision floating point, and outputting said received data after correcting a predetermined number of bits of data when the input data refer to exponential part data in single-precision floating point; and second adding means for performing one of an addition and subtraction of a predetermined number of high order bits of data outputted by said first adding means and a value for standardizing the predetermined number of high order bits of data with a standard value, and outputting a result.

7. A multiplying device according to claim 6, wherein said data converting means comprises means for outputting the exponential data to predetermined bits when the multiplier and multiplicand are double precision floating point; and means for supplying the exponential data to same bits when the multiplier and multiplicand are single precision by aligning the output bits in the case of single precision floating point with the output bits in the case of double precision floating point.

8. A multiplying device according to claim 6, wherein said correcting means comprises logical means for changing data 1,1,1 to data 1,0,0.

9. A data processing system, comprising:
a memory;
a CPU; and
a data processing device controlled by said CPU by referring to the memory, said data processing device comprising:
a multiplying device performing a multiplication of single- and double-precision data in a floating point, said multiplying device comprising:
data converting means for outputting an input as is when the input refers to exponential part data of a multiplier and a multiplicand in double-precision floating point, and for outputting said input after aligning bits of exponential part data of a multiplier and a multiplicand with bits of double-precision floating point data when the input refers to exponential part data of a multiplier and a multiplicand in single-precision floating point;

first adding means for receiving outputs of said data converting means and for adding and outputting a sum of the outputs of said data converting means;

correcting means for receiving a predetermined number of lower order bits of data output from said first adding means, outputting said received data as is if the input data refer to exponential part data in a double-precision floating point, and outputting said received data after correcting a predetermined number of bits of data when the input data refer to exponential part data in single-precision floating points; and second adding means for performing one of an addition and subtraction of a predetermined number of high order bits of the data outputted by said first adding means and a value for standardizing the predetermined number of high order bits of data with a standard value, and outputting a result.

10. A vector arithmetic operation circuit comprising:
a vector register storing plural pieces of vector data;
an arithmetic operation unit performing arithmetic operations including a comparison arithmetic operation for a pair of vector data pieces;
a mask register storing, for each piece of vector data, a comparison result written in said mask register after a comparing operation performed by said arithmetic operation unit;
a packing/unpacking means for packing two pieces of vector data and retaining only valid data according to the comparison result written in said mask register, writing the comparison result separately to said vector register, writing a result of an arithmetic operation to said vector register when the arithmetic operation is performed on the packed valid data by said arithmetic operation unit, and simultaneously unpacking the result of the arithmetic operation to an original address at which said vector data is stored in said vector register; and
a switch switching control between said arithmetic operation unit and said packing/unpacking unit according to a switch signal.

11. The vector arithmetic operation circuit according to claim 10, wherein said packing/unpacking means comprises:
means for receiving data from the vector register;
memory means; and
means for packing the data received from the vector register in accordance with the mask data stored in said mask register when the data received from the vector register is written into said memory means, means for reading the packed data from said memory means to transmit the packed data to said vector register, means for writing the packed data read from the vector register into said memory means, means for reading the unpacked data in accordance with the mask data when the data is read from said memory means, and means for writing the unpacked data in said vector register.

12. A data processing system comprising:
a memory;
a CPU;
a data processing device controlled by the CPU by referring to the memory, said data processing device comprising,
a vector arithmetic operation circuit comprising,
a vector register means for storing plural pieces of vector data, an arithmetic operation unit for performing arithmetic operations including a comparison arithmetic operation for a pair of vector data pieces, a mask register storing, for each piece of vector data, a comparison result written in said mask register after a comparing operation performed by said arithmetic operation unit, a packing/unpacking unit packing two pieces of vector data and retaining only valid data according to the comparison result written in said mask register, writing the comparison result separately to said vector register, writing a result of an arithmetic operation to said vector register when the arithmetic operation is performed on the valid packed data by said arithmetic operation unit, and simultaneously unpacking the result of the arithmetic operation to an original address in said vector register, and a switch switching control between said arithmetic operation unit and said packing/unpacking unit according to a switch signal.

13. An LSI device, comprising:

a plurality of scan-type flipflops each including a scan-in terminal and a scan-out terminal, said plurality of flipflops divided into a plurality of LSI units, wherein in each of said LSI units the scan-out terminal of a flipflop is connected to the scan-in terminal of an adjacent flipflop, a scan-in terminal of a first flipflop of an LSI unit and a scan-out terminal of a final flipflop of an LSI unit are respectively connected to an external scan-in terminal and an external scan-out terminal, each LSI unit is separately assigned a scan path respectively, and said LSI device further comprises control circuits for selecting one of said LSI units; and wherein a common scan-in signal is applied to respective LSI units, all the LSI units perform a scanning operation simultaneously and a single output is selected from the scan-out terminals of respective LSI units.

14. An LSI test method for conducting an LSI test by scanning a plurality of scan-type flipflops, said plurality of scan-type flipflops being divided and assigned to a plurality of LSI units, each LSI unit is assigned an individual scan path connecting an external scan-in terminal to an external scan-out terminal of flipflops in an LSI unit, comprising the steps of:

applying a common scan-in signal to respective LSI units;

each of the respective LSI units performing a scanning operation simultaneously; and selecting a single output from the scan-out terminals of respective LSI units;

said test method conducts a test of an LSI for each unit by separately using any of said scan paths.

15. A data processing system, comprising:

a memory;

a CPU, a data processing device controlled by said CPU by referring to the memory, said data processing device comprising, an LSI device having a plurality of scan-type flipflops each of said plurality of flipflops having a scan-in terminal and a scan-out terminal, wherein said flipflops are divided and the divided flipflops are assigned to respective LSI units, and in each of said LSI units the scan-out terminal of a flipflop is connected to the scan-in terminal of an adjacent flipflop, a scan-in terminal of a first flipflop of an LSI unit and a scan-out terminal of a final flipflop of an LSI unit are respectively connected to an external scan-in terminal and an external scan-out terminal, each LSI unit is separately assigned a scan path respectively, and said LSI device further comprises control circuits for selecting one of said LSI units; and wherein a common scan-in signal is applied to respective LSI units, all the LSI units perform a scanning operation simultaneously and a single output is selected from the scan-out terminals of respective LSI units.

16. A data processing device, comprising:

n arithmetic operation means for operating according to pipeline control, where n is a positive integer;

an instruction decoder decoding an instruction and controlling said arithmetic operation means according to the decoded instruction;

n state retaining means, corresponding to the n arithmetic operation means, for retaining respective states of operation of said n arithmetic operation means, respectively; and selection control means for selecting, according to a signal indicating a type of an instruction from said instruction decoder, one output of said n state retaining means and outputting said selected output to said instruction decoder so that said instruction decoder controls said arithmetic operation means according to an output signal from said selection control means, said selection control means comprising:

a first selector means for selecting and outputting one of the outputs from said n state retaining means according to a first signal indicating a type of an instruction from said instruction decoder, a gate circuit means for determining a logical sum of the outputs of said n state retaining means, and a second selector means for selecting an output of one of said first selector means and said gate circuit means according to a second signal indicating a type of an instruction from said instruction decoder, and outputting said selected output to said instruction decoder, said instruction decoder controlling said n arithmetic operation means according to an output signal from said second selector means.

17. A data processing device, comprising:

n arithmetic operation means for operating according to pipeline control, where n is a positive integer;

an instruction decoder decoding an instruction and controlling said arithmetic operation means according to the decoded instruction;

n state retaining means, corresponding to the n arithmetic operation means, for retaining respective states of operation of said n arithmetic operation means, respectively; and selection control means for selecting, according to a signal indicating a type of an instruction from said instruction decoder, one output of said n state retaining means and outputting said selected output to said instruction decoder so that said instruction decoder controls said arithmetic operation means according to an output signal from said selection control means, said selection control means comprising:

a first selector means for selecting and outputting one of the outputs from said n state retaining means according to a first signal indicating a type of an instruction from said instruction decoder, a gate circuit means for determining a logical sum of the outputs of said n state retaining means, and a second selector means for selecting an output of one of said first selector means and said gate circuit means according to a second signal indicating a type of an instruction from said instruction decoder, and outputting said selected output to said instruction decoder, said instruction decoder controlling said n arithmetic operation means according to an output signal from said second selector means;

a mode register outputting a mode signal indicating whether the n arithmetic operation means are operated in one of a parallel mode, where the n arithmetic operation means are operated in parallel, and a test mode, where the n arithmetic operation means are operated individually, and said second selector means selects an output of one of said first selector means and said gate circuit means according to the second signal indicating a type of an instruction from said instruction decoder and the mode signal from the mode register, and outputs said selected output to said instruction decoder.

18. An arithmetic operation device for obtaining one of a maximum and a minimum value of predetermined data according to said predetermined data and masking data for said predetermined data, comprising:

selecting means for selecting and outputting one of fixed value data determined depending on whether an arithmetic operation obtains one of the maximum value and the minimum value according to said masking data, and said predetermined data; and determining means for outputting an output value from said selecting means as is when the output value is a first element, and for determining which of the output value and a previously outputted value are larger, depending on whether the arithmetic operation obtains the maximum value or the minimum value when the output value from said selecting means is an element other than the first element, wherein said selecting means comprises an input latch means for receiving said predetermined data, a fixed value generating means for generating a fixed value when said predetermined value is masked, mask latch means for receiving mask data, and a third selector means for selecting one of said predetermined data and said fixed value in accordance with the mask data.

19. An arithmetic operation device for obtaining one of a maximum and a minimum value of predetermined data according to said predetermined data and masking data for said predetermined data, comprising:

selecting means for selecting and outputting one of fixed value data determined depending on whether an arithmetic operation obtains one of the maximum value and the minimum value according to said masking data, and said predetermined data; and determining means for outputting an output value from said selecting means as is when the output value is a first element, and for determining which of the output value and a previously outputted value are larger, depending on whether the arithmetic operation obtains the maximum value or the minimum value when the output value from said selecting means is an element other than the first element, wherein, said determining means comprises comparing means for comparing the output from said selecting means with a previous output from said selecting means so that the output of the selecting means is provided from the comparing means when the predetermined data is the first element and for outputting a result of the comparison by the comparing means when the predetermined data is not the first element, fourth selector means for selecting one of current predetermined data and the previous output from the selecting means depending on the result of the comparison, output latch means for latching an output from the fourth selector means to provide the output from the fourth selector means to the comparing means and the fourth selector means.

20. An arithmetic operation device according to claim 19, wherein said comparing means comprises an ALU which performs a comparison operation for an adding operation in accordance with a control signal inputted to the ALU.

* * * * *